United States Patent
Meert

(12) 
(10) Patent No.: US 9,261,922 B2
(45) Date of Patent: Feb. 16, 2016

(54) HARNESS FOR IMPLEMENTING A VIRTUAL BACKPLANE IN A COMPUTING RACK FOR FIELD REPLACEABLE UNITS

(71) Applicant: Oracle International Corporation, Redwood City, CA (US)

(72) Inventor: Carl L. Meert, San Jose, CA (US)

(73) Assignee: Oracle International Corporation, Redwood City, CA (US)

( * ) Notice: Subject to any disclaimer, the term of this patent is extended or adjusted under 35 U.S.C. 154(b) by 525 days.

(21) Appl. No.: 13/781,020

(22) Filed: Feb. 28, 2013

(65) Prior Publication Data
US 2014/0240914 A1 Aug. 28, 2014

(51) Int. Cl.
| G06F 13/00 | (2006.01) |
| G06F 1/18 | (2006.01) |
| G06F 13/40 | (2006.01) |
| G06F 9/44 | (2006.01) |
| H04Q 1/06 | (2006.01) |
| H04Q 1/02 | (2006.01) |
| H05K 7/14 | (2006.01) |

(52) U.S. Cl.
CPC .............. *G06F 1/183* (2013.01); *G06F 9/4411* (2013.01); *G06F 13/409* (2013.01); *H04Q 1/06* (2013.01); *H04Q 1/09* (2013.01); *H05K 7/1492* (2013.01); *Y10T 29/49117* (2015.01)

(58) Field of Classification Search
USPC .......... 710/104–110, 300–311; 709/202–203, 709/227, 231–232, 238
See application file for complete search history.

(56) References Cited

U.S. PATENT DOCUMENTS

| 5,793,909 A | 8/1998 | Leone et al. |
| 6,192,434 B1 | 2/2001 | Wallach et al. |
| 6,336,152 B1 | 1/2002 | Richman et al. |
| 6,592,387 B2 | 7/2003 | Komenda et al. |
| 6,762,941 B2 | 7/2004 | Roth |
| 6,948,008 B2 | 9/2005 | Hawkins et al. |
| 6,970,948 B2 | 11/2005 | Brown et al. |
| 7,162,554 B1 | 1/2007 | Cole et al. |
| 7,203,774 B1 | 4/2007 | Zhou et al. |
| 7,209,358 B2 | 4/2007 | Garnett et al. |
| 7,225,276 B2 * | 5/2007 | Garnett .................... G06F 1/183 361/728 |
| 7,558,849 B2 | 7/2009 | Chandwani et al. |
| 7,652,889 B2 | 1/2010 | Larson et al. |
| 7,761,640 B2 | 7/2010 | Hikabe |
| 7,761,687 B2 | 7/2010 | Blumrich et al. |
| 7,817,394 B2 | 10/2010 | Mukherjee et al. |
| 7,856,488 B2 | 12/2010 | Cripe et al. |
| 8,244,949 B2 | 8/2012 | Hikabe |
| 8,250,279 B2 | 8/2012 | Grgic et al. |
| 8,301,818 B2 | 10/2012 | Zou et al. |
| 8,583,848 B2 | 11/2013 | Miyoshi |
| 8,601,463 B2 | 12/2013 | Bouchier et al. |
| 8,626,959 B2 | 1/2014 | Ruzek et al. |
| 8,639,466 B2 * | 1/2014 | Cashman ............ G06F 11/0727 702/120 |
| 8,749,966 B1 | 6/2014 | Boudreau et al. |
| 8,832,688 B2 | 9/2014 | Tang et al. |
| 8,874,817 B2 | 10/2014 | Delfatti, Jr. et al. |

(Continued)

*Primary Examiner* — Raymond Phan
(74) *Attorney, Agent, or Firm* — Marsh Fischmann & Breyfogle LLP; Jonathon A. Szumny

(57) ABSTRACT

A system for the management of rack-mounted field replaceable units (FRUs) that affords the enhanced availability and serviceability of FRUs provided by blade-based systems but in a manner that accommodates different types of FRUs (e.g., in relation to form factors, functionality, power and cooling requirements, and/or the like) installed within a rack or cabinet.

19 Claims, 23 Drawing Sheets

(56) References Cited

U.S. PATENT DOCUMENTS

| | | |
|---|---|---|
| 9,003,088 B2 | 4/2015 | Chandrdasekhar et al. |
| 2002/0012232 A1 | 1/2002 | Creason et al. |
| 2002/0016897 A1 | 2/2002 | Nerl |
| 2002/0081881 A1 | 6/2002 | Komenda et al. |
| 2003/0046452 A1* | 3/2003 | Andrewartha .......... G06F 1/181 710/2 |
| 2004/0008494 A1 | 1/2004 | Roth |
| 2005/0099766 A1 | 5/2005 | Fraley et al. |
| 2005/0138473 A1 | 6/2005 | Mathew et al. |
| 2005/0261026 A1 | 11/2005 | Hausman et al. |
| 2006/0179184 A1 | 8/2006 | Fields, Jr. et al. |
| 2008/0318465 A1* | 12/2008 | Johnsen ................. G06F 11/30 439/488 |
| 2009/0006902 A1 | 1/2009 | Corcoran et al. |
| 2009/0019202 A1 | 1/2009 | Shetty et al. |
| 2009/0189774 A1 | 7/2009 | Brundridge et al. |
| 2009/0206670 A1 | 8/2009 | Whitted et al. |
| 2009/0282142 A1 | 11/2009 | Tamura et al. |
| 2010/0262722 A1 | 10/2010 | Vauthier et al. |
| 2011/0022760 A1 | 1/2011 | Prigge et al. |
| 2011/0093572 A1 | 4/2011 | Koehler et al. |
| 2012/0185637 A1 | 7/2012 | Boecker et al. |
| 2012/0331119 A1 | 12/2012 | Bose et al. |
| 2014/0195859 A1* | 7/2014 | Dickenson ............. G06F 11/183 714/43 |

* cited by examiner

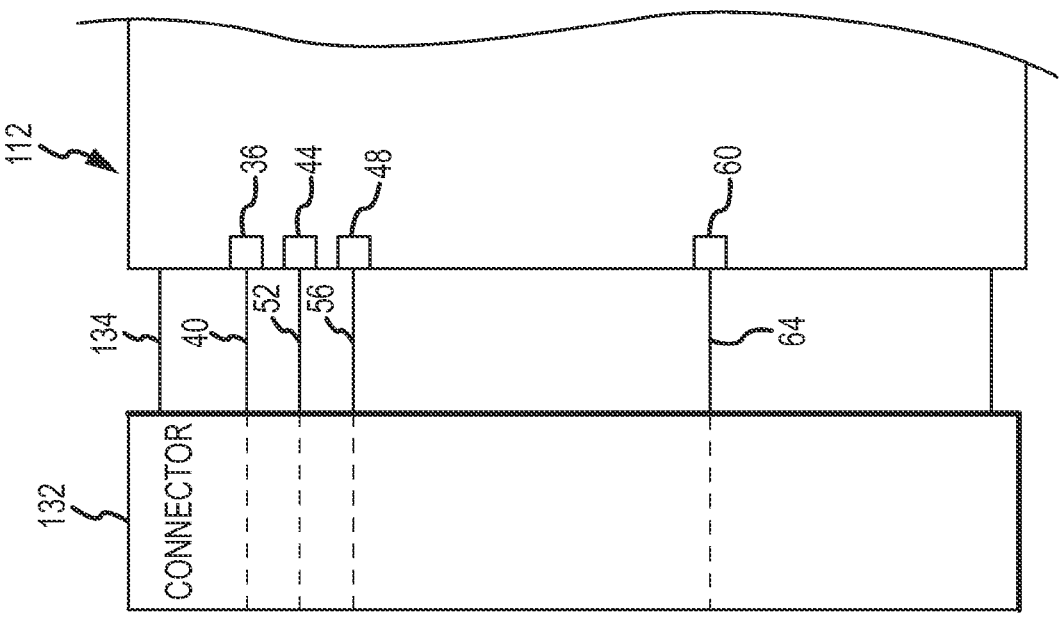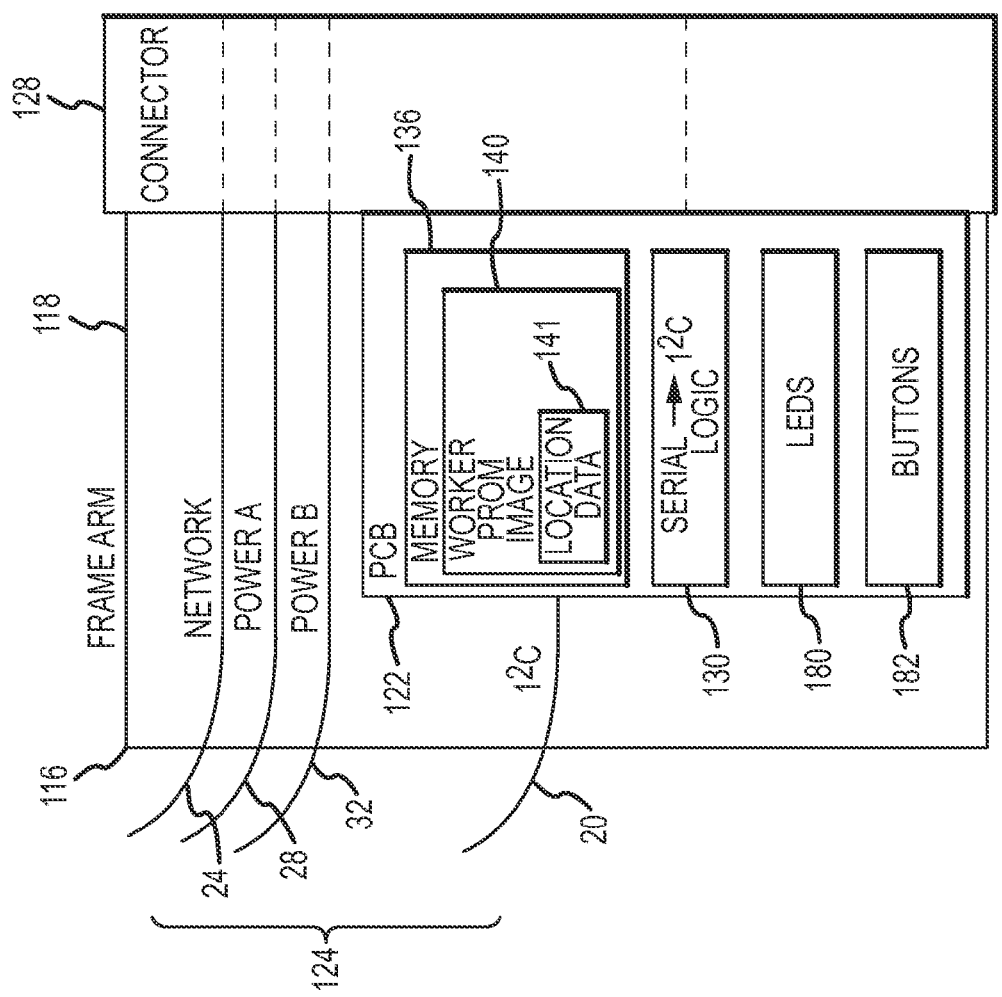
FIG. 4

HARNESS FOR IMPLEMENTING A VIRTUAL BACKPLANE IN A COMPUTING RACK FOR FIELD REPLACEABLE UNITS

RELATED APPLICATIONS

This application is related to the following U.S. patent applications which are filed concurrently with this application and which are incorporated herein by reference to the extent permitted by law:
- U.S. patent application Ser. No. 13/780,818, entitled "POWER DELIVERY TO RACK-MOUNTED FIELD REPLACEABLE UNITS USING AC AND/OR DC INPUT POWER SUPPLIES;"
- U.S. patent application Ser. No. 13/780,916, entitled "COMPUTING RACK-BASED VIRTUAL BACKPLANE FOR FIELD REPLACEABLE UNITS;"
- U.S. patent application Ser. No. 13/781,085, entitled "CONTROLLER FOR FACILITATING OUT OF BAND MANAGEMENT OF RACK-MOUNTED FIELD REPLACEABLE UNITS;" and
- U.S. patent application Ser. No. 13/781,151, entitled "ADAPTER FACILITATING BLIND-MATE ELECTRICAL CONNECTION OF FIELD REPLACEABLE UNITS WITH VIRTUAL BACKPLANE OF COMPUTING RACK."

This application is also related to the following U.S. patent applications which were filed with the U.S. Patent and Trademark Office on Feb. 8, 2012 and which are incorporated herein by reference to the extent permitted by law:
- U.S. patent application Ser. No. 13/368,528, entitled "SYSTEM FOR OUT OF BAND MANAGEMENT OF RACK-MOUNTED FIELD REPLACEABLE UNITS;" and
- U.S. patent application Ser. No. 13/368,482, entitled "MANAGEMENT RECORD SPECIFICATION FOR MANAGEMENT OF FIELD REPLACEABLE UNITS INSTALLED WITHIN COMPUTING CABINETS."

BACKGROUND

1. Field of the Invention

The present invention generally relates to the management of field replaceable units (FRUs) mounted within a frame structure such as a rack or cabinet and, more specifically, to systems and methods that bring the enhanced availability and serviceability of blade or chassis-based computing systems into rack-based computing systems.

2. Relevant Background

There has been significant progress made in recent years in using Intelligent Platform Management Interface (IPMI) for "out of band" (OOB) management (e.g., presence detection such as FRU discovery, inventory audit, activation such as power-cycle and CPU reset, etc.) in both rack mounted server (RMS) and blade compute systems. IPMI is an industry standard, computer system technology providing an architecture or protocol that facilitates communication between a system controller or manager (e.g., including management software) and one or more unique devices being managed (e.g., one or more FRUs).

Computing cabinets or racks are standardized frames that are designed to hold a plurality of FRUs or related components (e.g., rack-mounted servers, power distribution units or backup devices, and/or the like). Generally, a computing rack includes a number of vertical rails or posts (e.g., two, four) to which horizontal members and rail assemblies can be secured to define a plurality of receiving bays for receiving FRUs. Various types and sizes of FRUs may be installed within a rack system and often have standardized heights as multiples of one rack unit (U). For instance, industry standard rack systems often come in heights of 18 U, 22 U, 36 U, 42 U, and the like. In high availability environments (e.g., telecommunications systems), the set of FRUs (e.g., computing devices, related components, and the like) in a frame configuration are administered as a single compute system that is functionally consistent with administration of a single FRU.

More recently, FRUs such as blade servers are being used that are typically installed within a compartment or structure referred to as a "blade enclosure" or chassis (e.g., where the blade servers and enclosure are collectively called a "blade system"). The blade enclosure includes a midplane into which all of the blade servers are interconnected and provides many non-core computing services to installed blade servers such as power, cooling, interconnects, management, and the like. That is, the installed blade servers collectively share such non-core computing services provided by the blade enclosure. For instance, a blade enclosure may have a system controller or manager including any appropriate control software or logic that functions to intelligently adjust liquid cooling systems to meet the cooling requirements of the blade servers. Also, the system controller facilitates the ability to "hot-swap" blades within the enclosure (i.e., the ability to add, remove and replace units at need without having to power-off the enclosure). The Advanced Telecommunications Computing Architecture (ATCA) is an open industry standard including a series of specifications targeted to requirements for blades and chasses (e.g., in relation to form factors and the like).

SUMMARY

Blade systems advantageously provide almost 100% uptime or availability due to use of a unified management service, redundancy or availability (e.g., upon a first blade server going down, a second blade server can take over and maintain the system without interruption to other blade servers until the first blade server is replaced), rapid fault isolation, low mean time to repair, midplane management paths to components, fixed FRU locations and configurations, reductions in cabling, power, and size requirements, and the like. However, blade enclosures and the installed blade servers are typically proprietary designs. That is, a particular blade enclosure is usually designed to accept only a particular type of blade server such that all of the blade servers installed within a blade enclosure have the same form factors, connectors, and the like. Thus, the above-discussed benefits and advantages of blade systems are inherently limited to a common type of FRU installed within a proprietary blade enclosure. Furthermore, blade systems typically have fixed power budgets, cooling capacities, and the like. While upgrading to future blade designs may be possible, any such future blades would be limited by the original blade design chassis for power and cooling.

The inventors have determined that it would be desirable to bring many of the benefits of blade or chassis-based computing systems (such as the above-discussed enhanced availability and serviceability) into rack-based systems, but free of all or many of the limitations of blade-based systems. Stated differently, the inventors have determined that it would be desirable to provide the ability to seamlessly provide central, OOB management (e.g., in relation to rebooting, shutdown, power-on, fan speeds, power and cooling monitoring, hot-swapping, and the like) of what may be numerous disparate FRUs (e.g., with numerous different form factors, power and cooling requirements, and/or the like) within a rack-based system. That is, it would be desirable combine the high level of serviceability and availability of blade-based systems with the upgrade capability of rack-mount systems.

In this regard, disclosed herein are systems and methods for the management of rack-mounted FRUs that afford the enhanced availability and serviceability of FRUs provided by blade-based systems but in a manner that accommodates different types of FRUs (e.g., in relation to form factors, functionality, power and cooling requirements, and the like) installed within a rack or cabinet (e.g., server or open compute equipment rack, cabinet or assembly for holding a plurality of pieces of computing equipment, etc.). Broadly, the disclosed system (e.g., frame) includes a plurality of "frame backplane segments," "virtual slots" or "frame arms" (used interchangeably herein, e.g., nodes, receiving structures, housings, connectors, and/or the like) disposable at fixed locations within a rack, each for receiving and electrically interconnecting with a corresponding one of a plurality of FRUs (e.g., having similar or disparate form factors, functionalities, etc.), and each storing data (e.g., in a memory of the virtual slot) indicating the particular fixed location of the virtual slot within the rack (e.g., relative to the fixed locations of other virtual slots within the rack). Each virtual slot may be fixed to the rack adjacent a rear portion of a respective one of a plurality of receiving bays and may include a connector (e.g., blind-mate connector) that is configured to interface with a corresponding connector of a FRU as the FRU is slid into the receiving bay. For instance, each virtual slot may be configured to detect when a FRU has been inserted into its respective receiving bay (i.e., detect a presence of the FRU within the receiving bay) and transmit one or more corresponding alerts throughout the system as will be discussed below.

The disclosed system may include a "frame center" (e.g., a separate, dedicated computing device or system, such as a central management server, which may also be a FRU) that is electrically interconnectable to each of the virtual slots in a manner that allows for FRU presence detection (i.e., receipt of a FRU in one of the receiving bays), FRU OOB management (e.g., via a "frame manager" or "rack manager" implemented at or otherwise in communication with the frame center), and the like. For instance, the frame center may be electrically interconnected to each of the virtual slots by a plurality of a first type of communication paths (e.g., $I^2C$ cables) allowing for presence detection and the like, where the plurality of first type of communication paths may form a first communication network interconnecting the frame center and frame arms. The frame center may also be electrically interconnected to each of the virtual slots by a plurality of a second type of communication paths (e.g., network lines such as Ethernet cables) that allows for OOB management communications between the frame center and frame arms as well as non-OOB management communications to be conducted between the frame arms and devices and processes outside of the frame/system (via the frame center). Each of the virtual slots and the frame center may also be electrically interconnected (e.g., via power lines or cables) to one or more (such as first and second redundant) power distribution units (PDUs, which in turn may be appropriately electrically interconnected to one or more power sources) for distributing power to FRUs interfaced with the virtual slots (in addition to the frame center).

The various cables, paths and/or lines connected between the virtual slots, the frame center and the PDUs may be considered a "fixed interconnect topology" (e.g., wired and/or wireless) of the system or frame that allows the frame center to determine the physical or fixed locations of installed FRUs in the rack (e.g., even among a plurality of disparate FRUs) via the location information stored in the memories of their respective virtual slots for use in conducting OOB management of the FRUs. A computing rack or cabinet may be pre-configured (e.g., pre-wired) with the fixed interconnect topology so that FRUs subsequently installed (i.e., after the pre-configuring) into the rack and electrically interfaced with respective frame arms (e.g, via corresponding blind-mate connectors of the FRUs and frame arms) can substantially seamlessly or automatically receive power, join the management network of the rack (e.g., as coordinated by the frame center), and/or send and receive actual data signals, all free of necessarily having to (e.g., manually) run and interconnect a plurality of cords and cables between the FRUs and network switches, other servers, and/or the like (e.g., such as after and/or during insertion of the FRUs into the rack). In this regard, the fixed interconnect topology and frame arms may essentially function as a "virtual backplane" or midplane of the system. The system may be incorporated into a rack as part of building the rack or else be retrofitted or otherwise integrated into an existing rack. The system and rack may collectively be referred to as a "setup."

A frame manager may communicate with OOB service processors of each of the FRUs (e.g., built-in system management tools each including one or more dedicated processors and memory modules, such as Oracle's Integrated Lights-Out Managers (ILOMs)) via the frame center (e.g., a service processor of the frame center) and the fixed interconnect topology as part of performing OOB management. The system may incorporate a unified management system (UMS) made up various piece of logic or software executed by the frame center, the various FRU OOB service processors, and/or higher level processors. For instance, installing a FRU into a receiving bay of a rack and interconnecting the FRU with a respective frame arm may cause a portion of the UMS to be automatically downloaded onto the FRU for use by the FRU's OOB service processor as part of communicating with the frame manager; in this regard, a FRU may be able to substantially automatically and seamlessly join its appropriate management service context (e.g., UMS), substantially regardless of the type of FRU, form factor of the FRU, and/or the like.

As an example, imagine that a FRU is installed into a receiving bay of a computing rack so that the above-described connector of the FRU interconnects with a corresponding connector of the particular frame arm of the receiving bay. Upon detection of a presence of the FRU (e.g., by circuitry of the frame arm, such as by detecting a power draw by the FRU), the frame arm may send an alert (e.g., an interrupt) over the fixed interconnect topology to the frame center (e.g., over the respective $I^2C$ line interconnected between the frame arm and the frame center) regarding the detecting presence. The frame center (e.g., its service processor) may then read (e.g., over the respective $I^2C$ line) the memory of the virtual slot to obtain an indication of the fixed location of the virtual slot (and thus the installed FRU) within the rack, and then utilize the fixed location data to perform one or more OOB management tasks with respect to the newly installed FRU. For instance, the frame manager may maintain or at least have access to (e.g., within a memory of the frame center) various types of information in relation to minimum processing and storage capacities of installed FRUs, power and cooling requirements, physical locations, current firmware version, network connections, and the like, all of which may be used as part of the OOB management of the FRU.

In this regard, part of the OOB management performed by the frame manager may include obtaining one or more properties from the OOB service processor of a newly installed FRU and comparing such properties to minimum or expected properties. Upon the frame manager determining that the FRU includes the expected properties or otherwise validating the FRU, the frame manager may then instruct the main processor on the motherboard of the FRU to power up (e.g., via establishing a connection with the OOB service processor of the FRU (e.g., over the respective Ethernet cable interconnected between the frame center and the frame arm)) so that the FRU can proceed to operate in any appropriate manner. Thereafter, the UMS portion on the OOB service processor of the FRU may send alerts or messages to the frame manager via the communications path(s) (e.g., a network cable) as appropriate in relation to faults, FRU hot-swapping requests, and the like. Among other advantages, a rack or cabinet including the disclosed frame or system installed therein may hold data center floor space for later, rapid deployment of various types of FRUs (e.g., in response to service demand, roll-out of new services, and/or the like).

In one aspect, a fixed interconnect topology for implementing a backplane of a blade chassis in a computing rack includes a plurality of a first type of communication cables forming a first communication network of the fixed interconnect topology, a plurality of a second type of communication cables forming a second communication network of the fixed interconnect topology, and a plurality of power cables. Each of the plurality of first type of communication cables extends from a common first location to a respective one of a plurality of fixed locations, each of the plurality of second type of communication cables extends from the common first location to a respective one of the plurality of fixed locations, and each of the plurality of power cables extends from a common second location to a respective one of the plurality of fixed locations. In this regard, each fixed location is electrically connected to at least one of the first type of cables, at least one of the second type of cables, and at least one of the power cables.

In one arrangement, the common first location may be a central management server (e.g., a stand-alone device including a service processor, memory, circuitry, etc.), where each of a plurality of first ends of each of the plurality of first and second types of communication cables is interconnected to a respective one of a plurality of first and second types of interfaces of the central management server (e.g., $I^2C$ data ports, network/Ethernet ports). For instance, each of a plurality of opposing second ends of each of the plurality of first type of communication channels may be interconnected to a respective one of a plurality of memories at the plurality of fixed locations, where each of the plurality of memories stores data indicating the respective fixed location within the fixed interconnect topology, and where the central management server utilizes one of the first type of communication cables to read the fixed location data from the respective one of the plurality of memories of at least a first of a plurality of field replaceable units (FRUs) electrically interconnected thereto on which at least one type of management is to be performed. As another example, each of a plurality of opposing second ends of each of the plurality of second type of communication channels may be connected to a respective one of a plurality of first connectors at the plurality of fixed locations, where each of the plurality of connectors is electrically interconnectable to a corresponding respective second connector of one of the plurality of FRUs, and where a rack manager of the fixed interconnect topology utilizes the second communication network to perform the at least one type of management of the first FRU via the respective first and second connectors.

In another arrangement, a system includes a computing rack including a framework defining a plurality of storage bays and the fixed interconnect topology disclosed herein. Each of the plurality of fixed locations may be a rear of a respective one of the plurality of storage bays.

In another aspect, a method of pre-wiring a computing rack to allow for centralized management of a plurality of field replaceable units (FRUs) subsequently received within a plurality of receiving bays of the computing rack is disclosed. This method includes electrically interconnecting a first end of each of a plurality of $I^2C$ cables to a central computing device, electrically interconnecting a second end of each of the plurality of $I^2C$ cables to a respective one of a plurality of circuit boards, and securing each of the plurality of circuit boards adjacent a respective one of the plurality of receiving bays of the computing rack. The central computing device obtains data indicating a physical location of a respective one of the receiving bays within the computing rack via the one of the plurality of $I^2C$ cables and one of the plurality of circuit boards secured adjacent the receiving bay for use in performing one or more management routines (e.g., OOB management tasks) in relation to a FRU secured within the respective one of the receiving bays.

In one embodiment, the method may include electrically interconnecting a first end of each of a plurality of network (e.g., Ethernet) cables to the central computing device, electrically interconnecting a second end of each of the plurality of network cables to a respective one of a plurality of connectors, and electrically interconnecting each of the plurality of connectors to a respective one of the plurality of circuit boards. In another embodiment, the method may include electrically interconnecting a first end of each of a plurality of power cables to a power distribution unit, and electrically interconnecting a second end of each of the plurality of power cables to a respective one of the connectors. For instance, each of the plurality of circuit boards may be secured adjacent a rear portion of a respective one of the plurality of receiving bays of the computing rack, and each of the plurality of receiving bays may be configured to receive a respective FRU via an opposing front portion of the receiving bay.

In one arrangement, a method includes inserting a FRU into one of the plurality of receiving bays, electrically interconnecting a connector of the FRU to the respective connector of the one of the plurality of receiving bays, and managing the FRU via the respective connectors. For instance, the managing may include informing the central computing device, from the circuit board of the one of the plurality of receiving bays via the respective one of the $I^2C$ cables, that the FRU has been electrically interconnected with the circuit board; reading, by the central computing device via the respective one of the plurality of $I^2C$ cables, a memory of the circuit board to determine a fixed location of the one of the receiving bays within the computing rack; alerting, via the plurality of network cables, a rack manager regarding the fixed location; and managing, by the rack manager, the FRU via the plurality of network cables and the respective connectors.

In a further aspect, a virtual backplane implemented within a computing rack is disclosed that includes a plurality of $I^2C$ cables and a plurality of power cables. A first end of each of the plurality of $I^2C$ cables is electrically connected to a central computing device and a second end of each of the plurality of $I^2C$ cables is electrically connected to one of a plurality of circuit boards respectively secured adjacent one of a plurality of receiving bays of the computing rack. A first end of each of the plurality of power cables is electrically connected to a power distribution unit, and a second end of each of the power cables is electrically connected to one of a plurality of connectors respectively electrically connected to one of the plurality of circuit boards.

In one embodiment, the virtual backplane further includes a plurality of network cables, where a first end of each of the plurality of network cables is electrically connected to a network switch, and where a second end of each of the network cables is electrically connected to one of the plurality of connectors respectively electrically connected to one of the plurality of circuit boards.

Any of the embodiments, arrangements, or the like discussed herein may be used (either alone or in combination with other embodiments, arrangement, or the like) with any of the disclosed aspects. Merely introducing a feature in accordance with commonly accepted antecedent basis practice does not limit the corresponding feature to the singular. Any failure to use phrases such as "at least one" does not limit the corresponding feature to the singular. Use of the phrase "at least generally," "at least partially," "substantially" or the like in relation to a particular feature encompasses the corresponding characteristic and insubstantial variations thereof. Furthermore, a reference of a feature in conjunction with the phrase "in one embodiment" does not limit the use of the feature to a single embodiment.

In addition to the exemplary aspects and embodiments described above, further aspects and embodiments will become apparent by reference to the drawings and by study of the following descriptions.

BRIEF DESCRIPTION OF THE DRAWINGS

FIG. 1 illustrates one embodiment of a setup including a smart computing frame or system installed within a computing rack for facilitating out of band management of a plurality of FRUs within the rack, such as rack-mounted servers, backup power modules, and/or the like.

FIG. 4 is a more detailed schematic view of a frame arm of the frame of FIG. 1 about to interface with a corresponding FRU.

DETAILED DESCRIPTION

Figure 1:
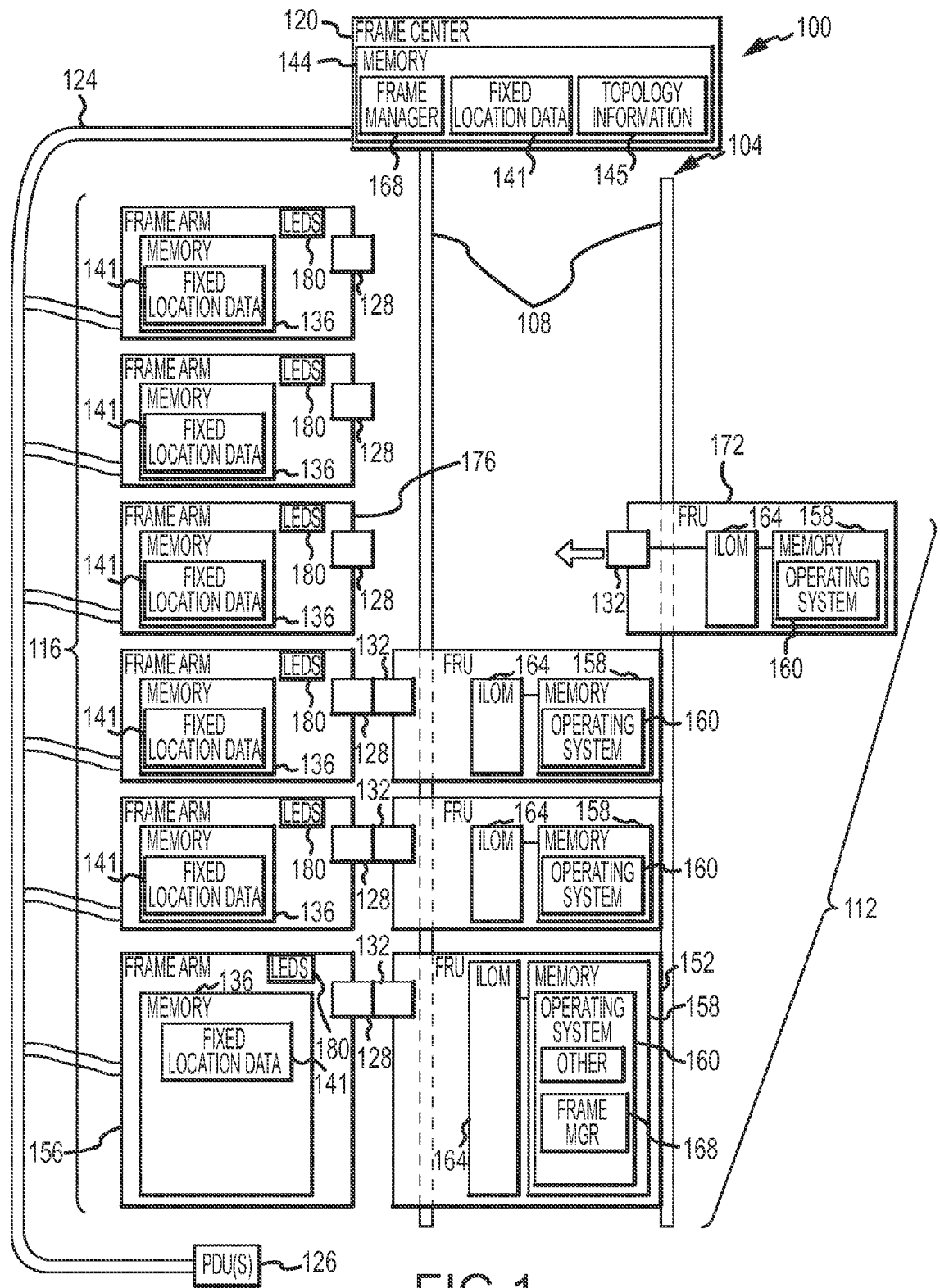

Disclosed herein are systems and methods for the central management of a plurality of rack-mounted FRUs (e.g., servers, backup power modules, and/or the like) that provide levels of availability and serviceability similar to those provided within chassis or blade-based systems but free of many of the inherent restrictions of blade-based systems. Broadly, the disclosed system includes a plurality of "virtual slots" or "frame arms" (e.g., receiving structures, housings, connectors, and/or the like) for electrically interconnecting with a corresponding plurality of FRUs (e.g., having similar or disparate form factors and functionalities). For instance, adjacent frame arms may be appropriately spaced along the height or other dimension of a computing rack or cabinet (e.g., such as by 1 U or multiples thereof) and may be conveniently aligned with slide rails and/or other mounting features so that a FRU inserted into the rack via the slide rails or other mounting features may be operable to automatically interconnect with a respective frame arm.

The disclosed system may also include a "frame center" (e.g., "frame management module," "central management controller," "central management module," "central computing device," etc.) that is electrically interconnectable to each of the virtual slots by a "fixed interconnect topology" in a manner that allows for FRU presence detection (i.e., detection of a FRU in one of the receiving bays at a known, fixed location within the rack), FRU OOB management (e.g., in relation to start-up, hot-swapping, power and cooling monitoring, and/or the like via a "frame manager" implemented in and/or in communication with the frame center), and the like. The system (including the frame arms, frame center, and fixed interconnect topology) may be incorporated into the rack or cabinet as part of building the rack or else be retrofitted or otherwise integrated into an existing rack (i.e., an existing rack that has not been purpose-built specifically for the system). That is, the rack/cabinet and FRUs may be standalone products that are independent of the system. The combination of the system/frame and a rack or cabinet may collectively form a "setup."

As used herein, the term "fixed interconnect topology" connotes a plurality of communication paths/lines/cables (e.g., those necessary for FRU presence and fixed location detection, OOB management, etc.) fixedly connecting the frame center to each of the plurality of frame arms. The plurality of communication lines may include a plurality of I²C cables, each of which is electrically interconnected between the frame center and a respective one of the frame arms. The plurality of communication lines may also include a plurality of Ethernet cables, each of which is electrically interconnected between the frame center and a respective one of the frame arms. The fixed interconnect topology may also include a plurality of power paths/lines/cables fixedly interconnecting each of one or more PDUs to each of the plurality of frame arms and/or directly to each of a plurality of installed FRUs. Each of the communication and power paths or lines includes two endpoints, where the first endpoint (e.g., endpoint "A") is connected to a particular port of the frame center or PDU and where the second endpoint (e.g., endpoint "B") is connected to a particular frame arm (e.g., where the frame arm is at an offset U within the frame).

Turning now to FIG. 1, a schematic side view of a computing frame or system 100 is disclosed that allows rack-type FRUs (e.g., rack-mount servers, backup power modules, and the like) to be managed in a manner similar to that in which blade-type servers are managed within a blade enclosure or chassis, but in a manner that is largely free of many of the inherent limitations of blade-type systems. The frame 100 may be secured to or otherwise implemented within any appropriate rack or cabinet 104 having a plurality of bays or receiving locations (not shown in FIG. 1) sized to receive a respective plurality of FRUs 112 of one or more types and/or form factors such as rack-mount servers, blade enclosures (each holding one or more blade servers), and/or other electronic devices in a stacked or overlapping fashion. The rack 104 may include any appropriate number of posts or vertical support members or rails 108 (e.g., two, four, and the like) based upon the particular environment in which the frame 100 is to be implemented. Associated with the posts 108 may be a series of slide rails, rail assemblies, or other structures (not shown) that allow the FRUs 112 to be selectively inserted into and secured to the rack 104. The posts 108 may be appropriately secured to the floor or other adjacent building structure to limit the frame 100 from falling over. Other details concerning the rack 104 (e.g., panels, fasteners, and the like), how the FRUs 112 are inserted into and removed from the rack 104, and the like will not be further discussed in relation to FIG. 1 in the interest of clarity and/or brevity.

The frame 100 includes a plurality of frame arms 116 (e.g., virtual slots, receiving structures, etc.), each of which is configured to electrically interface with a corresponding one of a plurality of the FRUs 112 (e.g., via respective corresponding connectors 128, 132 as will be discussed in more detail below). The frame 100 also includes a frame center 120 (e.g., a separate, dedicated computing device) implementing a frame manager 168 (e.g., software, logic) or otherwise working at the direction of the frame manager 168 (e.g., in the case where the frame manager 168 is implemented on another device) for receiving FRU insertion/removal alerts from the frame arms 116 and performing OOB management of the FRUs 112. While the frame manager 168 has been illustrated as being implemented within the frame center 120, some arrangements envision that some or all of the frame manager 168 may be implemented on a device separate from but in communication with the frame center 120 (e.g., an installed FRU 112, a device separate from the frame center 120 and FRUs 112, and/or the like).

A fixed interconnect topology 124 (e.g., harness) of communication lines or paths (e.g., wired or wireless) directly interconnects the frame center 120 to each of the frame arms 116. As discussed previously, the plurality of communication paths may include a plurality of I²C paths (e.g., cables), each of which is electrically interconnected between the frame center 120 and a respective one of the frame arms 116. Each I²C cable facilitates transmission of alerts from a respective frame arm 116 to the frame center 120 regarding FRU presence detection, requests to remove a FRU 112 from a particular receiving bay (e.g., initiated via a user depressing a button on the respective frame arm 116), and/or the like. The frame center 120 can also utilize an I²C cable to read a memory of a respective frame arm 116 to obtain data indicating a fixed location of the frame arm 116 (and thus an interfaced FRU 112) within the frame 100 and subsequently utilize the fixed location data as part of performing OOB management of the interfaced FRU 112 (discussed in more detail below).

The plurality of communication paths of the fixed interconnect topology 124 may also include a plurality of network (e.g., Ethernet) paths (e.g., cables) each being electrically interconnected between the frame center 120 and a respective one of the frame arms 116 and which collectively create a local area network (LAN) within the frame 100 and/or rack 104. Each network cable may essentially "pass-through" its respective frame arm 116 to facilitate substantially direct communications between the frame center 120 and an OOB service processor 164 (e.g., ILOM) of an interfaced FRU 112 for use in performing OOB management of the FRU 112 (e.g., in addition to allowing for network (e.g., Internet, WAN, LAN) communications between the FRU 112 and servers, processes, devices, etc. outside of the frame 100 and/or rack 104). In this regard, the frame center 120 may utilize the I²C cables to receive FRU insertion/removal alerts and to identify one or more particular fixed locations within the frame 100 of particular frame arms 116 and corresponding FRUs 112 (e.g., via reading the memory of the frame arm 116), and may utilize the network cables to perform OOB management of one or more of the FRUs 112 (e.g., via communicating with the OOB service processor 164 and/or other management entity of the FRUs 112).

For instance, each cable/line may be in the form of "line-endpoint(A):management-server(X):port(N)<->line-endpoint(B):receive-structure(U)." The fixed interconnect topology 124 may also include a plurality of power paths/lines/cables fixedly interconnecting each of one or more PDUs 126 to each of the plurality of frame arms 116 (so that a FRU 112 may receive power upon the connector 132 of a FRU 112 interfacing with the corresponding connector 128 of its respective frame arm 116), or, in some arrangements, directly to ports on each of the FRUs 112. In any event, the fixed interconnect topology 124 may essentially form at least part of a "virtual" backplane or midplane that allows a FRU 112 to be able to substantially seamlessly join whatever management service context it is part of (in this case, the UMS running on the frame manager 168 and OOB service processors 164 of installed FRUs 112).

Before discussing the frame arms 116, frame center 120, FRUs 112, and interactions therebetween in more detail, reference will now be made to FIG. 2 which illustrates a system 500 for receiving one or both of an AC input power source (e.g., one or more mains power supplies) and a DC input power source (e.g., battery banks, AC to DC converters, other DC power supplies, etc.), and then providing first and second DC voltages (e.g., −48V) to respective first and second DC power distribution units (PDUs) for distributing dual/redundant DC power to FRUs mounted within a computing rack. While the system 500 will be discussed in conjunction with the system 100, it is to be understood that the system 500 may be used to provide power to FRUs mounted within a rack not incorporating the system 100.

Generally, current telecommunications systems are required to be able to accept either an AC power source (e.g., mains electricity) or a DC power source (e.g., battery banks) for powering equipment (e.g., rack-mounted FRUs) of the systems. In this regard, telecommunications systems often have different sets of equipment (e.g., power converters, rectifiers, PDUs, power cables, etc.) for respectively receiving AC and DC input power sources and distributing a voltage to FRUs or other equipment of the system. For instance, when a particular computing rack is to receive an AC power supply, the rack will have a first particular set of equipment designed to accept the AC power supply and eventually distribute (e.g., via one or more PDUs) a voltage to each of a plurality of FRUs. However, when the same computing rack is to receive one or more DC power supplies, then the rack will have a separate second particular set of equipment designed to accept the one or more DC power supplies and distribute one or more DC voltages to each of a plurality of FRUs (e.g., via one or more PDUs). Maintaining separate sets of equipment for AC and DC power sources results in increased testing and validations costs for the manufacturer, operational costs for the manufacturer and end customer, and costs for sparing parts for both sets of equipment.

In this regard, the system 500 disclosed herein includes a single set of equipment that is designed to accept an input AC and/or DC power source and distribute at least one DC voltage to each of a plurality of FRUs mounted within a computing rack (e.g., FRUs 112 of FIG. 1, FRUs of a different computing rack, and/or the like) regardless of whether the input power source is AC and/or DC. As the system 500 includes only a single set of equipment, numerous reductions in various types of costs (e.g., testing, operational, validation, spare parts) may be realized in relation to current telecommunications systems. For instance, as Network Equipment-Building System (NEBS) certification testing often costs over $100,000 just for initial testing and up to $30,000 for subsequent tests, the cost savings from being able to utilize AC and/or DC power sources with a single set of equipment can be substantial.

Figure 2:
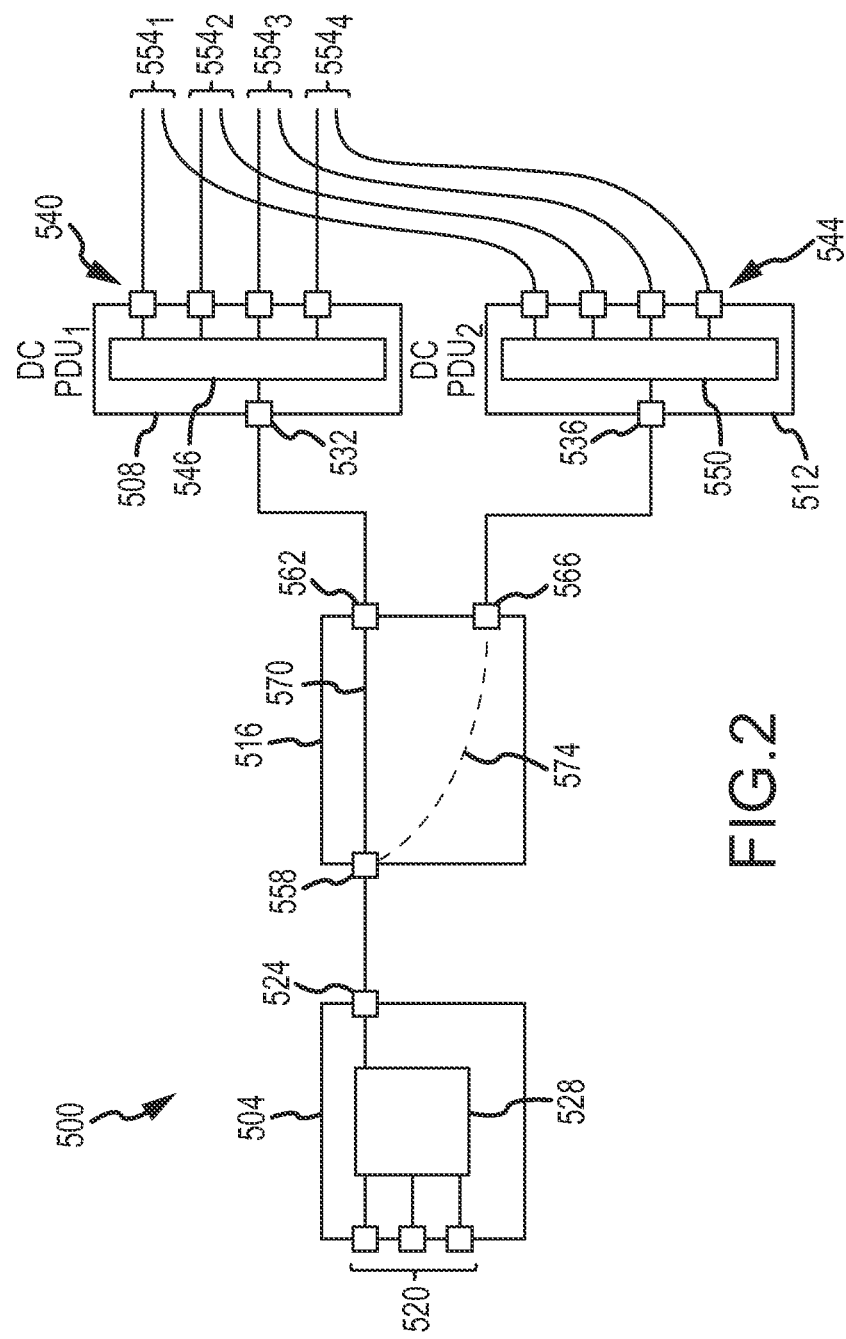
FIG. 2 is a schematic diagram of a system designed to accept an AC and/or DC input power supply and distribute redundant DC voltages to each of a plurality of FRUs mounted within a computing rack, according to an embodiment.

As shown in FIG. 2, the system broadly includes an AC to DC converter or rectifier 504, at least first and second DC PDUs 508, 512 (e.g., rack-mounted PDUs, smart or intelligent PDUs, etc.), and an electrical bypass mechanism 516 electrically connected between the rectifier 504 and the first and second DC PDUs 508, 512. The bypass mechanism 516 is configured to deliver a DC voltage to each of the first and second DC PDUs 508, 512 from an AC power source (e.g., via the rectifier 504) and/or from a DC power source as will be discussed below. Stated differently, the rectifier 504 and bypass mechanism 516 may collectively be considered a "power conversion apparatus" that is configured to deliver a DC voltage to each of the first and second DC PDUs 508, 512 regardless of whether a power supply inputted to the power conversion apparatus includes one or more AC power sources, one or more DC power sources, or both AC and DC power sources.

The rectifier 504 may broadly include one or more (e.g., a plurality of) input nodes 520 (e.g. ports, contacts, pads) for electrical connection with one or more AC power sources or supplies such as one or more mains input feeds (e.g., 20 A, 200-240V, single or multi-phase, etc.), at least one output node 524 (e.g., port, contact, pad) for electrical connection with so as to pass a DC voltage to the bypass mechanism 516, and circuitry 528 (e.g., any appropriate arrangement of one or more transformers, diodes, resistors, and/or the like) configured to convert the AC power from the AC power source(s) into a DC voltage (e.g., −48V). Each of the first and second DC PDUs 508, 512 may include at least one respective input node 532, 536 (e.g., port, contact, etc.) for electrical connection to the bypass mechanism 516, a plurality of output nodes 540, 544 (e.g., outlets) for electrical connection to the frame arms 116 (e.g., to the connectors 128 of the frame arms 116) or directly to the FRUs 112 or other rack-mounted equipment, and any appropriate circuitry 546, 550 operable to receive a DC voltage from the bypass mechanism 516 and distribute DC power to FRUs 112 (or other rack-mounted equipment) via the output nodes 540, 544. To provide redundant or backup power (e.g., redundant power supplies (RPS)) to each of the FRUs 112, respective sets $554_1$, $554_2$, $554_3$, $554_4$, etc. of power cables/cords may be electrically connected between respective output nodes 540, 544 of the first and second DC PDUs 508, 512 and each of the frame arms 116, FRUs 112, etc.

For instance, first ends of the first set $554_1$ of power cables may be respectively plugged into or otherwise electrically connected to first output nodes 540, 544 of the first and second DC PDUs 508, 512 while second ends of the first set $554_1$ of power cables may both be electrically connected to the same frame arm 116, the same FRU 112, etc. Each of the first and second DC PDUs 508, 512 may be loaded to some percentage less than its rated maximum load to avoid tripping its circuit breaker. In one arrangement, the first and second DC PDUs 508, 512 may share the FRU 112 load at about 50% each but with each of the first and second DC PDUs 508, 512 being loaded at less than 50% of its rated maximum load. Thus, even in the event that one of the first and second DC PDUs 508, 512 loses power resulting in the other of the first and second DC PDUs 508, 512 having to support 100% of the load, the remaining PDU will still be loaded less than its rated maximum load.

With continued reference to FIG. 2, the bypass mechanism 516 may include at least one input node 558 (e.g., contact, junction) for electrical connection (e.g., via a trace, line, cable) to the output node 524 of the rectifier, at least first and second output nodes 562, 566 (e.g., contacts, pads) for respective electrical connection to the input nodes 532, 536 of the first and second DC PDUs 508, 512, a first conductive path 570 (e.g., trace, line, cable) electrically connecting the input node 558 to the first output node 562, and a second conductive path 574 (e.g., trace, line, cable) "interruptably electrically connectable" between the input node 558 and the second output node 566. While the second conductive path 574 has been shown as extending from the input node 558 to the second output node 566, it is to be understood that the second conductive path 574 may, in other embodiments, extend from some portion of the first conductive path 570 (e.g., as just one example, from a midpoint of the first conductive path 570 between the input node 558 and the first output node 562) to the second output node 566 without departing from the spirit of the present disclosure.

For purposes of this disclosure, "interruptably electrically connectable" means that current flow between the input node 558 and the second output node 566 can be selectively interrupted or stopped for reasons that will be discussed below. In one arrangement, the second conductive path 574 may be removable from the bypass mechanism 516. For instance, the second conductive path 574 may be in the form of an electrical jumper that may be removed to interrupt current flow between the input node 558 and the second output node 566. In another arrangement, any appropriate switch or button (e.g., not shown) may be disposed along second conductive path 574 and actuatable or manipulatable to selectively interrupt or disallow current flow between the input node 558 and the second output node 566. Other arrangements are also possible and encompassed within the scope of the present disclosure.

Figure 3A:
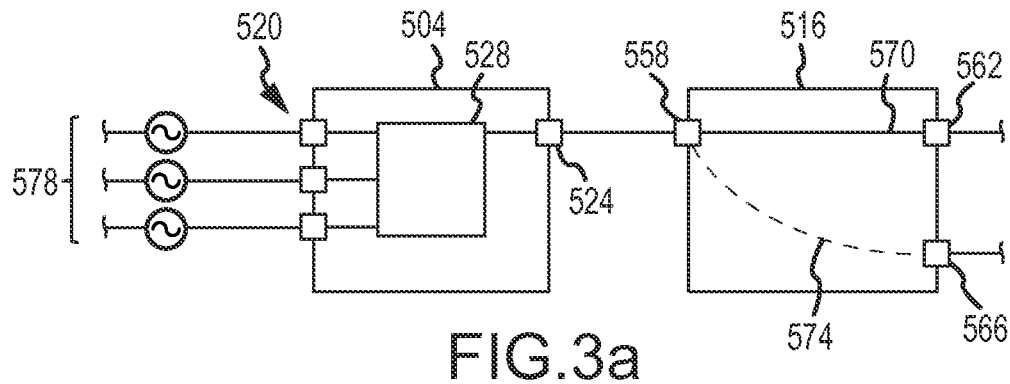
FIG. 3a is a schematic diagram of one configuration of the system of FIG. 2 that is designed to accept an AC input power source.

The system 500 may be electrically interconnected with at least three different arrangements of input power sources and still provide a DC output voltage regardless of the input power source arrangement. Turning now to FIG. 3a (with the first and second DC PDUs 508, 512 being omitted for clarity), one configuration of the system 500 is illustrated whereby the input power source is a plurality of AC or mains input feeds 578 respective electrically connected to the plurality of input nodes 520 of the rectifier 504. After the circuitry 528 has rectified the mains input feeds 578 into a DC voltage, the DC voltage is passed through the output node 524 of the rectifier 504 to the input node 558 of the bypass mechanism 516. The DC voltage is then sent along the first and second conductive paths 570, 574 through the first and second output nodes 562, 566 to the first and second DC PDUs 508, 512 for distribution to FRUs of a computing rack or cabinet. While one end of the second conductive path 574 is illustrated as being connected to the input node 558, other arrangements envision that the end may be connected to some portion of the first conductive path 570.

Figure 3B:
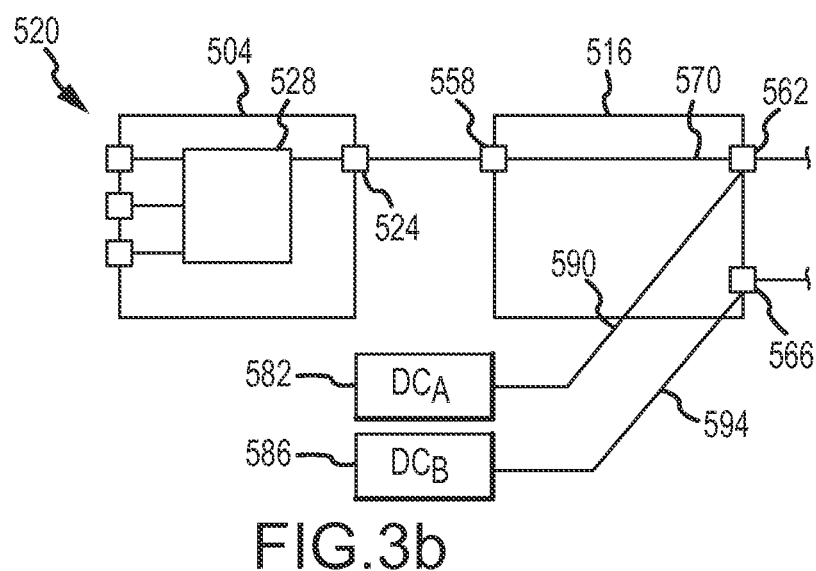
FIG. 3b is a schematic diagram of another configuration of the system of FIG. 2 that is designed to accept a DC input power source.

With reference now to FIG. 3b, another configuration is illustrated whereby the input power source is first and second DC power supplies 582, 586 (e.g., each supplying −40V to −60V) respectively electrically interconnected via first and second conductive lines 590, 594 (e.g., cables, cords, etc.) to the first and second output nodes 562, 566 of the bypass mechanism 516 to respectively supply DC voltages to the first and second DC PDUs 508, 512. In this configuration, there is no AC input power source, and any current flow between the input node 558 and the second output node 566 is interrupted.

In one arrangement, the second conductive path 574 may be removed (e.g., in the case of a removable jumper) and the first and second conductive lines 590, 594 may be respectively directly connected in any appropriate manner (e.g., plugs, hard-wiring, etc.) to the first and second output nodes 562, 566 (e.g., as shown in FIG. 3b) of the bypass mechanism 516. In another arrangement, the second conductive path 574 may remain within the bypass mechanism 516 but a switch or the like (not shown) disposed on the second conductive path 574 may be flipped or manipulated to interrupt current flow along the second conductive path 574. In this arrangement, the second conductive line 594 may be connected to the second output node 566 or to the second conductive path 574 somewhere between the switch and the second output node 566 while the first conductive line 590 may be connected to the first output node 562 or to the first conductive path 570 (or even to the input node 558). In the event that the first and/or second conductive lines 590, 594 are respectively connected to the first and/or second conductive paths 570, 574, then the respective junctions between the first conductive path and line 570, 590 and the second conductive path and line 575, 594 may in some cases be considered the first and second output nodes 562, 566. As there is no AC input power source in this configuration, the rectifier 504 may in some embodiments be omitted (e.g., in those contexts in which it is not envisioned that an AC input power source would ever be utilized). In one variation, the first conductive path 570 may additionally be appropriately interrupted (e.g., via removing the first conductive path 574, manipulating a switch disposed along the first conductive path 574, and/or the like).

Figure 3C:
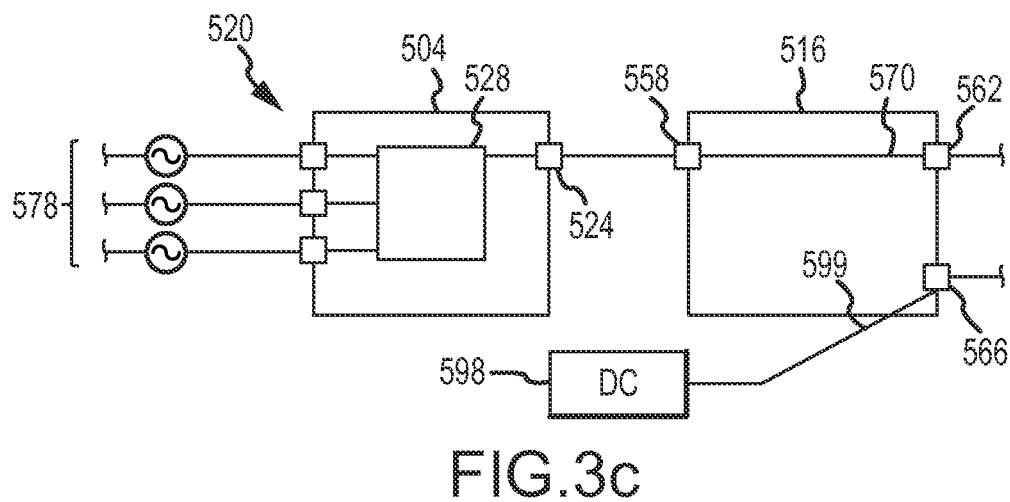
FIG. 3c is a schematic diagram of a further configuration of the system of FIG. 2 that is designed to accept both AC and DC input power sources.

FIG. 3c illustrates another configuration of the system 500 that is representative of an integrated uninterruptable power supply (UPS) input. In this configuration, current flow between the input node 558 and the second output node 566 is again interrupted as discussed above in relation to FIG. 10b (e.g., via removing the second conductive path 574, actuating a button or switch on the second conductive path 574, and/or the like). However, the input power source now includes both an AC input power source and a DC input power source. For instance, one or more mains input feeds 578 may be respectively electrically connected to the input nodes 520 of the rectifier 504 so as to supply a DC voltage to the first DC PDU 508 via the output node 524, input node 558, first conductive path 570 and first output node 562. Also, a DC power supply 598 (e.g., one of first and second DC power supplies 582, 586) may be electrically connected via conductive line 599 (e.g., one of first and second conductive lines 590, 594) to the second output node 566 (or to a portion of the second conductive path 574 between switch (not shown) and the second output node 566) to supply a DC voltage to the second DC PDU 512.

While the rectifier 504, bypass mechanism 516 and first and second DC PDUs 508, 512 have been illustrated in FIGS. 2-3c as being separate components, one or more of the various components may be integrated into other of the components. For instance, the rectifier 504 and bypass mechanism 516 (e.g., the power conversion apparatus) may both be implemented into a single integrated circuit and/or into a common housing. As another example, one or more features of the bypass mechanism 516 or rectifier 504 may be implemented into the first and/or second DC PDUs 508, 512. In this regard, the diagrams shown in FIGS. 2-3c have merely been presented to illustrate the various functionalities of the system 500 rather than necessarily limiting the breadth of the system 500. Turning back to FIG. 1, each frame arm 116 generally connotes any appropriate arrangement of one or more parts or components that can electrically interface with one or more different types of FRUs 112 to allow the FRU 112 to draw power from the PDUs 126 and to allow the frame center 120 to perform OOB management of the FRU 112. Broadly, each frame arm 116 may include a memory 136 storing data 141 (e.g., one or more IDs or addresses) indicating a particular fixed or physical location of the frame arm 116 within the frame 100 relative to the other frame arms 116. Each frame arm 116 may also have a connector 128 that is configured to mate with a corresponding connector 132 of a respective FRU 112 upon insertion of the FRU 112 into a respective receiving bay of the rack 104 (associated with the frame arm 116) to allow the FRU 112 to draw power from the PDUs 126 and the frame manager 168 to communicate with the OOB service processor 164 of the FRU 112 via the fixed interconnector topology 124 and the respective connectors 128, 132.

FIG. 4 presents a more detailed schematic view of one of the frame arms 116 as it is about to interface with a corresponding FRU 112. The frame arm 116 may include any appropriate housing 118 to which the connector 128 and a circuit board such as printed circuit board (PCB) 122 may be secured. The housing 118 may, for instance, be mounted to the framework of the rack 104 adjacent one of the receiving bays of the rack 104 (e.g., adjacent a rear portion of the rack 104) so that, upon insertion of the FRU 112 into the receiving bay, the connector 132 (e.g., blind mate connector) of the FRU 112 may electrically interface with the connector 128 (e.g., corresponding blind mate connector) of a corresponding frame arm 116 (e.g., corresponding pins/contacts of the connectors 128, 132 may contact or otherwise electrically interface). The PCB 122 may have any appropriate arrangement of circuitry that includes the memory 136 storing the location data 141 of the frame arm 116 (e.g., where the location data may be included within a "worker" programmable read-only (PROM) image 140 as discussed later on in this discussion).

An I$^2$C data line 20 (e.g., cable, cord, path, etc., part of the fixed interconnect topology 124, not shown) may be electrically connected at one end to the PCB 122 (e.g., to an I$^2$C data bus of the PCB 122, not shown) and at an opposing end to the frame center 120 (discussed in more detail below) to allow the frame arm 116 to send alerts to the frame center 120 (e.g., regarding FRU presence detection, requests to remove a FRU 112 from the receiving bay and thus the OOB management network, and/or the like) as well as to allow the frame center 120 to read the location data 141 from the memory 136 (e.g., upon receiving a corresponding alert) to determine configuration information for the FRU 112 based on the read location information. The PCB 122 may also include any appropriate logic 130 (e.g., electrically connected to the I$^2$C data bus of the PCB 122) operable to convert between serial data and I$^2$C data for reasons discussed below, one or more LEDs 180 (or other types of indicators) that broadly indicate one or more operational states or statuses of the frame arms 116, and/or one or more buttons 182 or the like that, when manipulated (e.g., depressed), are operable to cause the generation and transmission of a signal or other communication from the frame arm 116 to the frame center 120 (e.g., a request to remove a FRU 112 from the frame arm 116 and thus from the management network of the frame 100). For instance, the operational states of a particular frame arm 116 indicated by the LEDs 180 may range from an initial state of no FRU 112 being interfaced with the frame arm 116 all the way through to a final state of one or more FRUs 112 being interfaced and active (e.g., all manual servicing of the frame 100 is complete). The LEDs 180 may also indicate proper transition from initial to final state as well as error states that may require additional specific recovery operations.

The frame arm 116 also facilitates "pass-through" of a network (e.g., Ethernet) cable 24 from the frame center 120 to the connector 128 as well as one or more power cables such as first and second power cables 28, 32 (e.g., one of sets 554$_1$-554$_4$ in FIG. 2) from first and second DC PDUs (e.g., first and second DC PDUs 508, 512 in FIG. 2) to the connector 128. Stated differently, the network cable 24 and first and second power cables 28, 32 need not necessarily communicate or interact with the PCB 122 and thus may be in substantial direct connection with the FRU 112 upon interfacing of the connectors 128, 132.

With respect to the FRU 112 (a rear portion of the FRU 112 being shown in FIG. 4), the connector 132 may be non-movably (e.g., rigidly) secured to the FRU 112 (e.g., directly or indirectly) via any appropriate arrangement 134 of brackets, linkages, and/or the like (one representative example of an arrangement 134 will be discussed later on in relation to FIGS. 14-20). A network (e.g., Ethernet) port 36 of the FRU 112 may be electrically connected to the connector 132 by a network cable 40, and first and/or second power ports 44, 48 of the FRU 112 may be electrically connected to the connector 132 by respective power cables 52, 56. Furthermore, a serial management port 60 of the FRU 112 may be electrically connected to the connector 132 by a serial data line 64. In this regard, interfacing of respective pins and/or contacts (not shown) of the connectors 128, 132 automatically allows the FRU 112 to draw power from the PDUs 126 via power cables 28, 52 and/or power cables 32, 56, and automatically allows for network communications between the frame manager 168 (and/or frame center 120) and the OOB service processor (e.g., ILOM) 164 (shown in FIG. 1) of the FRU 112 (as well as network communications between the FRU 112 and devices/processes outside of the frame 100 and rack 104) via network cables 24, 40.

Also upon interfacing of the connectors 128, 132, a serial data connection is established between the serial management port 60 and the PCB 122 via serial data line 64. In this regard, requests from the OOB service processor 164 of the FRU 112 to read information (e.g., such as location data 141, role information, etc.) from the memory 136 of the PCB 122 (via serial management port 60 and serial data line 64) may be converted into I$^2$C data by logic 130 for use in servicing the request. The requested information may then be converted back into serial data by the logic 130 before being sent back to and/or received by the OOB service processor 164 of the FRU 112. It is to be understood that each of the plurality of frame arms 116 may be substantially similar to the aforementioned frame arm 116 and may differ only in relation to their fixed location data 141 (i.e., each frame arm will have a different, specific fixed location within the frame 100) and/or the like. However, it is noted that the each of the FRUs 112 that interface with the frame arms 116 need not necessarily be the same in terms of form factors, function, and/or the like, so long as such FRUs 112 include a connector 132 matable with the connector 128 of one of the frame arms 116, where the connector 132 is electrically connected to network, serial management and power ports of the FRUs 112 as discussed above.

Figure 5:
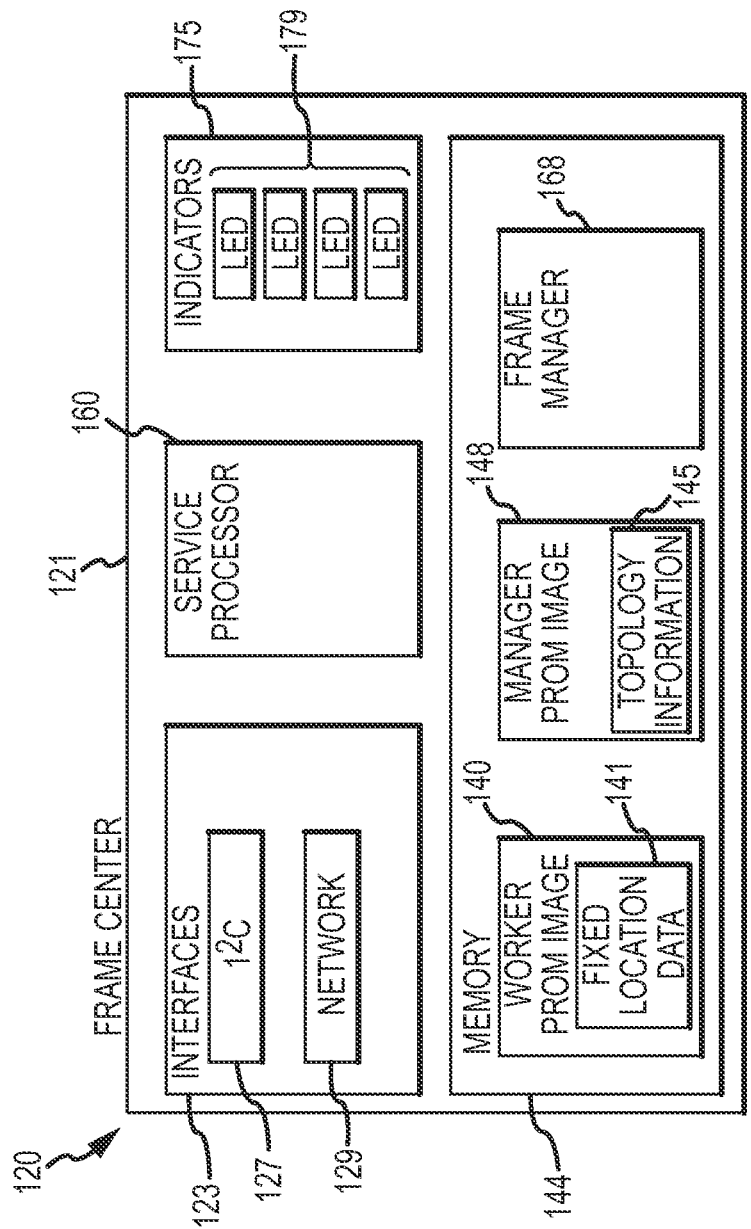
FIG. 5 is a more detailed schematic view of a frame center of the frame of FIG. 1.

Turning now to FIG. 5, a more detailed schematic view of the frame center 120 is presented. As discussed above, the frame center 120 may be a stand-alone, separate, dedicated computing device that facilitates OOB management by the frame manager 168 of what may be a plurality of disparate FRUs 112 mounted within a common computing rack 104 in a manner similar to how blades are managed within a blade chassis, but without many of the limitations inherently presented by blades (e.g., such as the necessity that all the blades have common form factors, common functionalities, and the like). In this regard, the frame center 120 generally includes a housing 121 including a management controller or service processor module 160 (e.g., including a processor, on-board memory, etc., not shown) designed to work in conjunction with the frame manager 168 to perform OOB management of the FRUs 112. The frame center 120 also includes a plurality of interfaces 123 for electrical connection to each of the plurality of frame arms 116 and PDUs 126 through the fixed interconnect topology 124 for use in FRU insertion/removal detection, OOB management, and the like.

For instance, the interfaces 123 may include a plurality of I$^2$C interfaces 127 such as a plurality of general purpose input/output (GPIO) pins disposed on one or more bus expanders, where each of the I$^2$C interfaces 127 is electrically interconnectable to the PCB 122 of a respective frame arm 116 through a respective I$^2$C data line 20 of the interconnect topology 124 (see FIG. 2). The I$^2$C interfaces 127 may form part of or otherwise be electrically interconnected to an I$^2$C bus (not shown) that electrically connects the I$^2$C interfaces 127 to the service processor 160. The interfaces 123 may also include a plurality of network interfaces 129 such as a plurality of Ethernet ports of a network switch that is electrically connected to the service processor 160 in any appropriate manner. Each network interface 129 is electrically interconnectable to the connector 128 of a respective frame arm 116 through a respective network line 24 of the interconnect topology 124 (see FIG. 4).

The frame center 120 also includes (or at least has access to) a memory 144 storing both fixed location data 141 of the frame center 120 within the frame 100 (i.e., a location of the frame center 120 relative to the frame arms 116 within the frame 100) as well as fixed interconnect topology information 145. Broadly, the topology information 145 includes a definition of an expected overall topology of the frame 100 including the fixed location data 141 of each of the frame arms 116, IP addresses of each of the frame arms 116, which of the I$^2$C interfaces 127 is supposed to be electrically connected to which of the frame arms 116 (e.g., where each frame arm 116 may be identified by its respective fixed location data), which of the network interfaces 129 is supposed to be electrically connected to which of the frame arms 116, and/or the like. The topology information 145 also includes configuration records for the various frame arms 116 and the FRUs 112 respectively interfaced with the frame arms 116. For instance, the configuration records may include information such as types of FRUs 112 that may be respectively interfaced with particular ones of the frame arms 116, power and cooling requirements of particular FRUs 112, and/or the like. The fixed location data 141 and topology information 145 may be respectively stored within worker and manager PROM images 140, 148 as will be discussed later on this disclosure.

In one arrangement, the frame center 120 may also include a plurality of indicators 175 such as one or more LEDs 175 that are electrically interconnected to the I$^2$C interfaces 127 (e.g., to the I$^2$C data bus) and that are configured to activate (e.g., turn on, blink, etc.) based on one or more states or statuses of one or more of the FRUs 112 (e.g., faults, requests to remove, etc.). In any event, users can flexibly customize the overall topology of the frame 100 (i.e., modify the "virtual backplane") by simply implementing changes to the information 145 (e.g., associating a particular frame arm 116 with a different one of the interfaces 123 of the frame center 120 via any appropriate user interface in communication with the frame center 120) and/or the fixed interconnect topology 124 (e.g., removing one end of a particular network line 24 from one of the network interfaces 127 and plugging it into a different one of the network interfaces 127). The ability to flexibly customize the overall topology of the frame is in contrast to the backplanes of blade enclosures which are fixed/static and generally unable to be modified.

In another arrangement, the service processor 160 of the frame center 120 may be able to verify whether the various connections between the frame center 120 and the frame arms 116 via the fixed interconnect topology 124 match the expected topology definitions stored in the topology information 145 in the memory 144 of the frame center 120. For instance, the service processor 160 may be able to confirm whether first and second ends of a particular I$^2$C line 20 are respectively electrically connected to the particular I$^2$C interface 127 and frame arm 116 specified in the topology information 145. With reference to FIGS. 1, 4 and 5, the service processor 160 of the frame center 120 may initially read the topology information 145 in the memory 144 to obtain topology definitions for the frame center 120, the frame arms 116, and the fixed interconnect topology 124. For instance, the topology definitions could specify that a first I$^2$C interface 127 of the frame center 120 is supposed to be electrically connected to a first frame arm 116 (as identified by its respective ID or location information 141) by a first I$^2$C line 20, a second I$^2$C interface 127 of the frame center 120 is supposed to be electrically connected to a second frame arm 116 by a second I$^2$C line 20, and so on. The topology definitions could specify similar information for the various network lines 24 and/or other power and communication channels of the fixed interconnect topology 124.

The service processor 160 may then ascertain whether each of the plurality of communication lines (e.g., the various I$^2$C and network lines 20, 24) of the fixed interconnect topology 124 is electrically interconnected between the frame center 120 and one of the plurality of frame arms 116 according to the read topology. In one embodiment, the service processor 160 may send a plurality of signals over the plurality of communication lines (e.g., using IP addresses and the like of frame arms 116), and then receipt of each of the plurality of signals by the one of the plurality of frame arms 116 respectively associated with the one of the plurality of communication lines in the read physical topology may be verified in any appropriate manner. Stated differently, the service processor 160 may send a signal over the particular I$^2$C line 20 that is supposed to be electrically connected to frame arm 116 "#3," and then receipt of the signal by frame arm 116 #3 may be verified. A similar process may be performed with each of the various other I$^2$C and network lines 20, 24.

As an example, assume the frame arms 116 are arranged in a particular orientation within the rack 104. For instance, FIG. 1 illustrates how the frame arms 116 may be generally arranged in a vertically stacked manner between top and bottom portions of the rack 104 (e.g., where each frame arm 116 is respectively physically located in a particular order within the rack 104, such as a function of distance from a top or bottom of the rack 104). In this regard, the service processor 160 may successively send each signal over each respective communication line that is expected to be electrically connected with a particular frame arm 116 in a particular order that matches the arrangement of the frame arms 116 in the rack 104. Successive receipt of the signals in the particular order may then be confirmed to quickly verify accurate wiring of the frame 100.

For instance, each successive signal may be configured to activate an indicator (e.g., LED 180) on each respective frame arm 116. In this regard, proper wiring of the frame 100 may be verified by a user observing a "visual walking" of the LEDs 180 from the top towards the bottom of the rack 104 (or vice versa). Any miswirings between the actual electrical connections and the expected electrical connections could be identified through a skip or inaccuracy in the successive walking or activation of the LEDs 180 of the frame arms 116. As another example, the service processor 160 may be configured to read the topology information 145 (of FIG. 5) to determine a particular order of I$^2$C lines 20 expected to be electrically connected to a particular order of frame arms 116 (e.g., from the top portion towards the bottom portion of the rack 104), read the location data 141 in the memories of the frame arms 116 via the particular order of I$^2$C lines 20, and then verify that the read location data 141 matches the location data in the topology information 145 associated with each of the I$^2$C lines 20. In one arrangement, any appropriate indicators 175 (e.g., LEDs 177) on the frame center 120 may be configured to illuminate or otherwise activate depending on whether or not the frame is correctly wired. In response to a miswiring, the frame could be assessed, rewired, and then retested to verify correction wiring.

In this regard, the frame 100 persistently stores information sufficient to allow a connected/interfaced FRU 112 and the frame center 120 to agree on the FRU's 112 physical location within the frame (e.g., in relation to an offset U). Such persistently stored information may be resident within the frame arms 116, the frame center 120, the fixed interconnect topology 124, and/or other appropriate location. For instance, the topology information 145 in the memory 144 of the frame center 120 may include a fixed list of all lines/paths of the fixed interconnect topology 124 in the form of "line-endpoint (A):management-server(X):port(N)<->line-endpoint(B):receive-structure(U)."

In any event, the service processor 160 and/or frame manager 168 utilizes the fixed interconnect topology 124 and the frame arms 116 to readily perform OOB management of FRUs 112 interfaced with the frame arms 116 (e.g., regardless of the manufacturer of the FRU 112, the form factors of the FRU 112, and the like). That is, the frame 100 allows the service processor 160 and/or frame manager 168 to substantially seamlessly perform OOB management of what may be numerous disparate types of FRUs 112 installed within the cabinet 104 (e.g., in relation to product type, motherboard revision, processor configuration, memory configuration, PCI root and leaf node configuration, and/or the like) but similar to the manner in which the system controller of a blade chassis manages individual blades. With knowledge of the physical or fixed locations of FRUs 112 within the frame 100, the service processor 160 and/or frame manager 168 can readily pass communications and requests to and between the FRUs 112; administrators can readily swap out or otherwise rectify malfunctioning FRUs 112 so as to maintain high levels of uptime, redundant fault architectures, and low mean time to repair; and the like. In one arrangement, the service processor 160 and/or frame manager 168 may be able to monitor for power draws to determine frame arm 116 and corresponding FRU 112 locations. For instance, upon the connector 132 of a FRU 112 being interfaced with a corresponding connector 128 of a particular frame arm 116, the service processor and/or frame manager 168 may be designed to detect the resultant draw in power by the FRU 112 and thereby determine the FRU's 112 fixed or physical location within the frame 100.

Figure 6:
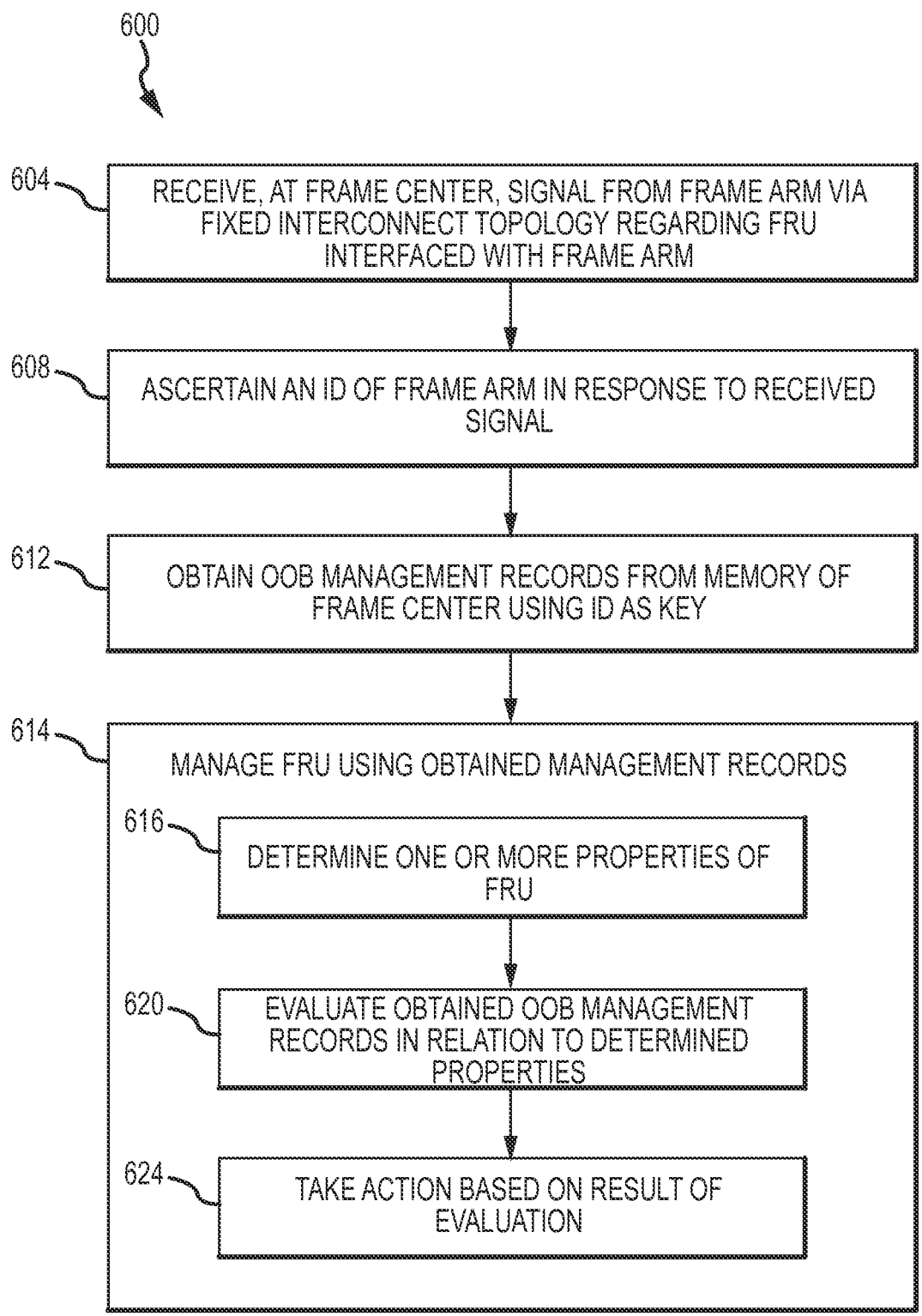
FIG. 6 is a representative sequence of events that may occur in the context of OOB management of FRUs within the frame of FIG. 1.

Turning now to FIG. 6, one representative sequence 600 of events will be discussed in the context of OOB management of FRUs 112 within the frame 100. At 604, a signal may be received at the frame center 120 from one of the frame arms 116 regarding a FRU 112 electrically interfaced with the frame arm 116. As one example, imagine the FRU 112 is installed into the frame 100 so that its connector 132 interconnects/interfaces with the corresponding connector 128 of the frame arm 116 (e.g., as in FIGS. 1 and 4), where the interfacing between the connectors 128, 132 triggers transmission of the signal from the frame arm 116 to the service processor 160 of the frame center 120. For instance, any appropriate circuitry of the frame arm 116 that is electrically connected to the connector 128 (e.g., circuitry of the PCB 122, not shown) may detect a power draw by the FRU 112 (e.g., via power ports 44, 48 and power lines 52, 56, 28, 32 in FIG. 4) and then generate and send an interrupt or alert to the service processor 160 of the frame center 120 (e.g., over an interrupt line electrically connected between the frame arm 116 and the frame center 120, over the respective I²C data line 20 electrically connected between the frame arm 116 and the frame center 120, and/or the like). As another example, imagine a user desires to remove a FRU 112 from a receiving bay of the rack 104 to perform service on the FRU 112, replace the FRU 112 with another FRU 112 (e.g., hot-swap the FRU 112), and/or the like. For instance, the user may depress a button 182 on the frame arm 116 (e.g., see FIG. 4) to cause the generation and transmission of a "request to remove" signal/alert (e.g., by any appropriate logic/circuitry of the PCB 122, not shown) to the frame center 120.

In response to the received signal, the service processor 160 of the frame center 120 may proceed to ascertain 608 an ID (e.g., address, code, etc.) of the frame arm 116 from which the signal was received in any appropriate manner, where the ascertained ID distinguishes the frame arm 116 from other frame arms 116 in the frame 100. For instance, the ID may identify a fixed location of the frame arm 116 within the frame 100, may be a unique number that identifies the frame arm 116 relative to other frame arms 116, and/or the like. In one arrangement, the service processor 160 may utilize an ID of the particular interface 123 through which the signal was received as a key into a table or the like of interface IDs and corresponding frame arm IDs in the stored topology information 145 (see FIG. 3) to ascertain the frame arm ID. In another arrangement, the particular line/cable (e.g., the I²C data line 20) over which the signal was received may be a smart or intelligent cable including a memory storing any appropriate ID (e.g., serial number or other identification data) that may be read by the service processor 160 for use in determining the ID of the frame arm 116. For instance, the service processor 160 may utilize the ID of the smart cable as a key into a table or the like of smart cable IDs and frame arm IDs in the stored topology information 145 to ascertain the frame arm ID.

Using the ascertained frame arm ID as a key, the service processor 160 may obtain 612 any appropriate OOB management records corresponding to the frame arm 116 from the topology information 145 in the memory 144 of the frame center 120 and manage 614 the FRU 112 using the obtained management records. For example, the service processor 160 and/or frame manager 168 may utilize the obtained records to establish a connection with the OOB service processor 164 of the FRU 112 over the corresponding network line 129 electrically connected between the frame center 120 and the frame arm 116 and determine whether or not the FRU 112 meets or satisfies any particular OOB management requirements of the frame 100 (e.g., minimum processing requirements and/or storage capacity, any particular motherboard revision number, and/or the like, some or all of which may be policy driven).

As shown in FIG. 6, the managing 614 may include determining 616 one or more properties of the FRU 112 (e.g., communicating with the OOB service processor 164 of the FRU 112 to obtain the processing speed of the FRU 112, storage capacity, etc.), evaluating 620 the obtained management records in relation to the one or more properties of the FRU 112 (e.g., determining whether or not the FRU meets any specified minimum processing speed, storage capacity, etc.), and taking 624 action based on the evaluating 620.

For instance, upon determining that the FRU 112 has not met one or more minimum requirements, the service processor 160 and/or frame manger 168 may disallow the FRU 112 from joining the management service context of the frame 100 (e.g., and thus not allow the FRU's 112 main processor to even power up; or only allow the FRU 112 to proceed normally, that is, as if the FRU 112 was not part of the frame 100). Upon validating the FRU 112, however (e.g., determining that the FRU has met any necessary management requirements), the service processor 160 and/or frame manager 168 may instruct (e.g., via the OOB service processor 164) the main processor on the motherboard of the FRU 112 to power up so that the FRU 112 can proceed to operate as part of the management service context of the frame 100 (discussed more fully below).

In addition to FRU insertion alerts, the frame center 120 may also receive alerts or messages from frame arms 116 in relation to fault conditions, requests to remove FRUs 112, and/or the like, and take appropriate actions. For instance, upon the service processor 160 of the frame center 120 receiving an alert or other message indicative of a fault condition(s) from the OOB service processor 164 of a FRU 112 (e.g., over the respective network line 24 electrically connecting the frame center 120 to the frame arm 116 to which the FRU 112 is interfaced with), the frame manager 168 may take any appropriate remedial action such as attempting to rectify the fault, sending an alert to an administrator indicating the location in the frame 100 of the faulty FRU 112, offlining the FRU 112, and/or the like.

As another example, in the event that a user desires to disconnect a FRU 112 from its respective frame arm 116 (e.g., as part of a hot-swapping operation), the user may, as discussed previously, depress a particular button 182 on the frame arm 116 (see FIG. 4) to initiate the sending of a hot-swap request from the frame arm 116 to the service processor 160 of the frame center. Upon receiving the hot-swap request, the service processor 160 may proceed to determine whether hot-swapping of the corresponding FRU 112 is allowed. For instance, a table of hot-swapping policies (or other management policies) for the various frame arms 116 and/or corresponding FRUs 112 (e.g., according to frame arm ID such as location data) may be maintained in the topology information 155 in the memory 144 of the frame center 120. The service processor 160 may then proceed to allow or not allow the requested hot-swapping operation based upon whether or not hot-swapping of FRUs 112 installed in the particular frame arm 116 is or is not allowed. In one arrangement, one or more LEDs 180 of a particular color on the frame arm 116 (e.g., see FIG. 2) may be illuminated based on whether or not the requested hot-swapping operation is allowed. Numerous other examples of out of band management by the service processor 160 and/or frame manager 168 are envisioned and encompassed within the scope of the present disclosure.

In one arrangement, a framework of management record specifications stored within programmable read-only memory (PROM) images at the frame center 120 and each of the frame arms 116 may be provided and accessed by the service processor 160 and/or frame manager 168 to determine locations of frame arms 116 and corresponding FRUs 112, administer management policies corresponding to particular FRUs 112, and the like. As will be discussed, the disclosed management record specification may be implemented within a "manager" PROM image 148 stored in the memory 144 at the frame center 120 (and that may be accessed by the service processor 160 and/or frame manager 168 as part of managing installed FRUs 112) as well as within a plurality of "worker" PROM images 140 stored within the memories 136 of the plurality of frame arms 116 and the memory 144 of the frame center 120 and that may be accessed by the service processor 160 and/or frame manager 168 to perform OOB management and by installed FRUs 112 to determine frame roles, physical locations, and the like.

Generally, installing a FRU 112 into a frame arm 116 causes the OOB service processor 164 of the FRU 112 to access records (e.g., the location data 141 of FIG. 2) in a worker PROM image 140 of the frame arm 116 to initially determine whether the FRU 112 is installed in the frame 100 as opposed to another type of enclosure. Assuming the OOB service processor 164 is able to read the location records of the worker PROM image 140, it may then obtain information that both defines its location within the frame 100 as well as its role within the frame (e.g., whether the FRU is to function as merely a "worker" FRU, is to take some sort of managerial role within the frame 100, and/or the like). Additionally, the service processor 160 and/or frame manager 168 obtains information from the manager PROM image 148 (e.g., the topology information 145) to understand how to manage each of the various FRUs 112 (e.g., in relation to hot-swapping, propagating firmware updates, and the like) in addition to causing updates to the manager PROM image 148 to include records corresponding to newly installed FRUs 112. As product and configuration changes generally only require modification to the manager PROM image 148 as opposed to the plurality of worker PROM images 140, the disclosed management record specification can advantageously remain largely static across different frame configurations to reduce management overhead.

With reference back to FIG. 4, the memory 136 of each frame arm 116 may be in the form of a PROM storing the at least one corresponding worker PROM image 140 that contains the fixed location data 141 of the respective frame arm 116. Each worker PROM image 140 includes information records that may broadly be used by a FRU 112 to determine whether the FRU 112 is installed in the frame 100 (i.e., as opposed to another type of rack or cabinet), determine the FRU's 112 location within the frame 100 (e.g., via the fixed location data 141), determine a particular "role" that the FRU 112 is to assume within the frame 100, allow the FRU 112 to obtain one or more IP addresses for communicating with the service processor 160 and/or frame manager 168, and the like (discussed below). Further, the memory 144 of the frame center 120 may be in the form of a PROM storing the at least one manager PROM image 148 that includes the topology information 145 (i.e., the information necessary to define the frame 100; e.g., in relation to frame arm locations, configurations, power and cooling requirements, and the like) and which can be used by the service processor 160 and/or frame manager 168 to perform OOB management of FRUs 112, route incoming and outgoing communications between frame arms 116, and the like. The memory 144 of the frame center 120 also stores a corresponding worker PROM image 140 that can be used by the frame center 120 to determine its location within the frame 100, determine IP addresses of FRUs for routing management communications, and/or the like.

To further facilitate the reader's understanding of how the FRUs 112, frame arms 116, and the frame center 120 interact within the frame 100 to provide the aforementioned increased levels of availability and serviceability, additional reference will now be made to FIG. 7 which illustrates a method 200 for use with the frame 100 as well as FIGS. 8-9 which illustrate schematic diagrams of the worker and manager PROM images 140, 148 for use within the frame 100. The method 200 may include interfacing 204 a FRU 112 with a frame arm 116 of the frame 100. For instance, the interfacing 204 may entail inserting a first FRU 152 into a particular bay of the cabinet 104 so that the connector 132 of the first FRU 152 interfaces or otherwise interconnects with the connector 128 of a first frame arm 156 (see FIG. 1). The method 200 may then include attempting 208 (e.g., by the OOB service processor 164 of the first FRU 152) to read a location record (e.g., location data 141 in FIG. 4) of the worker PROM image 140 of the first frame arm 156.

Figures 8, 9:
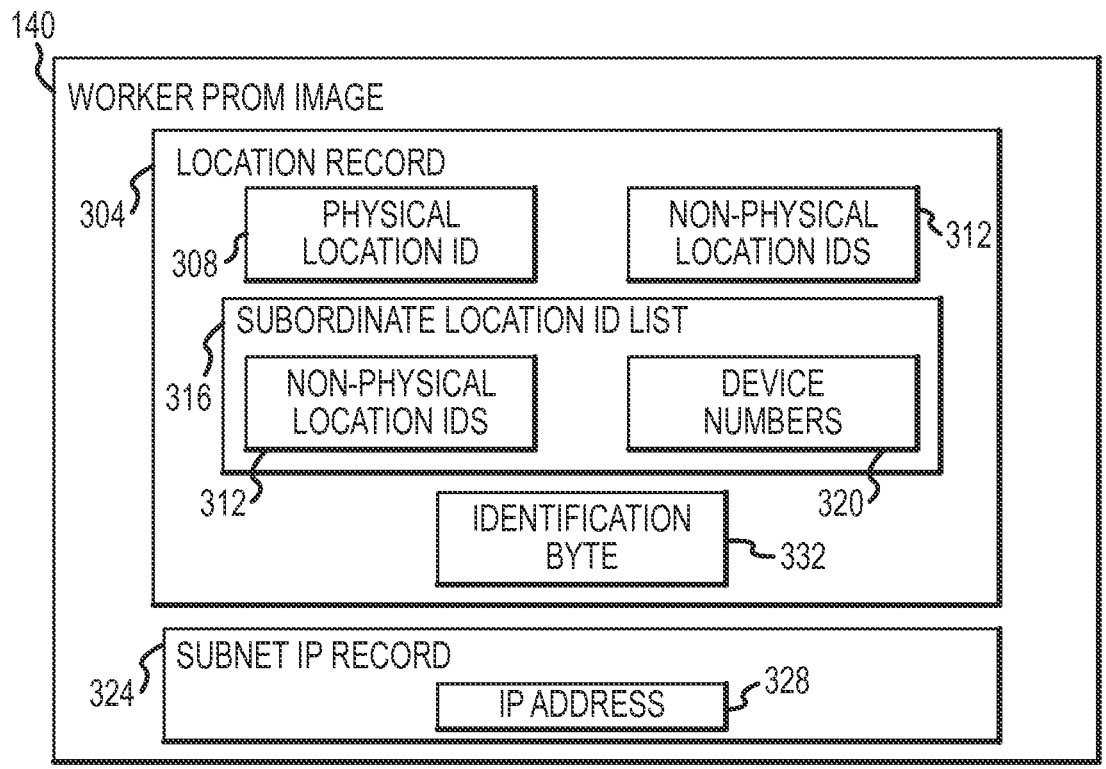
FIG. 8 is a schematic diagram of a worker PROM image of the frame of FIG. 1.
FIG. 9 is a schematic diagram of a manager PROM image of the frame of FIG. 1.

With brief reference to FIG. 8, the worker PROM 140 may include a location record 304 and a subnet IP record 324. The location record 304 may include one or more unique location IDs that serve to identify a geographic address or location of the frame arm 116 in which the worker PROM image 140 is stored, e.g., to identify a geographic address or location of a corresponding FRU 112. For instance, the location record 304 may include a "physical" location ID 308 that identifies a location within the frame 100 of a FRU 112 that is directly or physically interconnected to the connector 128 of a corresponding frame arm 116 (e.g., a FRU 112 connected to frame arm 116 #2 could have a corresponding physical location ID 308 of "2" while a FRU 112 connected to frame arm 116 #6 could have a corresponding physical location ID 308 of "6"). In one arrangement, the physical location ID 308 may provide a particular offset U (e.g., offset rack unit number) within the frame 100.

Figure 10:
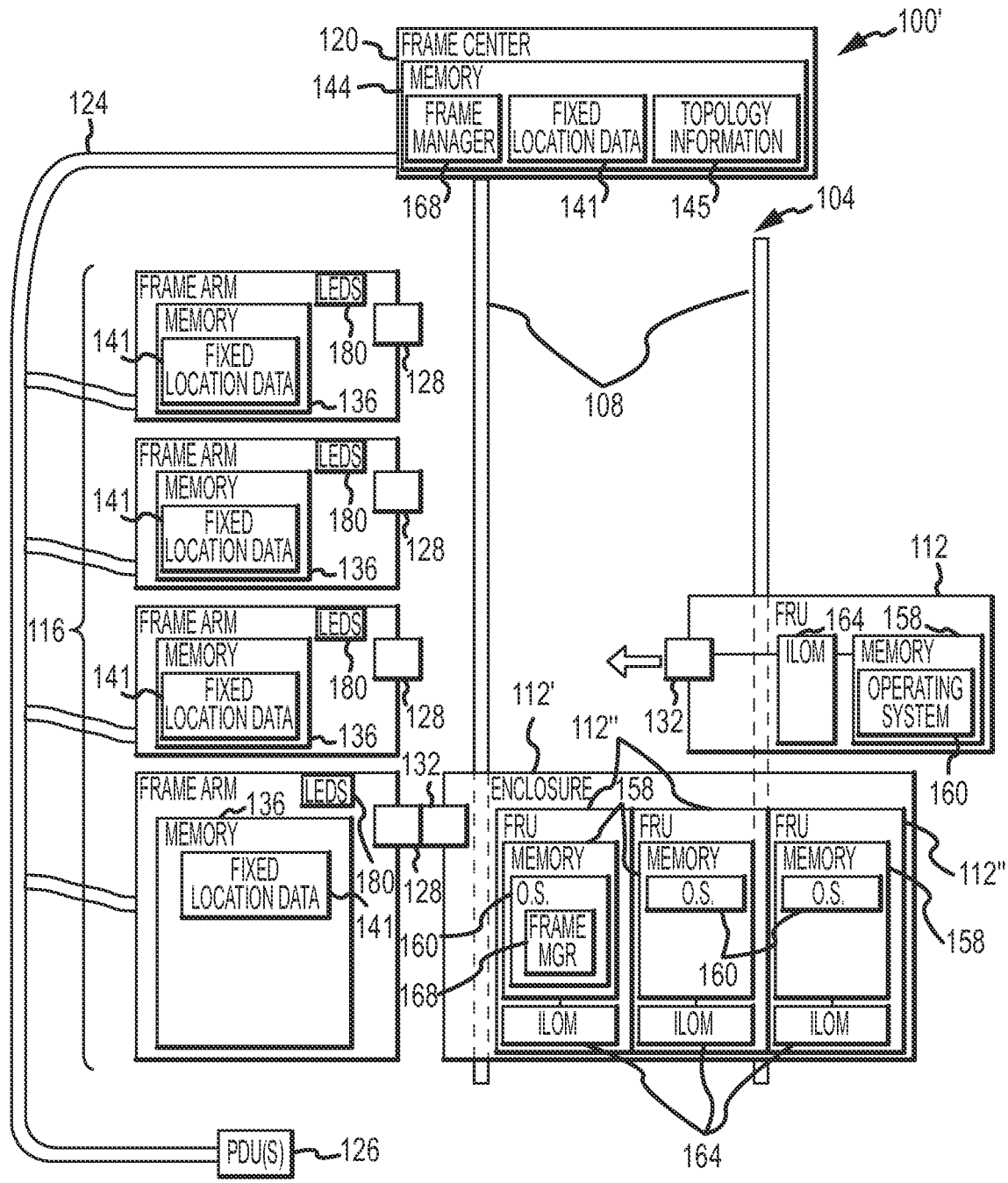
FIG. 10 illustrates another embodiment of the smart computing frame of FIG. 1.

The location record 304 may also include one or more "non-physical" location IDs 312, each of which identifies a location of at least one FRU 112 that is indirectly interconnected to a corresponding frame arm 116 via another FRU 112 that is directly interconnected to the frame arm 116. For instance, FIG. 10 illustrates another embodiment of the frame 100' in which the connector 132 of a FRU 112' that is in the form of a blade enclosure is interfaced with the connector 128 of a corresponding frame arm 116. The FRU 112' includes a plurality FRUs 112" in the form of blade servers appropriately mounted within the FRU 112'. In this case, the location record 304 of the corresponding worker PROM image 140 of the frame arm 116 may include a physical location ID 308 that identifies a location of the FRU 112' within the frame 100' as well as a plurality of non-physical IDs 312 that identify locations within the frame 100' of the plurality of FRUs 112". For instance, a chassis management module (CMM)(not shown) of an Oracle Sun Netra 6000 chassis (e.g., FRU 112') connected to a frame arm 116 #8 may be identified by a physical location ID 308 of "8" and the OOB service processor 164 of a blade server (e.g., FRU 112") disposed within a "slot #3" of the chassis may be identified by a non-physical location ID 312 of "131" (0x83).

When the location record 304 of a particular worker PROM image 140 includes one or more non-physical location IDs 312, the location record 304 may also include a subordinate location ID list 316 that maps or otherwise links the non-physical location IDs 312 (i.e., IDs that identify the FRUs 112" relative to the frame 100) to local device numbers 320 (i.e., IDs that identify the FRUs 112" relative to the FRU 112') and which may be used by the FRU 112' to configure the FRUs 112" in a manner free of having to wait for communication with the service processor 160 and/or frame manager 168. The location record 304 may also include an "identification" byte 332 that identifies a role of the FRU 112 within the frame (e.g., role as the frame manager 168, role as a worker FRU, and the like). For instance, the identification byte 332 of the worker PROM image 140 of the frame center 120 may be set to a "frame manager" role so that upon installation of the frame center 120 into the frame 100, the frame center 120 proceeds to function as the frame manager 168.

The subnet IP record 316 includes a base management subnet IP address 328 that broadly provides the OOB service processor 164 of each FRU 112 with the information it needs to communicate with the frame center 120, service processor 160 and/or frame manager 168, and/or other FRUs 112. More specifically, individual addresses (e.g., of other FRUs 112) may be derived by using the subnet IP address 328 as the network address and the physical or non-physical location ID 308, 312 as the host address.

Referring back to FIGS. 1 and 7, the attempting to read step 208 of the method 200 may include an OOB service processor 164 of the first FRU 152 attempting to read the physical and/or non-physical location IDs 308, 312 of the location record 304 of the worker PROM image 140. Thereafter, the method 200 may determine 212 whether the location record 304 can be read. Responsive to a negative determination at 212, the method 200 may proceed to 216 where the first FRU 152 may be operated in a "normal" mode (e.g., a mode of operation that is free of association with the management service context of the frame 100). Responsive to a positive determination at 212, the method 200 may proceed to 220 at which point the first FRU 152 may be operated in a "smart frame" mode (e.g., a mode of operation that is at least partially controlled or dictated by the management service context of the frame 100). Part of the result of a positive determination at 212 may be the frame manager 168 instructing the main processor(s) on the first FRU 152 to power up.

Figure 7:
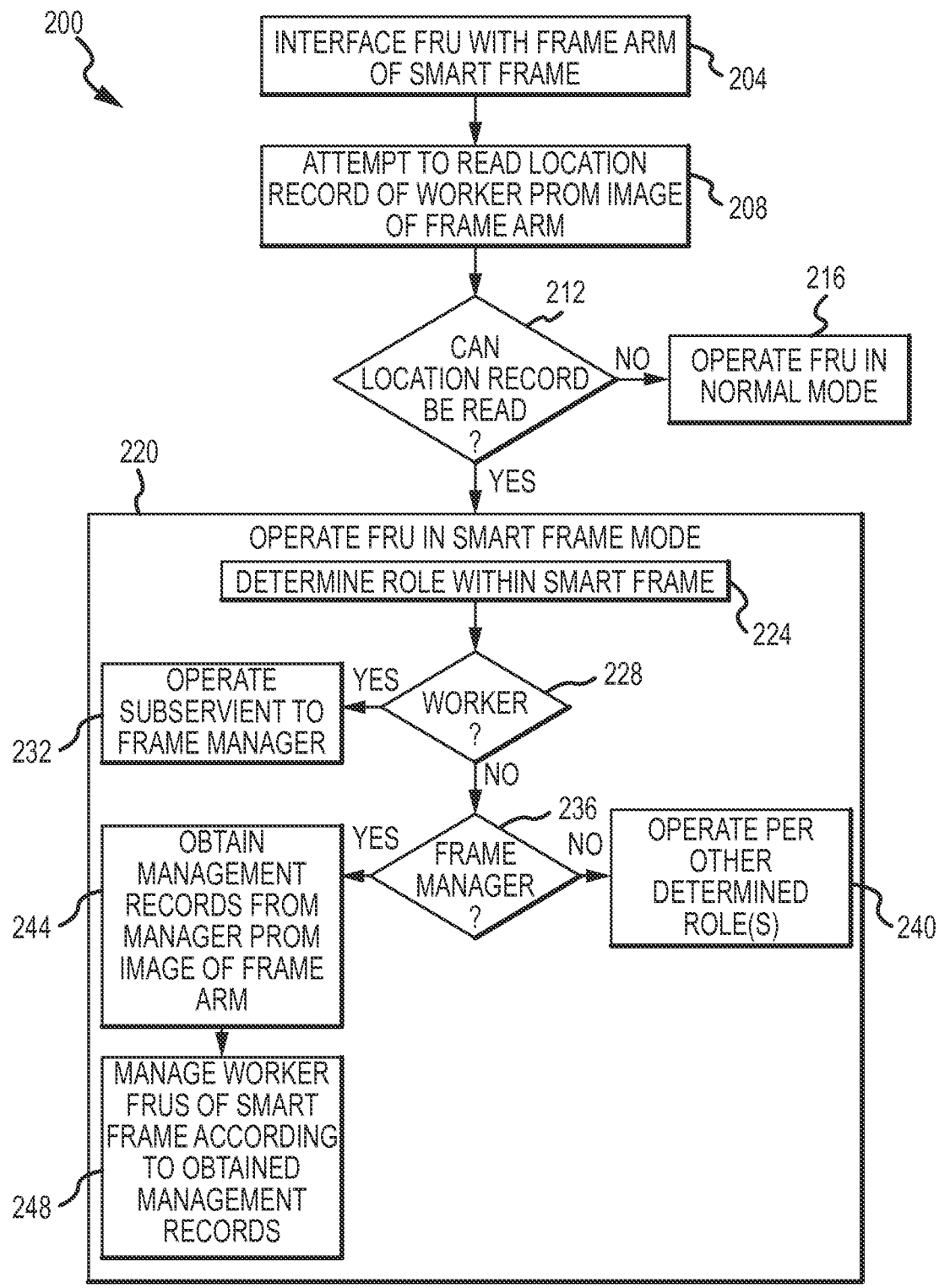
FIG. 7 is a flow diagram of a method for use of worker and manager PROM images stored in the frame of FIG. 1 to manage FRUs of a smart computing frame.

As shown in FIG. 7, the operation 220 of the first FRU 152 in smart frame mode may include determining 224 a role of the first FRU 152 within the frame 100, such as via the OOB service processor 164 reading and interpreting a bit mask of the identification byte 332 of the worker PROM image 140. For instance, responsive to a positive determination to a query 228 as to whether the role is a worker FRU, the method 200 may proceed to 232 where the first FRU 152 may be operated 232 in a manner that is generally subservient to the frame manager 168 (e.g., in a manner in which the first FRU 152 is managed by the frame manager 168). Responsive to a negative determination to the query 228, the method 200 may proceed to query 236 whether the determined role is a frame manager.

More specifically, while the frame manager 168 has generally been described and illustrated as being implemented by the frame center 120, this is not always necessarily the case. For instance, the bit mask of the identification the first FRUs 152 byte 332 of worker PROM image may indicate the role of the frame manager. Upon determining such a role, the method 200 may proceed to obtain 244 management records from a manager PROM image 148 of the first frame arm 156 and then manage 248 worker FRUs (and possible additional FRUs) of the frame 100 according to the obtained management records (e.g., via a frame manager 168 running on the first FRU 152 in conjunction with the service processor 160 of the frame center 120).

For instance, upon initial configuration of the frame 100 and/or at any other appropriate time, an administrator or other user may load or otherwise store the manager PROM image into the memory 136 of a selected frame arm 116 (in addition to setting the bit mask of the identification byte 332 of the worker PROM image 140 of the selected frame arm 116 to correspond to a frame manager role). In one arrangement, each FRU 112 may store a copy of the frame manager 168 in the memory 158 that it may run upon determining that it has a frame manager role. In another arrangement, a FRU 112 may, upon determining that it has a frame manager role, obtain a copy of the frame manager 168 from any appropriate location (e.g., another FRU 112, the frame center 120, higher level components, and the like) via communication channels 124 for storage in memory 158 and subsequent execution. FRUs may also operate 240 according to other various types of roles which are encompassed within the scope of the present disclosure.

In any case, the service processor 160 and/or frame manager 168 utilize the manager PROM image 148 information as part of managing the FRUs 112 of the frame 100. Turning now to FIG. 9, the manager PROM image 148 includes the location records 304 of all of the worker PROM images 140 associated with installed FRUs 112 and the frame center 120 as well as the subnet IP record 324. In this regard, the service processor 160 and/or frame manager 168 can derive individual addresses of each of the installed FRUs 112 and the frame center 120 using the location records 304 and subnet IP record 316 for use in communications between the same. The manager PROM image 148 may also include a configuration data record 340, power and cooling requirement records 348, frame arm address records 352, and/or the like.

The configuration data record 340 generally stores configuration information specific to FRUs 112 installed at particular frame arms 116 in the frame 100. As shown, the configuration data record 340 may store the configuration information by way of a plurality of "policy" bytes 344 that are tagged with specific location records 304 (e.g., with specific physical location IDs 308). For instance, the configuration data record 340 may include a "hot-swap" policy byte 344 having a particular bit mask for each of the location IDs 308 indicating whether hot-swapping of a FRU 112 associated with the location ID 308 is disabled, activated, deactivated, and the like. As another example, the configuration data record 340 may include a "firmware" policy byte 344 specifying whether a FRU's 112 firmware, upon joining the frame manager's 168 configuration, is to be checked to determine whether the firmware is of a particular version, must be automatically upgraded, does not need to be checked, and the like. Numerous other types of policy bytes 344 are envisioned such as a "memory size" byte 344 (e.g., specifying minimum required available memory in an installed FRU 112 of a particular frame arm 116 as identified by physical location ID 308), an "installed type" byte 344 (e.g., specifying one or more particular types of FRUs that can be installed at a particular frame arm 116 as identified by physical location ID 308), a "network connections" byte 344 (e.g., specifying one or more particular types of network connections that an installed FRU 112 needs to have), and the like.

The configuration data record 340 (as with the other records disclosed herein) may be arranged and organized in any appropriate manner. For instance, the configuration data record 340 may be arranged in a table or database format whereby physical and/or non-physical location IDs 308, 312 may populate a first row or first column, each of the various policy bytes 344 may populate the other of the first row or first column, and bit masks of the various policy bytes 344 may populate cells in the table for each of the location IDs. The service processor 160 and/or frame manager 168 may access the configuration data record 340 as part of managing FRUs 112 installed in the frame 100. In one arrangement, the makeup of the manager PROM image 148 may reflect FRUs 112 currently installed in the frame 100. More specifically, in the event that a frame arm 116 is free of a FRU 112 being directly interfaced therewith, the manager PROM image 148 may also be free of information (e.g., location records 308, policy bytes 344, and the like) specific to the worker PROM image 140 of the frame arm 116 and FRUs 112 to be installed at the frame arm 116. Also, in the event that a FRU 112 is installed in a particular frame arm 116 and joins the frame's management service context or network, the service processor 160 and/or frame manager 168 may facilitate the updating of the manager PROM image 148 to reflect information specific to the frame arm 116 and FRUs 112 installed at the frame arm 116. In another arrangement, the manager PROM image 148 may store information specific to a frame arm 116, policy bytes 344, and the like whether or not a FRU 112 is installed on the frame arm 116.

In relation to different frame configurations, the information stored in the manager PROM image 148 may change (e.g., to account for a new or different configuration) while the information in the worker PROM images 140 may remain largely static. For instance, imagine a first configuration in which half of the frame arms 116 of a frame 100 are populated with FRUs 112, where each of the populated frame arms 116 includes a respective worker PROM image 140. Further imagine a second configuration of the frame 100 in which one or more of the previously non-populated frame arms 116 of the frame 100 are now populated with one or more FRUs 112. Here, while the manager PROM image (e.g., stored in the frame center 120 and/or one of the FRUs 112) may be updated to account for the newly added FRUs 112, each of the worker PROM images 140 corresponding to installed FRUs 112 that are common between the first and second configurations may remain the same. However, it should be understood that when a particular FRU 112 installed in a frame arm 116 is replaced with a different FRU, the information of the worker PROM image 140 (and thus the manager PROM image 148) in the frame arm 116 may in some situations correspondingly change. For instance, in the event that a 2 U FRU 112 installed at one or two frame arms 116 is replaced with a 4 U FRU 112 installed at the same one or two frame arms 116, the location record 304 of the worker PROM image(s) 140 of the frame arm(s) 116 may be appropriately updated to reflect a different "rack location height" (e.g., due to the difference in height between a 2 U FRU and a 4 U FRU).

As an example of how the service processor 160 and/or frame manager 168 manage installed FRUs 112, imagine the first FRU 152 runs the frame manager 168 and that a second FRU 172 (see FIG. 1) is interfaced with a second frame arm 176 of the frame 100. Further assume that the OOB service processor 164 of the second FRU 172 can read the location record 304 of the worker PROM image 140 stored in the second frame arm 176 and determines (e.g., upon reading the identification byte 332) that it is a worker FRU. Upon determining by the frame manager 168 that a worker FRU (i.e., the second FRU 172) has been installed in the frame (e.g., by receiving an alert from the service processor 160 via a respective network line 24 that the service processor 160 has received an interrupt signal from the second FRU 172 via a respective I²C line 20 indicating insertion of the second FRU 172), the frame manager 168 may access the manager PROM image 148 of the first frame arm 156 and obtain management records tagged with the physical location ID 308 of the second frame arm 176 for use in managing the second FRU 172.

For instance, upon the frame manager 168 receiving a request from the OOB service processor 164 of the second FRU 172 to join its network (i.e., the frame's 100 network), the frame manager 168 may query the OOB service processor 164 of the second FRU 172 for various specifications or properties of the second FRU 172, such as current firmware version, available memory, network connections, motherboard revision, product type, PCI root and leaf node configuration, and/or the like. Upon receiving the specifications, the frame manager 168 may analyze or evaluate the received specifications in relation to the particular policy byte bit masks associated with the second frame arm 176 physical location ID 308 and take one or more actions based on a result of the evaluation. As an example, upon the frame manager 168 determining that the second FRU 172 needs to update its current firmware to a newer version, the frame manager 168 may disallow the joining of the second FRU 172 to the frame's network until the second FRU 172 updates its firmware. As another example, upon receiving a request from the OOB service processor 164 of the second FRU 172 to bring one or more applications online (e.g., available for use by other FRUs 112 and/or higher level components or processes), the frame manager 168 may query the OOB service processor 164 for the current network connections of the second FRU 172 (e.g., which switches the second FRU 172 is connected to), and allow or disallow the bringing of the application(s) online based on a result of the network connection query by the frame manager 168.

In one arrangement, a user may, upon desiring to hot-swap the second FRU 172, depress or manipulate a button or other feature (e.g., button 182 in FIG. 4) on the back of the second frame arm 176 to cause the transmission of a hot-swap request to the service processor 160 of the frame center 120 via a respective I²C line 20 of the fixed interconnect topology 124 electrically connecting the second frame arm 176 to the frame center 120. Upon receipt of the request, the service processor 160 may forward the request to (or otherwise alert) the frame manager 168 at the first FRU 152 via a respective network line 24 between the frame center 120 and the first frame arm 156 to perform a hot-swap operation of the second FRU 172. In response, the frame manager 168 accesses and evaluates the "hot-swapping" policy byte 344 in the configuration data record 340 of the manager PROM image 148 that is tagged with the physical location ID 308 associated with the second frame arm 176 to determine whether or not hot-swapping of the second FRU 172 is allowed, and then correspondingly allows or disallows hot-swapping based on a result of the evaluating. For instance, an LED 180 on the second frame arm 176 may assume respective first and second conditions (e.g., blinking or not blinking) responsive to the frame manager 168 determining that hot-swapping of the second FRU 172 is either allowed or not allowed.

As discussed previously, the frame center 120 is interconnected to each of the frame arms 116 by way of the fixed interconnect topology 124 and generally facilitates the routing of communications among installed FRUs 112. In this regard, the frame center 120 (e.g., the service processor 160) accesses the frame arm address record 352 of the manager PROM image 148 to determine how to route a particular communication to a particular frame arm 116 (and thus a FRU 112 installed at the particular frame arm 116). In one arrangement, the frame arm address record 352 may map physical hardware addresses and port numbers to physical location IDs 308. For instance, upon a FRU 112 seeking to bring one or more applications online, the OOB service processor 164 of the FRU 112 may generate a request that includes a destination physical or non-physical location ID 308, 312 associated with the frame manager's FRU 112 and pass the request to the frame center 120 (e.g. over the respective network line 24 electrically interconnecting the frame center 120 to the frame arm 116 with which the FRU 112 is interfaced). Upon receipt of the request at the frame center 120, the service processor 160 may utilize the destination physical or non-physical location ID 308, 312 to obtain corresponding physical hardware address(es) and port number(s) (e.g., a hardware path) and then route the request to such obtained physical hardware address(es) and port number(s) over the particular network line 24 electrically connecting the frame center 120 to the frame arm 116 associated with the obtained physical hardware address(es) and port number(s). In one arrangement, the service processor 160 propagates changes to the subnet IP record 316 to the frame arms 116 for updating of the respective worker PROM images 140.

Figure 11:
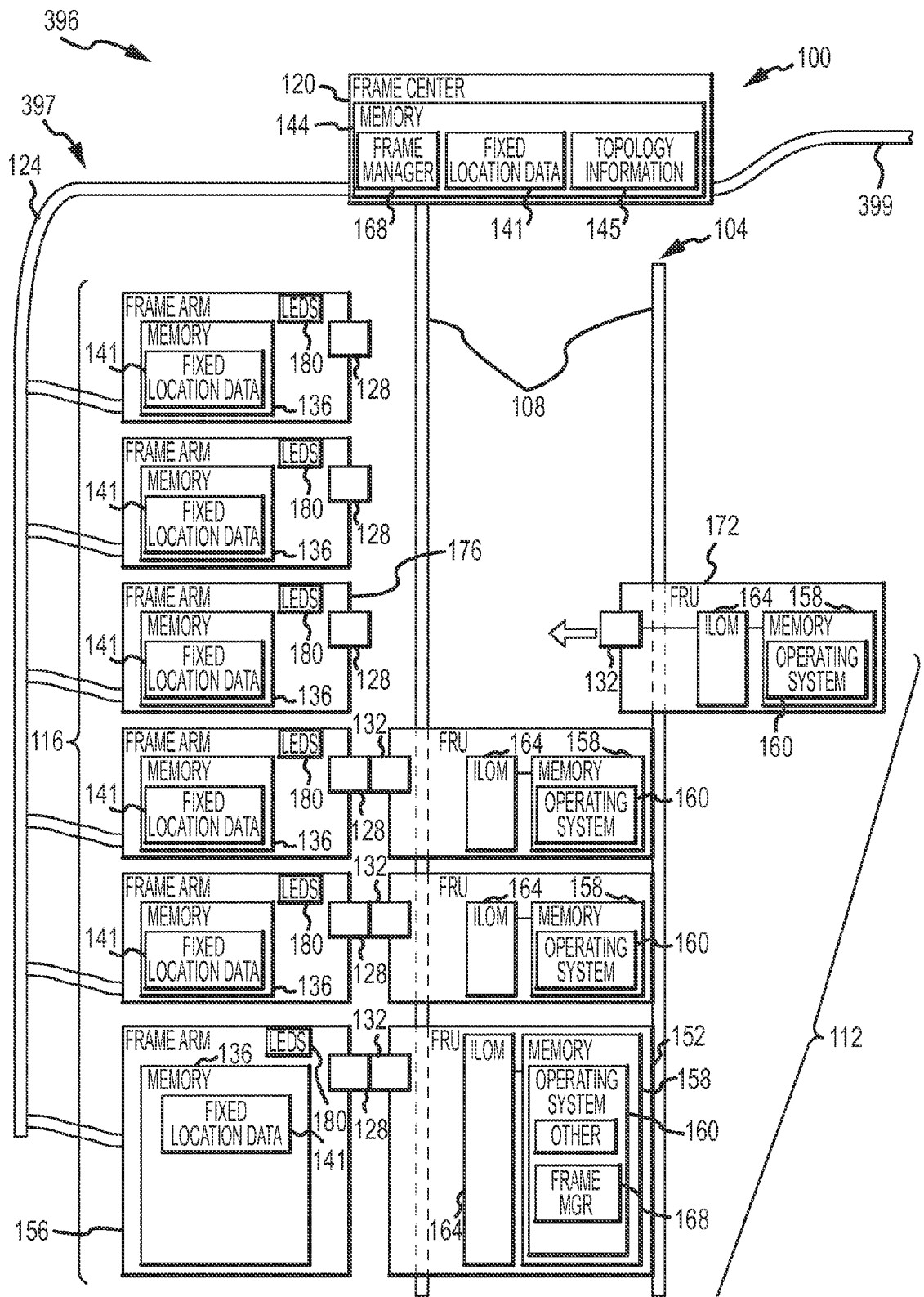
FIG. 11 illustrates another embodiment where at least two of the smart computing frames of FIG. 1 are interconnected to form a smart computing frame system.
Figure 11:
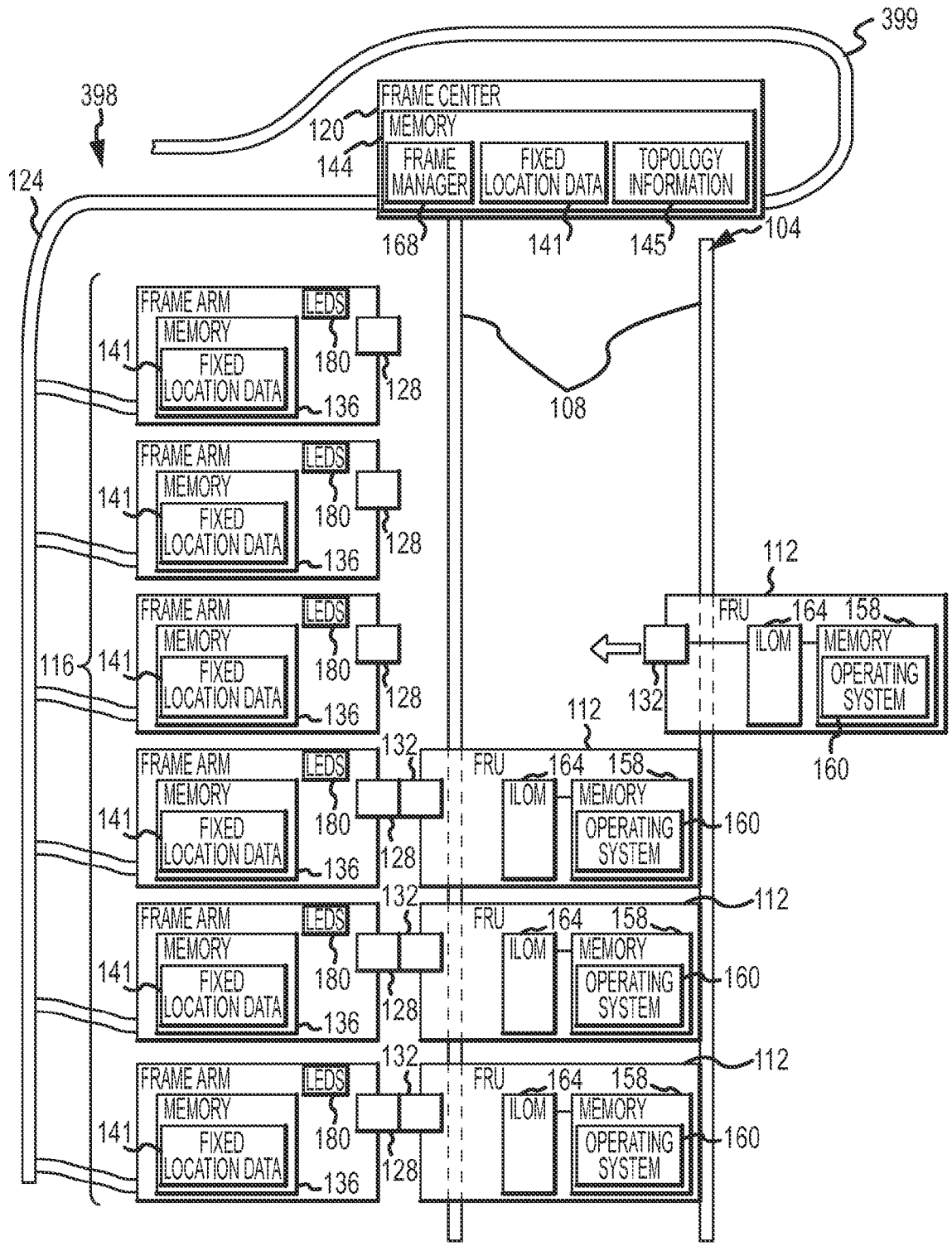

FIGS. 10-11 illustrate other embodiments of the frame 100. As discussed previously, FIG. 10 illustrates an embodiment in which the connector 132 of a FRU 112' in the form of a blade enclosure or chassis is interfaced with the connector 128 of a corresponding frame arm 116, and the FRU 112' includes a plurality FRUs 112" in the form of blade servers appropriately mounted within the FRU 112'. FIG. 11 illustrates a smart frame system 396 in which first and second 397, 398 frames (e.g., frames 100) respectively installed within first and second racks 104 may be interconnected by any appropriate communication channel(s) or interconnect 399 (e.g., cable, harness) for use in increasing processing and memory capacity and/or the like. In this arrangement, a single frame manager 168 implemented at the frame center 120 or a FRU 112 of either the first or second frame 397, 398 may manage all FRUs 112 installed on the first and second frames 397, 398. That is, one of the first and second frames 397, 398 may be free of a frame manager 168. For instance, communications between a frame manager 168 residing on the first frame 397 and a FRU 112 on the second frame 398 may be passed to the frame center 120 of the second frame 398 which proceeds to analyze the communication (in conjunction with the manager PROM image 148) to determine which FRU 112 the communication is to be routed to.

In one arrangement, the manager PROM image 148 may conform to IPMI Platform Management FRU Information Storage Definition version 1.0. Provided below is one example of a management record specification for use with the frame 100 disclosed herein with the understanding that the present disclosure is not limited to the specific format presented below. Rather, it is only provided as an example to present the reader with one manner in which the present disclosure can be implemented.

Primary Records

Location Record:

| Location ID | | | |
|---|---|---|---|
| Field | Type | Size | Value |
| Sub Record ID | Data | 1 | 0x02 |
| Record Data | | | |
| Field | Type | Size | |
| Location ID | Data | 2 | |
| Identification Byte | Data | 1 | |
| Rack Location Bottom | Data | 1 | |
| Rack Location Height | Data | 1 | |
| Frame manager Location ID 1 | Data | 1 | |
| Frame Manager Location ID 2 | Data | 1 | |
| Start of Subordinate Location ID List | Struct | Variable | |

There may exist four types of "Location IDs" in the location record:

| Location ID Range | Location ID Type |
|---|---|
| 0x00.00 | Null Location ID |
| 0x00.01 to 0x00.FD | Physical Location IDs |
| 0x01.00 to 0x0F.FF | Non Physical Location IDs |
| 0x00.FE | Virtual Fame Manager ID |

Each location ID may be two bytes in length and have the following bit definitions:

| Bits 12-16 | Bits 8-11 | Bits 4-7 | Bits 0-3 |
|---|---|---|---|
| Frame ID | Non-Physical | Location ID | |

The "Rack Location" fields may be populated for corresponding Physical Location IDs. The Frame ID may be utilized in multi rack configurations. The "Identification Byte" of the location record may be used to determine role information, and may be used by the frame center during the programming process. The Identification Byte may contain a bit mask with the following definitions:

| Identification Byte Bit Mask | |
| --- | --- |
| 0x00 | Empty (No Attachement) |
| 0x01 | Frame Manager Bit |
| 0x02 | Worker Bit |
| 0x04 | Blade Server Bit |
| 0x08 | Frame Center Bit |
| 0xF0 | Reserved Bits |

The Frame Manager Bit may not be mutually exclusive. For example, a worker FRU that has Frame Manager functionality in one logical domain (LDOM) and worker functionality in another LDOM may have an Identification Byte value of 0x03 whereas a worker FRU free of Frame Manager functionality may have a value of 0x02.

The Subordinate Location ID List may contain a series of device number-to-Location ID mappings. The list may terminate with a Location ID of zero. This information can be used by an entity FRU (e.g., enclosure or chassis) with subordinate attachment FRUs (e.g., blade servers) so that it can configure its attachments free of having to wait for Frame Manager communication. Software may ensure that these mappings are consistent with a corresponding FRU Configuration Data Record (shown below). If the Frame Manager Location ID is non-zero within the Location Record, then it holds a Location ID of a non-physical Frame Manager (e.g., one not connected directly to a Frame Arm such as a blade within a blade server). If there is no corresponding Frame Manger within this attachment, then the entry has a value of zero.

| Subordinate Location ID List | | |
| --- | --- | --- |
| Field | Type | Size |
| Non Physical Location ID | Data | 2 |
| Device Number | Data | 1 |

Subnet IP Record:

The base management Subnet IP address may be stored in the worker PROM image of each frame arm to provide each FRU's OOB service processor the information it needs to communicate with the Frame Manager. Individual management addresses may be derived by using the Base Management Subnet IP as the network address and the Location ID as the host address. Frame Center software may ensure that a change to this address is propagated to each Frame Arm location as well as the Frame Center Image.

| Base Management Subnet IP Record | | | |
| --- | --- | --- | --- |
| Field | Type | Size | Value |
| Sub Record ID | Data | 1 | 0x03 |
| Record Data | | | |
| Field | Type | Size | |
| Base Subnet IP | Data | 4 | |
| Net Mask | Data | 4 | |

Configuration Data Record:

The Configuration Data Record may hold most of the information specific to each Location ID. The Frame Manager may access this data and compare it to the installed FRU. FRU components that are intended to be checked may implement a policy byte that the Frame Manager evaluates to determine what action to take if the component fails to meet a minimum requirement (e.g., not enough memory installed).

| FRU Configuration Data Record | | | |
| --- | --- | --- | --- |
| Field | Type | Size | Value |
| Sub Record ID | Data | 1 | 0x04 |
| Record Data | | | |
| Field | Type | Size | |
| Location ID | Data | 2 | |
| Parent Location ID | Data | 2 | |
| Device Number | Data | 1 | |
| Number of I/O port records | Data | 1 | |
| Hot Swap Policy | Data | 1 | |

Frame Arm Address Record:

The Frame Arm Address Record maps physical hardware addresses and port numbers to Frame Arm Identifier (e.g., Location IDs). It may be referenced by the Frame Center. This record may include a list of structures that terminating with a Frame Arm identifier of zero.

| Frame Arm Hardware Address Map | | | |
| --- | --- | --- | --- |
| Field | Type | Size | Value |
| Sub Record ID | Data | 1 | 0x07 |
| Record Data | | | |
| Field | Type | Size | |
| Frame ID | Data | 1 | |
| Start of Address Map List | Structure | Variable | |

The Address Map List may include a series of Location IDs to hardware address map associations. The list may terminate with a Location ID of zero.

| Address Map List Structure | | |
| --- | --- | --- |
| Field | Type | Size |
| Frame Arm ID (Physical Location ID) | Data | 2 |
| I2C Expander Address | Data | 1 |
| I2C Expander Port Number | Data | 1 |

Optional Records

FRU I/O Port Definition Record:

The FRU I/O Port Definition Record describes each I/O port for a given Location Record. These descriptions may be used in Point to Point Connection Records (discussed below) and may span multiple records to account for FRUs with many ports. The FRU I/O Port Definition Record will have the following specifics:

| FRU I/O Port Definition Record | | | |
| --- | --- | --- | --- |
| Field | Type | Size | Value |
| Sub Record ID | Data | 1 | 0x05 |
| Record Data | | | |
| Field | Type | Size | |
| Location ID | Data | 2 | |
| I/O Port Record Number | Data | 1 | |
| Start of I/O Port List | Structure | Variable | |

The I/O Port List may contain a series of port ID to port type associations. Port IDs may be unique to a given Location ID. The port list for the specific record number may terminate with a port ID of zero.

| I/O Port List | | |
|---|---|---|
| Field | Type | Size |
| Port ID | Data | 2 |
| I/O Port Type | Data | 1 |
| I/O Port Number | Data | 2 |

Point to Point Connection Record:

The Point to Point Connection Record defines all I/O port interconnects within a frame. Each connection entry may contain a policy byte that the Frame Manager may use to determine whether a connection should be verified and what action to take if the connection verification fails.

| Point to Point Connection Record | | | |
|---|---|---|---|
| Field | Type | Size | Value |
| Sub Record ID | Data | 1 | 0x06 |

| Record Data | | |
|---|---|---|
| Field | Type | Size |
| Connection Record Number | Data | 1 |
| Start of Connection List | Data Structure | Variable |

Dynamic Management Data

Dynamic Management Data may be used by the management framework, and may be considered dynamic in that it may change more frequently than the configuration. The Dynamic Management Data may be held in Frame Manager configuration files rather than PROM images.

| Dynamic FRU Configuration Data | | |
|---|---|---|
| Field | Type | Size |
| Location ID | Data | 1 |
| Type Identifier | Data | 1 |
| Type Policy | Data | 1 |
| Product Description String Offset | String | variable |
| Memory Requirement (in MB) | Data | 4 |
| Memory Check Policy | Data | 1 |
| Firmware Requirement List Offset | String List | 1 |
| Firmware Component | String | variable |
| Policy Byte | Data | 1 |

Policy Byte Definitions

| Bit Mask | Installed Type | Memory Size | Firmware | PtoP Connection | Hot Swap |
|---|---|---|---|---|---|
| 0x00 | No Check | No Check | No Check | No Check | Disabled |
| 0x01 | Type | Minimum | Minimum | Check | Activation |
| 0x02 | Architecture | Reserved | Reserved | Reserved | Deactivation |
| 0x04 | Model | Reserved | Reserved | Reserved | Reserved |
| 0x08 | Reserved | Exact | Exact | Reserved | Reserved |
| 0x10 | Warn | Warn | Warn | Warn | Warn |
| 0x20 | Disable App | Disable App | Disable App | Disable App | Reserved |
| 0x40 | Reserved | Reserved | Auto Upgrade | Reserved | Reserved |
| 0x80 | No Activation | No Activation | No Activation | No Activation | Reserved |

-continued

The Connection List may contain a series of connection records with point to point associations. For a given record, the Connection List may terminate with a Connection ID of 0. Software may ensure that all Point to Point connection records are evaluated.

| Connection List Structure | | |
|---|---|---|
| Field | Type | Size |
| Connection ID | Data | 2 |
| Location ID A | Data | 2 |
| Port ID A | Data | 2 |
| Location ID B | Data | 2 |
| Port ID B | Data | 2 |
| Policy Byte | Data | 1 |

Type Identifier and Port Type List

| Value | FRU Type |
|---|---|
| 0x00 | NULL Type |
| 0x10 | RMS |
| 0x11 | RMS: SPARC |
| 0x12 | RMS: x86 |
| 0x20 | Switch |
| 0x21 | Switch: Fast Ethernet |
| 0x22 | Switch: Gigabit Ethernet |
| 0x23 | Switch: 10 Gigabit Ethernet |
| 0x24 | Switch: 40 Gigabit Ethernet |
| 0x28 | Switch: Infiniband |
| 0x30 | Storage |
| 0x31 | Storage: SCSI |
| 0x32 | Storage: SAS |
| 0x40 | Blade Server |
| 0x41 | Blade: SPARC |
| 0x42 | Blade: X86 |
| 0x62 | USB |
| 0xC0 | PDU |

Figure 12:
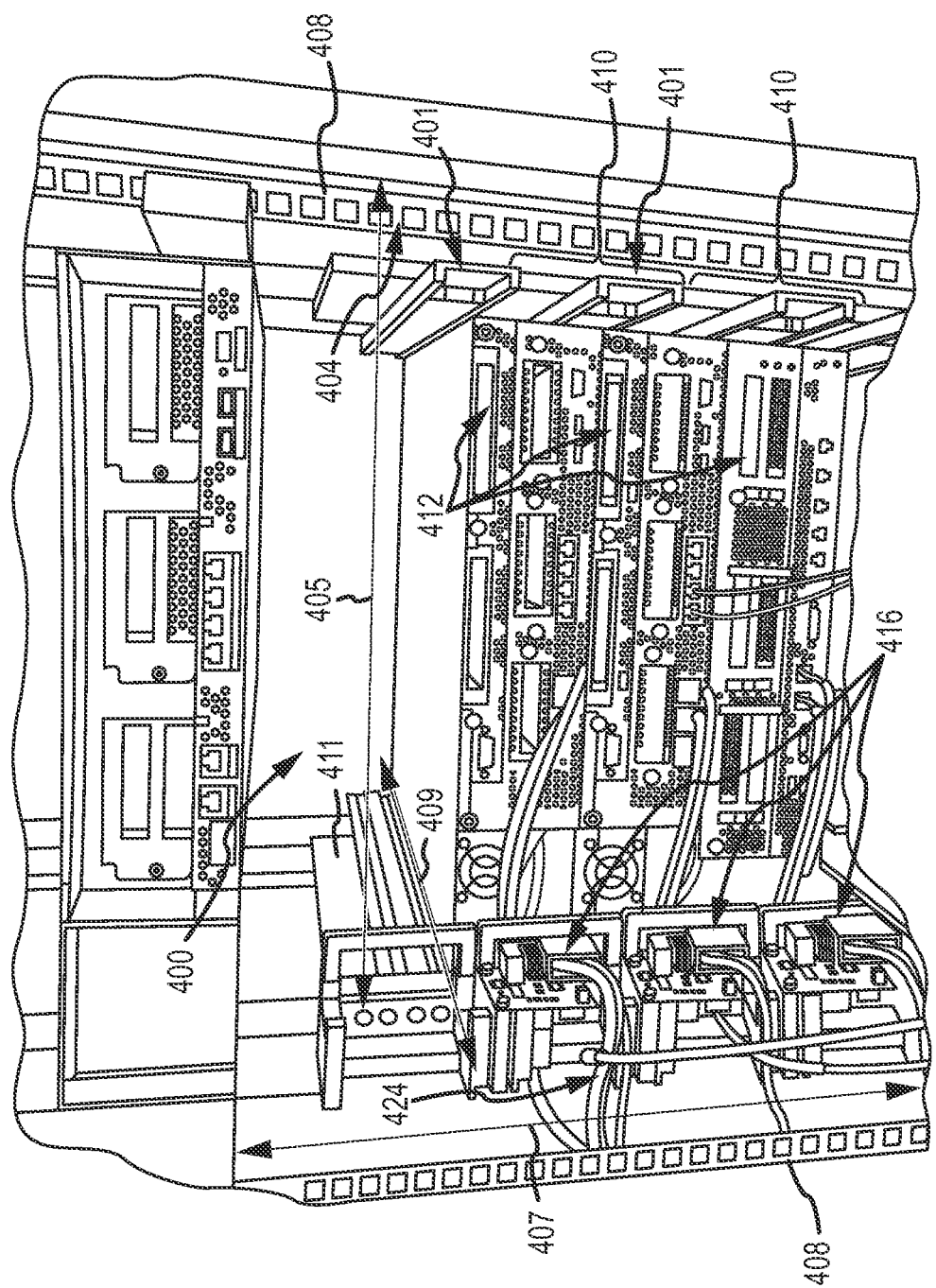
FIG. 12 is a rear perspective view of one example of the smart computing frame of FIG. 1.

Turning now to FIG. 12, a rear portion of one representative example of a smart computing frame 400 (e.g., frame 100 of FIG. 1) is illustrated that may be used to efficiently manage a wide variety of FRUs such as rack-mount servers, backup power modules, and/or the like of one or more form factors such as 1 U, 2 U, and/or the like. As shown, the frame 400 may be installed or otherwise disposed within a rack or cabinet 404 including width, height and depth dimensions 405, 407, 409 and may be generally made up a plurality of vertical support members or rails 408 that are interconnected by a plurality of horizontal support members 411 to form a framework. The rack 404 may include a plurality of pairs of rail assemblies 401 disposed along the height dimension 407 (or other dimension) of the rack 404, where each rail assembly 401 extends along the depth dimension 409 of the rack between opposing vertical members 408. Each pair of rail assemblies 401 may define one of a plurality of receiving bays 410 for receiving one of a plurality of FRUs 412.

Figure 13:
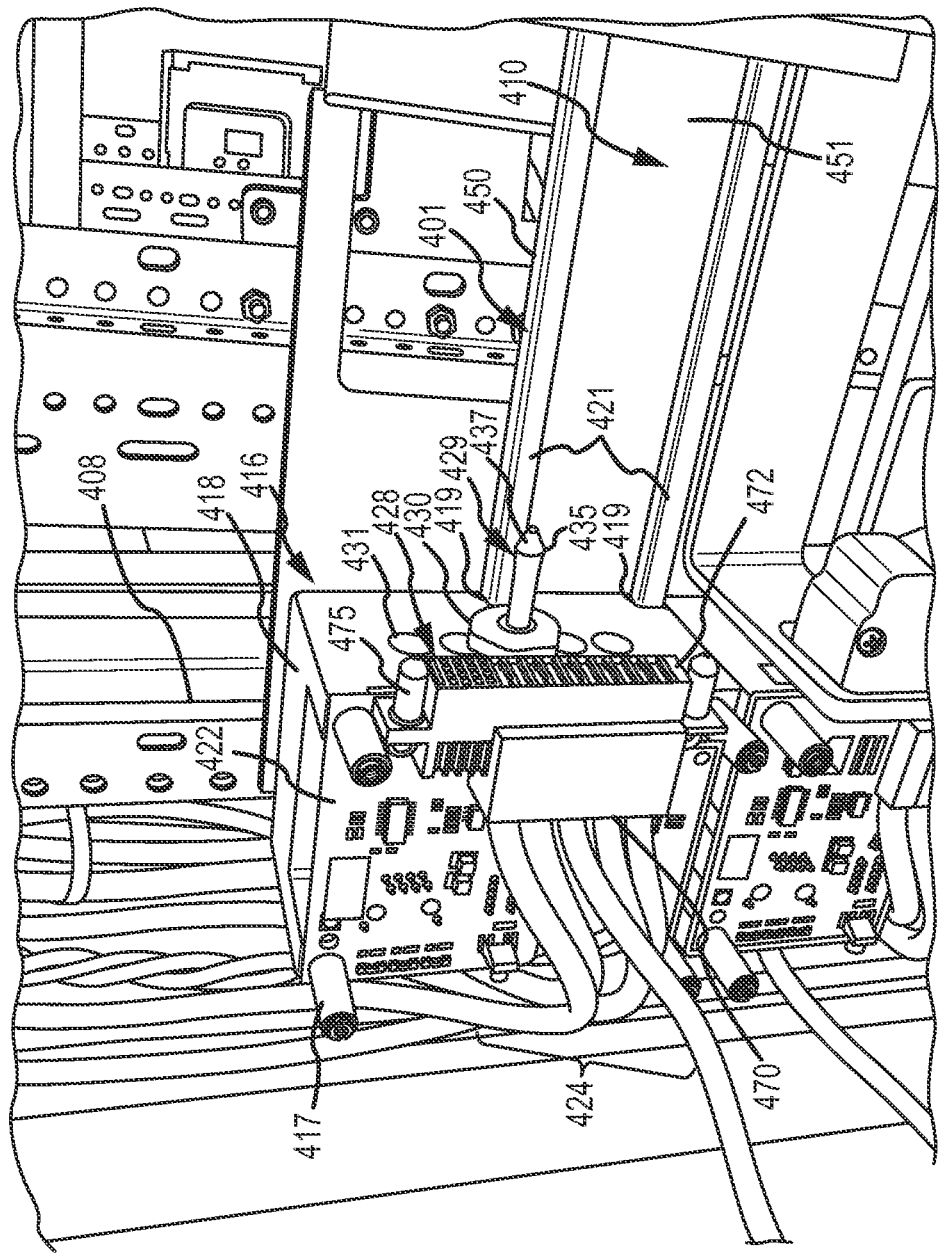
FIG. 13 is a perspective view of a frame arm of the frame of FIG. 12.

Adjacent a rear portion of each of the receiving bays 410, the frame 400 may include a respective frame arm 416 (e.g., frame arm 116) that facilitates electrical interconnection of a respective FRU 412 to a frame center (not shown, e.g., frame center 120) and one or more PDUs (not shown, e.g., PDUs 508, 512) through a fixed interconnect topology 424 (e.g., fixed interconnect topology 124). Turning now to FIG. 13, a close-up perspective view of one of the frame arms 416 is presented, where the frame arm 416 may be secured to an outer rail member 450 of one of the pair of rail assemblies 401 of a receiving bay 410 adjacent a rear portion of the receiving bay 410 in any appropriate manner. In this regard, a FRU 412 (not shown in FIG. 13) being installed into the receiving bay 410 via the outer rail member 450 may be automatically aligned with the frame arm 416 so that continued insertion of the FRU 412 may eventually result in interfacing and electrically connection between the FRU 412 and the frame arm 416 as will be discussed below.

The frame arm 416 generally includes a housing 418 (e.g., housing 118) non-movably securable in any appropriate manner relative to the outer rail member 450 of one of the pair of rail assemblies 401 of the particular receiving bay 410. In one arrangement, the housing 418 may include a pair of grooves 419 adjacent a side portion thereof that are configured to receive a corresponding pair of flanges 421 of the outer rail member 450. In this regard, the housing 418 can be slid along the outer rail member 450 to a desired location (e.g., adjacent a rear portion of the receiving bay 410) and then non-movably secured to the outer rail member 450 in any appropriate manner (e.g., via tightening a bolt (not shown) extending through the housing 418 against the outer rail member 450). Other manners of securing the housing 418 to the rack 404 adjacent a rear portion of the receiving bay 410 are also envisioned and encompassed within the scope of the present disclosure.

The frame arm 416 may also include a PCB 422 (e.g., PCB 122) secured to a portion (e.g., side) of the housing 418 (e.g., via passing fasteners 417 through apertures (not shown) in the PCB 422 and into apertures (not shown) in the housing 418) having a memory storing location data of the frame arm 416 within the frame 400, serial to I²C conversion logic, LEDs, and the like (not labeled, but similar to the PCB 122 in FIG. 4). Furthermore, a connector 428 (e.g., connector 128, such as a blind-mate connector) is electrically connected and secured in any appropriate manner to the PCB 422 to facilitate electrical connection between a respective FRU 412, the frame center, and one or more PDUs via the fixed interconnect topology 424. More specifically, at least one I²C cable or line (e.g., I²C line 20, not shown in FIG. 13) may be electrically connected between the frame center and the PCB 422 (e.g. to an I²C data bus via a bottom portion of the PCB 422 facing the outer rail member 450, not visible in FIG. 13), at least one network cable or line (e.g., network line 24, not labeled in FIG. 13) may be electrically connected between the frame center and pins/contacts (not shown) adjacent a rear portion 470 of the connector 428 (and thus may "pass-through" the PCB 422), and at least one power line or cable (e.g., power lines 28, 32) may be electrically connected between one or more PDUs (e.g., PDUs 508, 512) and pins/contacts adjacent the rear portion 470 of the connector 428.

To facilitate precise alignment between the connector 428 of the frame arm 416 and the corresponding connector 432 of a FRU 412 (not shown in FIG. 13, but discussed below in relation to FIGS. 14-19), the frame arm 416 may include at least one mechanical connector or alignment component in the form of an alignment pin 429 that is configured to be received in a corresponding mechanical connector or alignment component in the form of a alignment barrel 740 of an adapter 700 (e.g., "frame backplane adapter") of the FRU 416 (discussed below). The alignment pin 429 may be secured to a portion of the housing 418 so as to face the same direction as does the connector 428 (i.e., towards an oncoming FRU 416 being inserted into the receiving bay 410) but be at least slightly spaced from the connector 428. For instance, the alignment pin 429 may include a lock or stop nut 430 in addition to a threaded end (not shown) that may be inserted through at least one aperture 431 in a wall of the housing 418. A threaded nut (not shown) may be threaded over the threaded end of the alignment pin 429 on an opposing side of the wall of the housing 418 so that the nut 430 abuts or contacts the housing wall to rigidly secure the alignment pin 429 to the frame arm 416. In one embodiment, the threaded nut may be removed from the threaded end and the threaded end may be inserted into a different one of the apertures 431 in the wall of the housing 418 to effect a desired height of the alignment pin 429.

As shown, the alignment pin 429 may include a tip portion 437 (e.g., which may be tapered) to facilitate initial location of the alignment pin 429 in the alignment barrel 740 of the adapter 700 of the FRU 412. The alignment pin 429 may also include an enlarged head portion 435 that is adapted to interact with a peripheral edge of the alignment barrel 740 to at least partially lock or secure the alignment pin 429 against movement relative to the alignment barrel 740 upon interfacing of the connectors 428, 432 of the frame arm 416 and the FRU 412. Any appropriate cover, shield or the like (not shown) may be secured to the housing 418 over the PCB 422 (e.g., via fasteners 417) to protect the various components of the PCB 422 from damage. In one arrangement, one or more support arms or brackets (not shown) may rigidly interconnect the housing 418 of the frame arm 416 to an opposing outer rail member 450 of an opposing rail assembly 401 of the same receiving bay 410 to further support the frame arm 416 and provide for a more robust frame 400 and/or rack 404.

Figure 14:
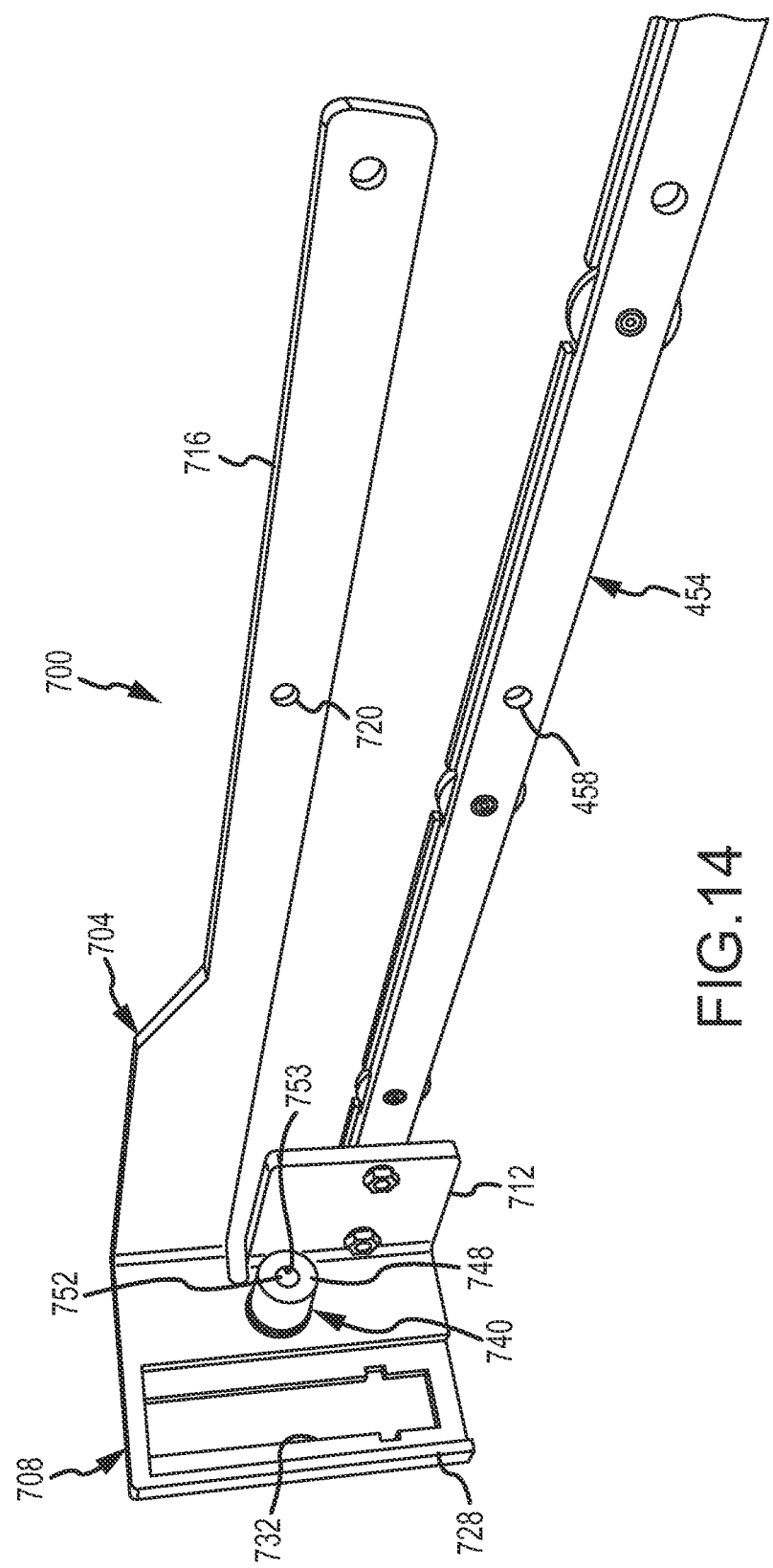
FIG. 14 is a perspective view of an adapter that may be used to interface a FRU with a frame arm of the frame of FIG. 12.
Figure 15:
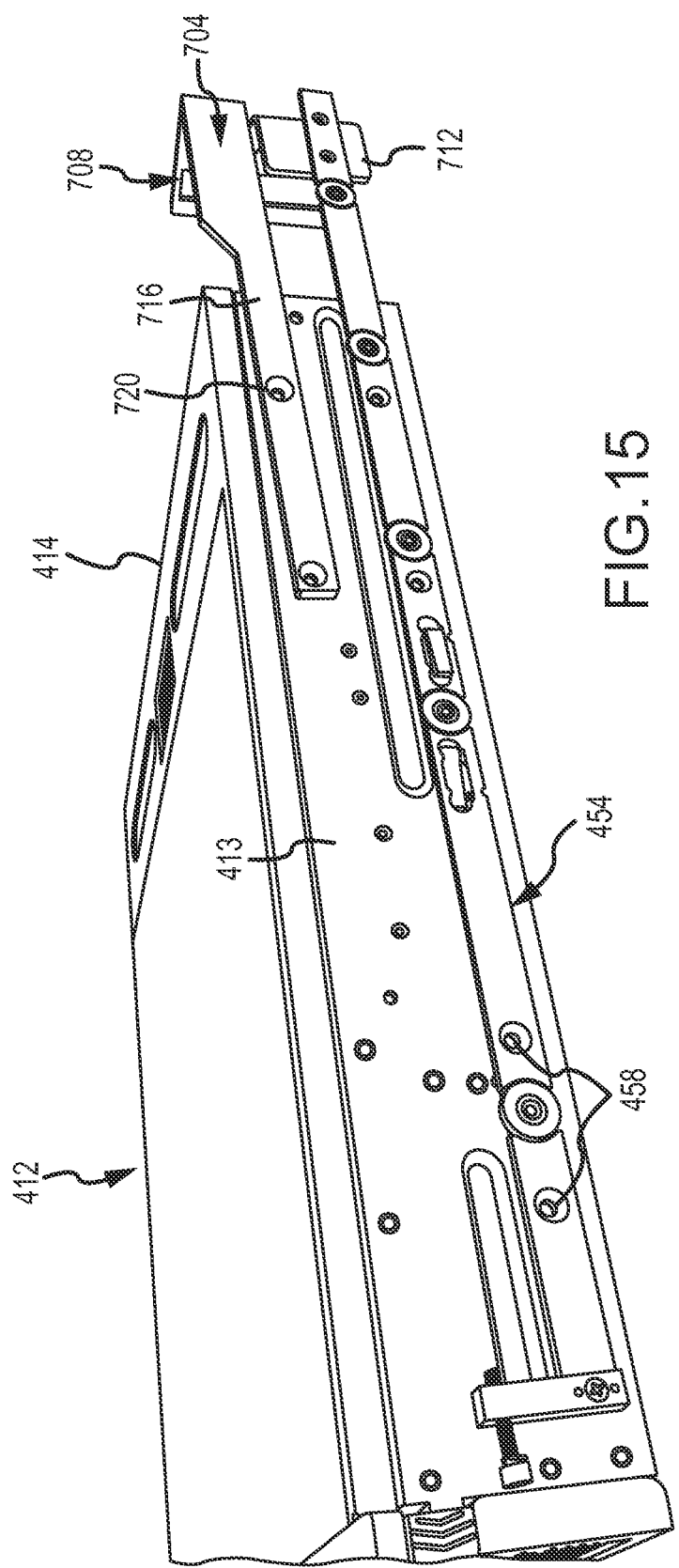
FIG. 15 is a perspective view of the adapter of FIG. 14 secured onto a side of a FRU.

With reference now to FIGS. 14-15, presented are perspective views of an adapter 700 (e.g., a connector arrangement) that is configured to allow a FRU 412 to be inserted into a receiving bay of a computing rack and substantially seamlessly electronically discovered by management services software of the computing rack by way of blind mate interfacing between the adapter 700 and the receiving bay (e.g., a frame arm 416 of receiving bay 410) of the computing rack. For instance, the adapter 700 may at least partially represent the arrangement 134 of brackets, linkages, and/or the like discussed in relation to FIG. 4 that is adapted to non-movably secure the connector 132 to the FRU 112 so that the connector 132 can electrically interface with the connector 128 of the frame arm 116 during insertion of the FRU 112 into a receiving bay of the computing rack 104. The adapter 700 may be added to an existing, standard, rack-mount FRUs to quickly adapt the FRU for use in blind-mate installations (such as in the frame 400 of FIG. 12) or may be built into a FRU as part of initial construction of the FRU to allow the FRU to be used in such blind-mate installations.

Broadly, the adapter 700 includes a mounting portion 704 (e.g., one or more brackets) that is configured to be non-movably secured to a FRU 412 and an attachment portion 708 (e.g., one or more brackets) extending from the mounting portion 704 that is configured to receive a connector 432 (e.g., blind mate connector 132 of FIG. 4) to allow the connector to electrically interface with a corresponding connector 428 (e.g., connector 128) adjacent a rear of a receiving bay 410 of a computing rack as the FRU 412 is being inserted into the receiving bay 410. In one arrangement, the mounting portion 704 may include a first mounting member 712 (e.g., plate, flange, etc.) that is configured to be non-movably secured relative to the FRU 412. For instance, the first mounting member 712 may be rigidly secured (e.g., via fasteners, nuts, and aligned holes, not labeled) to an inside portion of an inner rail member 454 of the same rail assembly 401 to which one of the frame arms 416 of the frame 400 is secured (e.g., where the frame arm 416 is secured to the outer rail member 450 of the rail assembly 401 and the first mounting member 712 is secured to the inner rail member 454 of the same rail assembly 401).

In this regard, rigid mounting of the inner rail member 454 to a side portion 413 of the FRU 412 (e.g., via threading fasteners (not shown) through attachment components such as apertures 458 in the inner rail member 454 and corresponding apertures (not shown) in the side portion 413 of the FRU 412) serves to non-movably or rigidly secure the adapter 700 to the FRU 412. In another arrangement, the mounting portion 704 may additionally or alternatively include a second mounting member 716 (e.g., plate, flange, etc.) that is spaced from the inner rail member 454 and that is configured to be non-movably secured to the side portion 413 of the FRU 412 (e.g., via threading fasteners (not shown) through apertures 720 in the second mounting member 716 and corresponding apertures (not shown) in the side portion 413 of the FRU 412).

With reference now to FIGS. 14-18, the attachment portion 708 may include an attachment member 728 (e.g., plate, bracket, flange, etc.) extending from the mounting portion 704 and having a receiving aperture 732 (labeled in FIGS. 14 and 17) extending therethrough that is sized and configured to fixably receive the connector 432 therein so as to face a front portion 438 of the connector 432 towards a front portion 472 of the connector 428 of a corresponding frame arm 416 during insertion of the FRU 412 into the receiving bay 410. For instance, the connector 432 may include one or more flexible tangs, clips or the like (not shown) that are adapted to snap past an inner wall of the receiving aperture 732 and thereby lock or non-movably fix the connector 432 to the attachment portion 708 and thus to the FRU 412 (i.e., when the mounting portion 704 is non-movably fixed to or at least relative to the FRU 412). However, other manners of securing the connector 432 to the attachment portion 708 are also envisioned and encompassed herein.

Figure 16:
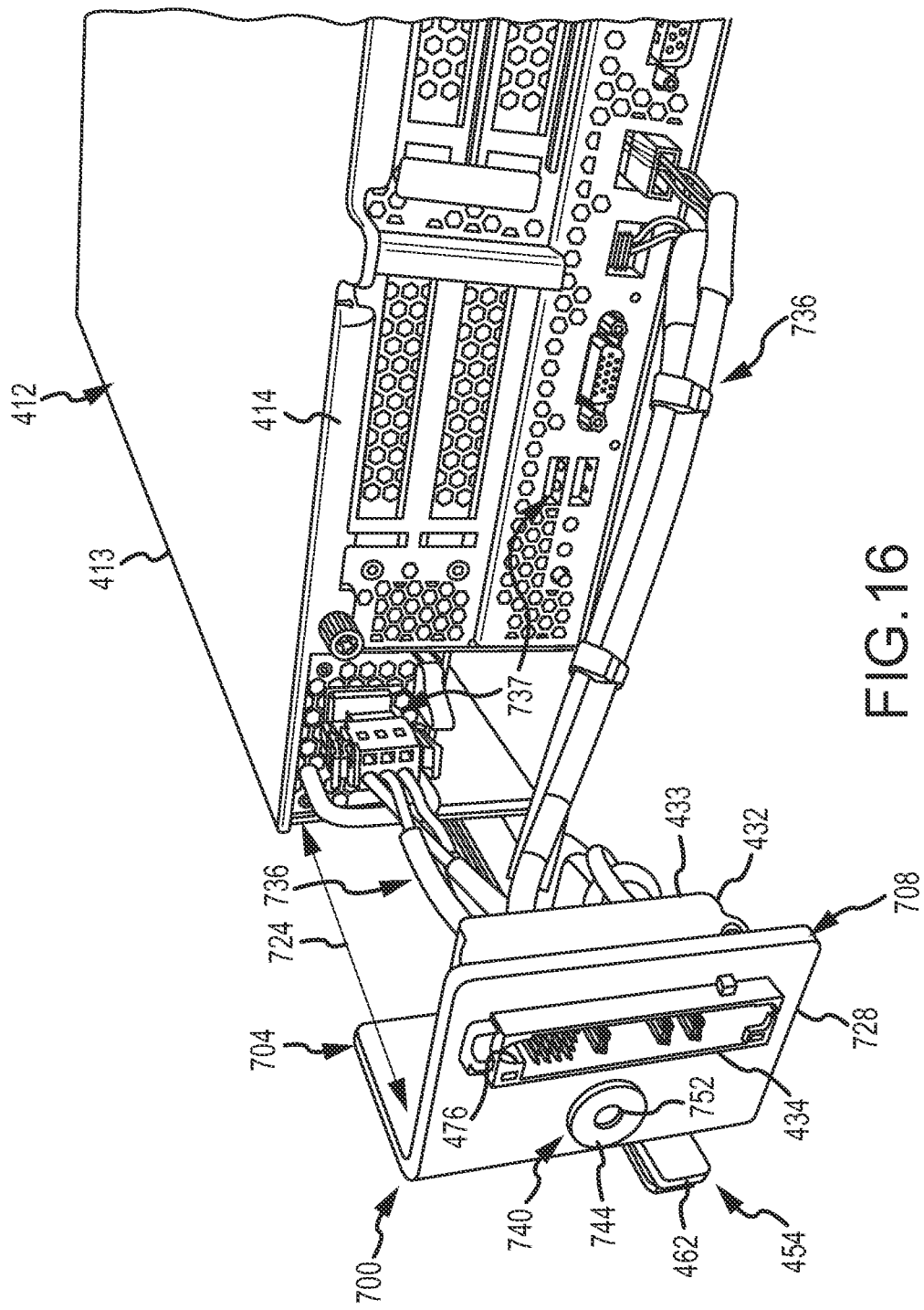
FIG. 16 is another perspective view illustrating how the adapter of FIG. 14 facilitates electrical connections between various ports of the FRU and a blind mate connector.
Figure 17:
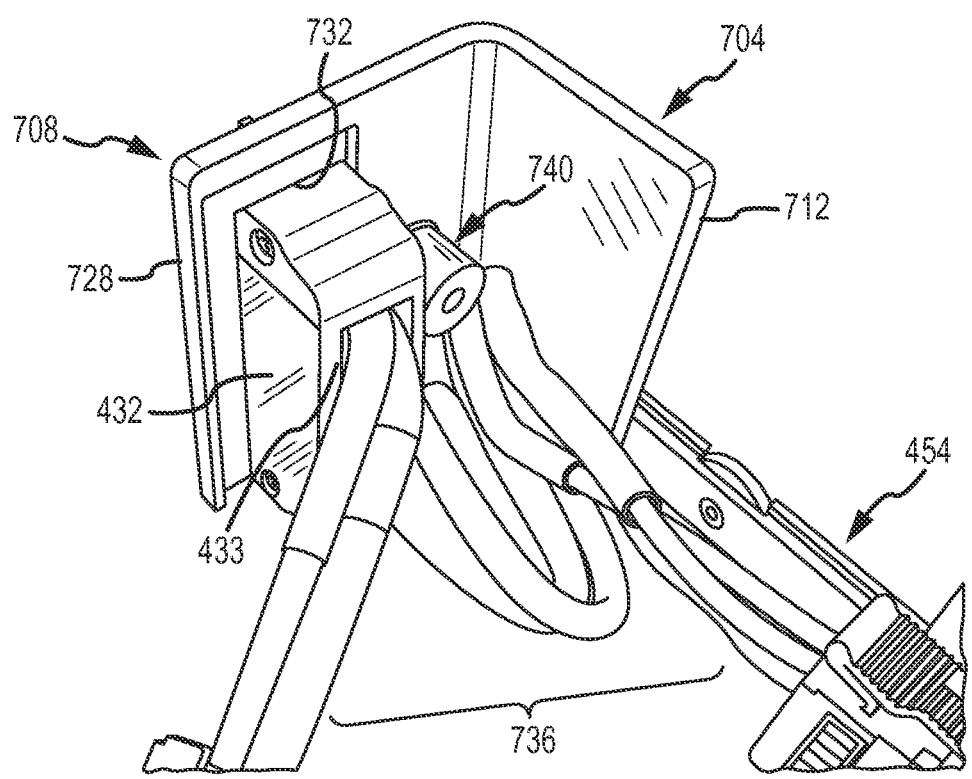
FIG. 17 is a close up perspective view of a rear portion of the blind mate connector of FIG. 16.
Figure 18:
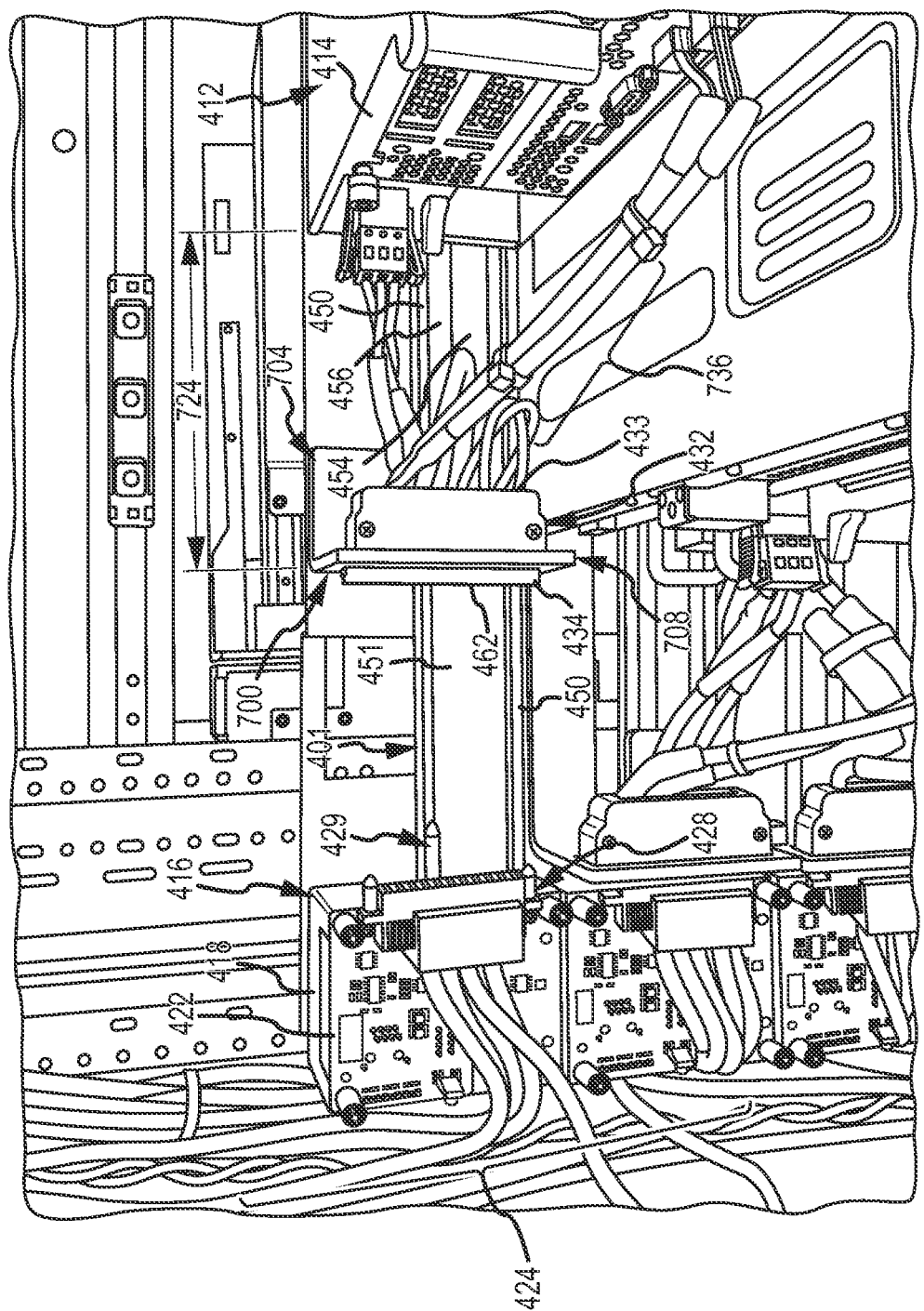
FIG. 18 is a side view of the FRU of FIG. 16 being received in a receiving bay of the frame of FIG. 12 before the blind mate connector of the adapter has interfaced with a corresponding blind mate connector of the frame arm of FIG. 13.
Figure 19:
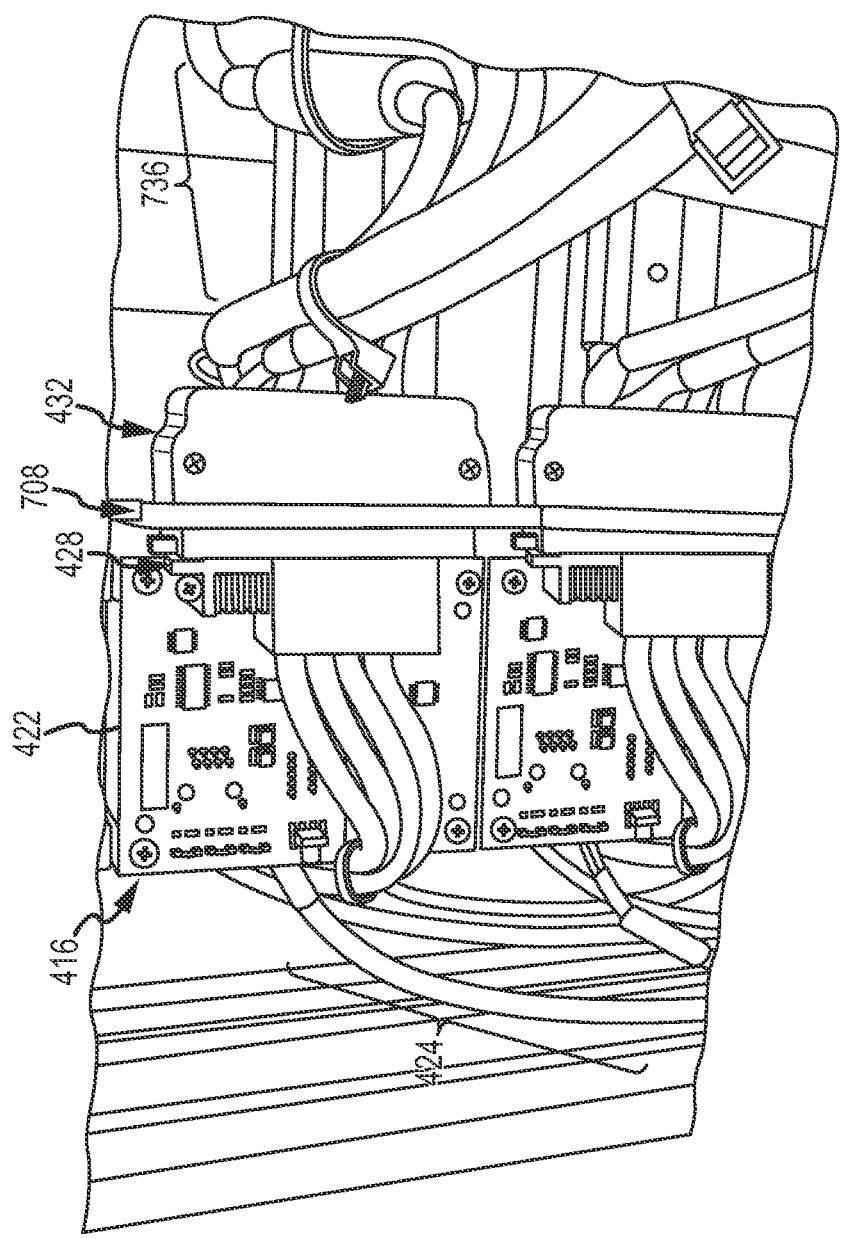
FIG. 19 is a side view similar to that in FIG. 18, but after the blind mate connector of the adapter has interfaced with the corresponding blind mate connector of the frame arm of FIG. 13.

In any event, it can be seen how the mounting portion 704 and the inner rail member 454 space the attachment portion 708 of the adapter 700 a distance 724 (labeled in FIGS. 16 and 18) from a rear portion 414 of the FRU 412 to advantageously provide room for one or more cables, wires, and/or the like that electrically connect power, serial, and network ports adjacent the rear portion 414 of the FRU 412 to the connector 432 secured to the attachment portion 708 of the adapter 700. For instance, FIGS. 16-18 illustrate how a plurality of cables 736 (e.g., network line 40; power lines 52, 56; serial data line 64 of FIG. 4) may respectively electrically connect various ports 737 (e.g., network port 36; power ports 44, 48; serial management port 60 of FIG. 4) of the FRU 412 to appropriate pins/contacts (not shown) adjacent a rear portion 433 of the connector 432. As shown, the first and second mounting members 712, 716 and attachment member 728 may collectively form at least a partial housing for containing the plurality of cables 736. In any case, electrical interfacing of respective pins/contacts adjacent the front portions 434, 472 of the connectors 432, 428 (e.g., during insertion of the FRU 412 into the receiving bay 410 of the rack 404 as discussed below) automatically allows the FRU 412 to draw power from one or more PDUs 126; network communications to occur between the frame manager (not shown; e.g., frame manager 168 of FIG. 1), service processor of the frame center (not shown, e.g., service processor 160 of FIG. 5) and the OOB service processor (not shown; e.g., ILOM 164 shown in FIG. 1) of the FRU 412; and requests from the OOB service processor of the FRU 412 to read information (e.g., such as location data 141, role information, etc.) from the memory (not labeled) of the PCB 422 to be fulfilled.

As discussed previously, the frame arm 412 may include at least one mechanical alignment component in the form of an alignment pin 429 that is configured to be received in a corresponding mechanical alignment component in the form of a alignment barrel 740 of the adapter 700 to facilitate precise and secure alignment and electrical interfacing between the connector 428 of the frame arm 416 and the connector 432 of the FRU 412. With respect to FIGS. 14, 16 and 17, the alignment barrel 740 may be disposed in or on the attachment portion 708 of the adapter 700 adjacent or spacedly adjacent the connector 432. As shown, the alignment barrel 740 may include opposed front and rear portions 744, 748 and a receiving opening or bore 752 extending through the alignment barrel 740 between the front and rear portions 744, 748. While the alignment pin 429 and alignment barrel 740 have been discussed as being respectively disposed on the frame arm 416 and adapter 700, other arrangements envision that the alignment pin 429 and alignment barrel 740 could instead be disposed on the adapter 700 and frame arm 416, respectively.

To facilitate the reader's understanding of how a FRU (e.g., FRU 412) may be inserted into a computing rack (e.g., rack 404) and allowed to substantially seamlessly (e.g., blind-matingly) join the management network of the rack, reference will now be made to FIG. 20 which illustrates one method 800 of inserting a FRU into a computing rack so as to electrically interface the FRU with a frame center of the rack. It is to be understood, however, that other methods including more, fewer, or alternative steps are also envisioned and encompassed herein. Additionally, while the method 800 will be discussed in the context of FRU 412 being inserted into a receiving bay 410 of rack 404 and electrically and mechanically interfacing with a frame arm 416 of the receiving bay 410, it is to be understood that the method 800 may be practiced in conjunction with other FRUs, computing racks, etc. than those specifically illustrated herein.

At 804, ends 462 (e.g., see FIG. 16) of a pair of inner rail members 454 of FRU 412 may be respectively inserted into channels 451 of a pair of outer rail members 450 of a receiving bay 410 of the computing rack 404 (e.g., via a front portion of the receiving bay 410 that is opposed to a frame arm 416 disposed adjacent a rear portion of the receiving bay 410). For instance, a first of the inner rail members 454 may be secured to both an adapter 700 and a first side portion 413 of the FRU 412 (as shown in FIGS. 14-17), and a second of the inner rail members 454 may be secured to an opposing second side portion (not shown) of the FRU 412. In one arrangement, the pair of inner rail members 454 may be respectively inserted into channels of a pair of intermediate rail members 456 (see FIG. 18) that are respectively disposed within the channels 451 of the pair of outer rail members 450 such that each set of inner, intermediate and outer rail members 454, 456, 450 can slide or otherwise move relative to each other to facilitate insertion and removal of the FRU 412 into and from the receiving bay 410. While the end 462 of one of the inner rail members 454 has been illustrated as extending past the end of the adapter 700 (e.g., past the end of the mounting and attachment portions 704, 708, see FIGS. 15, 16 and 18), other arrangements encompassed herein envision that the end 462 extends just to or even short of the end of the adapter 700.

The method 800 may then include advancing 808 (e.g., sliding, moving, etc.) the FRU 412 towards the rear portion of the receiving bay 410 (e.g., pushing on a front portion of the FRU 412 so that an opposed rear portion 414 of the FRU 412 moves towards a frame arm 416 adjacent a rear portion of the receiving bay 410). See FIG. 18 which illustrates a rear portion 414 of the FRU 412 during the advancing 808 of the FRU 412 towards the frame arm 416 adjacent a rear of the receiving bay 410. The method 800 may then include mechanically aligning 812 the electrical connector 432 of the FRU 412 with the corresponding electrical connector 428 of the frame arm 416 (e.g., in preparation for precise electrical interfacing 828 of the connectors 432, 428).

In one arrangement, the mechanical alignment 812 may initially include receiving 816 the alignment pin 429 of the frame arm 416 through a front portion 744 of the alignment barrel 740 of the FRU 412 (e.g., of the adapter 700 secured to the FRU 412), where the alignment pin 429 and alignment barrel 740 are spaced at least a substantially common distance (e.g., in the width dimension 405, see FIG. 12) from the frame arm connector 428 and FRU connector 432, respectively. With reference to FIGS. 13, 16 and 18, for instance, the tip portion 437 of the alignment pin 429 may be configured to enter the receiving bore 752 of the alignment barrel 740 via the front portion 744 of the alignment barrel 740 as the FRU 412 is advanced 808 within the receiving bay 410. For example, the alignment pin 429 and alignment barrel 740 may be configured and designed to be a substantially common distance from a common reference line of the outer rail member 450 (or other reference location(s)) in each of the width and height dimensions 405, 407 (see FIG. 12) so that the tip portion 437 is able to be substantially readily received in the alignment barrel 740.

Thereafter, continued advancement 820 of the FRU 412 towards the rear portion of the receiving bay 410 may serve to more fully and precisely align the connectors 428, 432 (e.g., the corresponding pins/contacts of the connectors 428, 432) in both of the width and height dimensions 405, 407. For instance, a camming action between the tapered tip portion 437 and an outer peripheral edge of the receiving bore 752 adjacent the front portion 744 of the alignment barrel 740 during the continued advancement 820 may tend to correct for any differences in tolerances among the various components of the rail assemblies 401, frame arms 416, FRUs 412, adapters 700, and/or the like to precisely align the alignment pin 429 within the receiving bore 752 and thereby precisely align the connections 428, 432 (e.g., due to the above-discussed common distances). In one arrangement, an enlarged head portion 435 of the alignment pin 429 (labeled in FIG. 13) may have an outer diameter that is substantially the same as an inner diameter of the receiving bore 752 between the front and rear portions 744, 748 of the alignment barrel 740 (e.g., so that there is a slight friction fit between the enlarged head portion 435 and the receiving bore 752 as the alignment barrel 740 is moving relative to the alignment pin 429) to maintain the above-discussed precise alignment initially achieved via engagement between the tip portion 437 and the outer peripheral edge of the front portion 744 of the alignment barrel 740.

More specifically, configuring the outer diameter of the enlarged head portion 435 and the inner diameter of the receiving bore 752 to be substantially the same limits relative movement between the alignment pin 429 and the alignment barrel 740 (and thus between the connectors 428, 432) in the width and height dimensions 405, 407 as the FRU 412 is advancing (e.g., along the depth dimension 409) towards the rear portion of the receiving bay 410 into a fully mounted position. While only a single set of an alignment pin 429 and alignment barrel 740 have been shown in the figures, it will be readily appreciated that more than one set of the same may be included to further facilitate precise alignment of the connectors 428, 432. As just one example, two or more alignment pins 429 may be received within respective apertures 431 in the wall of the housing 418 of the frame arm 416 while two or more respective alignment barrels 740 may be included in the attachment member 728 of the adapter 700.

In one arrangement, the connectors 428, 432 may have one or more alignment posts 475 and alignment openings 476 (labeled in FIGS. 13 and 16), where each alignment post 475 is configured to be received in a respective corresponding alignment opening 476 after at least one alignment pin 429 has been at least initially/partially received in a corresponding alignment barrel 740. In this regard, each alignment pin 429/alignment barrel 740 combination may be considered a "primary" alignment mechanism (e.g., that serves to perform initial alignment of the pins/contacts of the corresponding connectors 428, 432) while each alignment post 475/alignment opening 476 combination may be considered a "secondary" alignment mechanism (e.g., that serves to perform more fine-tuned alignment of the pins/contacts of the corresponding connectors 428, 432). In any event, the method 800 may include electrically interfacing 828 the connectors 428, 432 after or upon mechanical alignment 812 of the connectors 428, 432. See FIG. 19. At this point, the FRU 412 may be substantially automatically and/or seamlessly discovered by the frame center (e.g., frame center 120 of FIG. 1) and/or frame manager (e.g., frame manager 168 of FIG. 1) of the computing rack via the fixed interconnect topology 424, the frame center and/or frame manager may conduct OOB management of the FRU 412, FRU hot-swap/removal requests may be generated by the frame arm 416 (e.g., upon depression of a corresponding button on the frame arm 416) and passed to the frame center for processing, and/or the like, all as discussed previously. One or more of the FRUs 412 of the rack 404 of FIG. 12 may be inserted into and removed from respective receiving bays 410 of the rack 404 so as to respectively join or disjoin the management network/context of the frame 400 in manners as discussed above using a plurality of substantially identical adapters 700, even in the case where the plurality of FRUs 412 collectively include different form factors (e.g., 1 U and 2 U FRUs), different functions, and/or the like.

To assist in maintaining secure and consistent electrical contact between the pins/contacts of the connectors 428, 432 when the FRU 412 is fully mounted within the receiving bay 410, the enlarged head portion 435 (e.g., a locking portion) of the alignment pin 429 may be configured to interact and/or engage 824 with a locking portion in the form of a lip or flange 753 adjacent the rear portion 748 of the alignment barrel 740 to limit premature separation of the alignment pin 429 and the alignment barrel 740 (and thus of the connectors 428, 432). More specifically, the outer diameter of the enlarged head portion 435 may be at least slightly greater than an inner diameter of the flange 753 so that the flange 753 would have to be at least slightly forced past the enlarged head portion 435 as the FRU 412 is being advanced into the fully mounted position. Stated differently, a user may have to exert a slightly greater force on the front of the FRU 412 to move the flange 753 from a first side of the enlarged head portion 435 to an opposing side of the enlarged head portion 435. The connectors 428, 432 may be configured to be fully engaged/seated relative to each other once the flange 753 has been forced just past the enlarged head portion 435 (e.g., just as the flange 753 has moved to the opposing side of the enlarged head portion 435). In this regard, the engagement between the flange 753 and the enlarged head portion 435 may serve to resist relative movement between the alignment pin 429 and the alignment barrel 740 and thus between the connectors 428, 432 (e.g., in a direction that would otherwise tend to disengage the connectors 428, 432, such as due to vibrations, shocks, and/or the like), in the absence of a user intending to disengage the connectors 428, 432 (e.g., such as during a FRU hot-swap operation).

While engagement between the enlarged head portion 435 of the alignment pin 429 and the flange 753 of the alignment barrel 740 has been discussed as a manner of ensuring electrically engagement between the connectors 428, 432, other arrangements of doing the same are also envisioned and encompassed herein. For instance, the flange 753 of the alignment barrel 740 may be configured to snap into or otherwise enter a groove or the like disposed about an outer circumference of the alignment pin 429. Furthermore, the enlarged head portion 435 (or other feature) and flange 753 (or other feature) may be disposed at locations on the alignment pin 429 and alignment barrel 740 other than at those shown in the figures. For instance, the enlarged head portion 435 could be disposed at a middle portion of the alignment pin 429 and the flange 753 could be disposed inside the receiving bore 752 at a middle portion of the alignment barrel 740.

Figure 21:
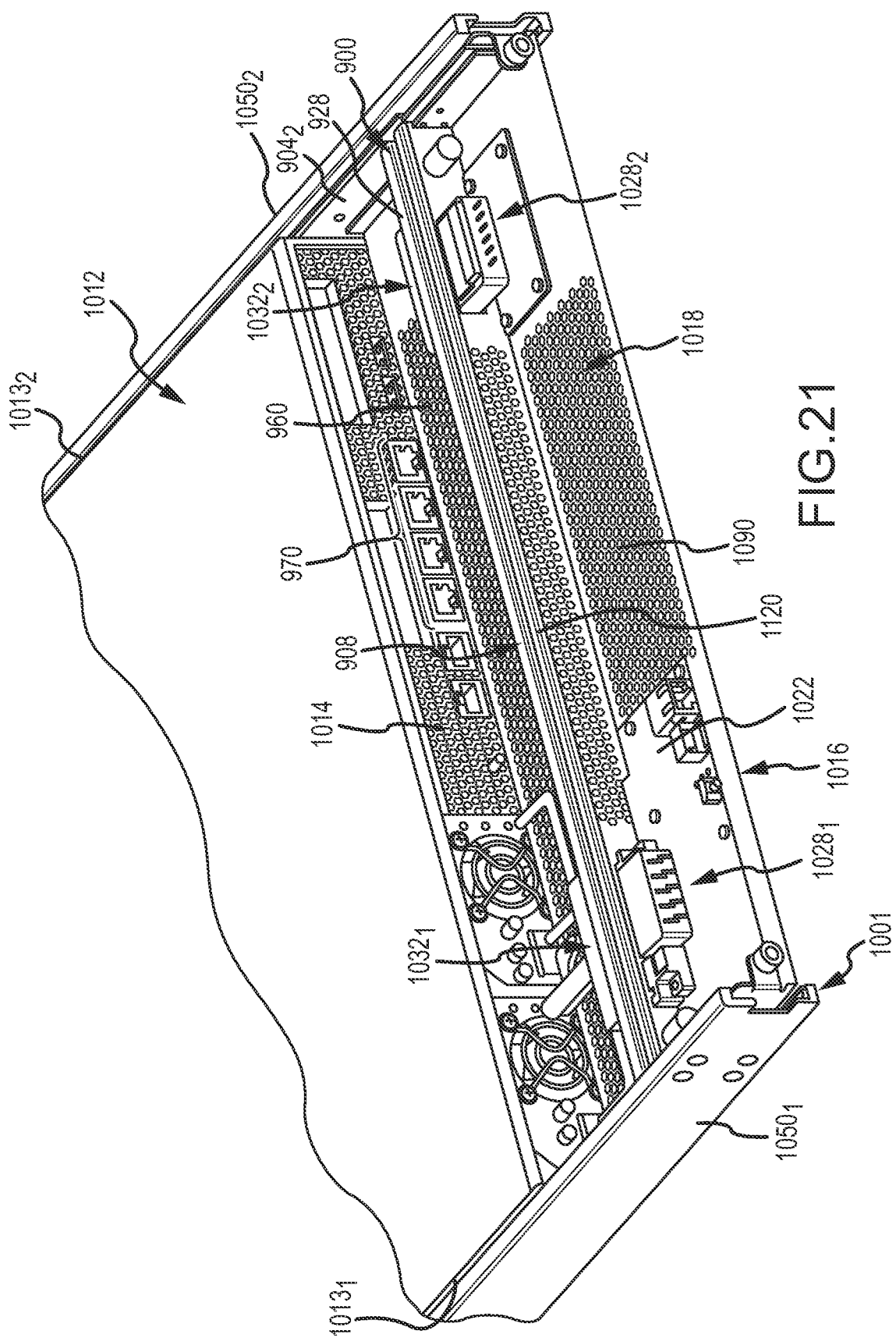
FIG. 21 is a perspective view of an adapter and corresponding frame arm according to another embodiment.
Figure 22:
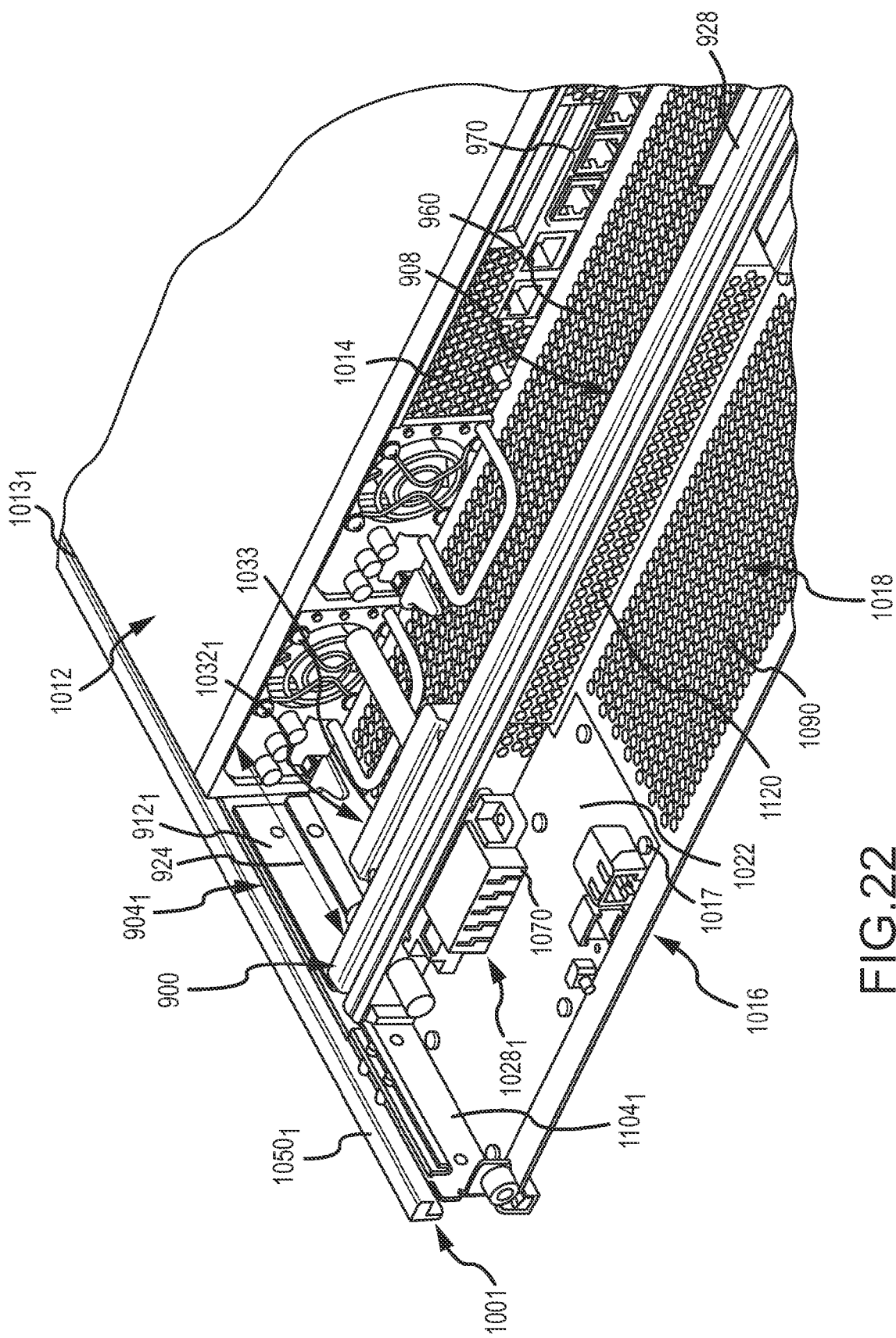
FIG. 22 is another perspective view the adapter and frame arm of FIG. 21.

Turning now to FIGS. 21-22, another embodiment of an adapter 900 is presented that is configured to allow a FRU 1012 to be inserted into a receiving bay of a computing rack (e.g., receiving bay 410 of computing rack 404 of FIG. 12) and substantially seamlessly electronically discovered by management services software of the computing rack by way of blind mate interfacing between the adapter 900 and a frame arm 1016 of a receiving bay of the computing rack. The adapter 900 may or may not be utilized in racks in which the adapter 700 is being utilized with corresponding frame arms 416. Broadly, the adapter 900 includes first and second mounting portions $904_1$, $904_2$ (e.g., each including one or more brackets) that are respectively configured to be non-movably secured to opposing side portions $1013_1$, $1013_2$ of a FRU 1012 and an attachment portion 908 (e.g., one or more brackets) interconnecting the first and second mounting portions $904_1$, $904_2$. The attachment portion 908 is configured to receive at least a first connector $1032_1$ (e.g., blind mate connector 132 of FIG. 4 or connector 432 of FIG. 16) to allow the first connector $1032_1$ to electrically interface with at least a first corresponding connector $1028_1$ (e.g., connector 128 of FIG. 4 or connector 428 of FIG. 13) adjacent a rear of a receiving bay of a computing rack (not shown, but similar to receiving bay 410 of rack 404 of FIG. 12) as the FRU 1012 is being inserted into the receiving bay.

In one arrangement, the first and second mounting portions $904_1$, $904_2$ may respectively include at least a first mounting member $912_1$, $912_2$ (e.g., plate, flange, etc.) that is configured to be non-movably secured relative to (e.g., directly or indirectly to) the first and second side portions $1013_1$, $1013_2$ of the FRU 1012. For instance, the first mounting members $912_1$, $912_2$ may be respectively rigidly secured (e.g., via fasteners, nuts, and aligned holes, not labeled) to an inside portion of a pair of inner rail members (not labeled) of the same rail assembly 1001 to which a respective frame arm 916 is secured (e.g., where the frame arm 916 is secured to a pair of outer rail members $1050_1$, $1050_2$ of the rail assembly 1001 and the first mounting members $912_1$, $912_2$ are secured to the pair of inner rail members of the same rail assembly 1001). In this regard, rigid mounting of the inner rail members to the side portion $1013_1$, $1013_2$ of the FRU 1012 (e.g., similar to how inner rail member 454 may be rigidly secured to the side portion 413 of FRU 412 as discussed previously) serves to non-movably or rigidly secure the adapter 900 to the FRU 1012. In another arrangement, the mounting portions $904_1$, $904_2$ may additionally or alternatively include additional mounting members (e.g., plate, flange, etc., not shown) configured to be non-movably secured to the side portions $1013_1$, $1013_2$ of the FRU 1012 for increased stability of the system.

With continued reference to FIGS. 21-22, the attachment portion 908 may include an attachment member 928 (e.g., plate, bracket, flange, etc.) rigidly interconnecting the first and second mounting portions $904_1$, $904_2$ that includes at least a first receiving aperture extending therethrough (not shown, but similar to receiving aperture 732 in FIG. 14, albeit arranged in a horizontal direction in the embodiment of FIGS. 21-22). The first receiving aperture may be sized and configured to fixably receive the first connector $1032_1$ therein so as to face a front portion (not shown) of the first connector $1032_1$ towards a front portion (not shown) of the first connector $1028_1$ of a corresponding frame arm 1016 during insertion of the FRU 1012 into the receiving bay of the rack (e.g., one of the receiving bays 410 of rack 404). It is noted that FIGS. 21-22 illustrate the adapter 900 being engaged with the frame arm 1016.

For instance, the first connector $1032_1$ may include one or more flexible tangs, clips or the like (not shown) that are adapted to snap past an inner wall of the first receiving aperture and thereby lock or non-movably fix the first connector $1032_1$ to the attachment portion 908 and thus to the FRU 1012 (i.e., when the mounting portion 904 is non-movably fixed to or at least relative to the FRU 1012). However, other manners of securing the first connector $1032_1$ to the attachment portion 908 are also envisioned and encompassed herein. In one arrangement, the attachment member 928 may be rigidly secured to the first mounting members $912_1$, $912_2$ of the first and second mounting portions $904_1$, $904_2$ in any appropriate manner (e.g., threaded connections, welding, etc.). In another arrangement, a single piece of material may be appropriately formed and/or shaped to create the first and second mounting portions $904_1$, $904_2$ and attachment portion 908.

The first and second mounting portions $904_1$, $904_2$ may collectively space the attachment portion 908 a distance 924 from a rear portion 1014 of the FRU 1012 to advantageously provide room for one or more cables, wires, and/or the like (not shown) that electrically connect power, serial, and network ports (not labeled) adjacent the rear portion 1014 of the FRU 1012 to a rear portion 1033 of the first connector $1032_1$ secured to the attachment portion 908 of the adapter 900. In one arrangement, the adapter 900 may include a base or tray 960 appropriately secured to first and second mounting portions $904_1$, $904_2$ and/or attachment portion 908. In any case, the first and second mounting portions $904_1$, $904_2$ and attachment portion 908 (and tray 960 if included) may collectively form at least a partial housing for containing the plurality of cables/wires/etc. electrically interconnecting the first connector $1032_1$ and the ports adjacent the rear portion 1014 of the FRU 1012.

In one arrangement, the attachment member 928 may include at least a second receiving aperture (not shown) sized and configured to receive a second connector $1032_2$ (e.g., blind-mate connector) so as to face a front portion (not shown) of the second connector $1032_2$ towards a front portion (not shown) of a second connector $1028_2$ of the frame arm 1016 during insertion of the FRU 1012 into the receiving bay of the rack. Provision of the second connectors $1032_2$, $1028_2$ advantageously allows for blind-mate electrical connection between one or more additional ports of the FRU 1012 and additional cables/wires/networks of the rack and/or the like. In one arrangement, one or more cables/wires (not shown) may be electrically connected between high speed network ports 970 (e.g., Ethernet, RJ45) of the FRU 1012 and the second connector $1032_2$ of the adapter 900. For instance, the high speed network ports 970 may be utilized for actual data (e.g., signal) communications between the FRU 1012 and other devices and/or processes (e.g., other FRUs 1012/412/112 within rack 404/104, devices or processes outside of rack 404, etc.) as opposed to for management communications between and among the frame center (e.g., frame center 120), frame arms 116/416/1016, FRUs 112/412/1012, etc.

Figure 23:
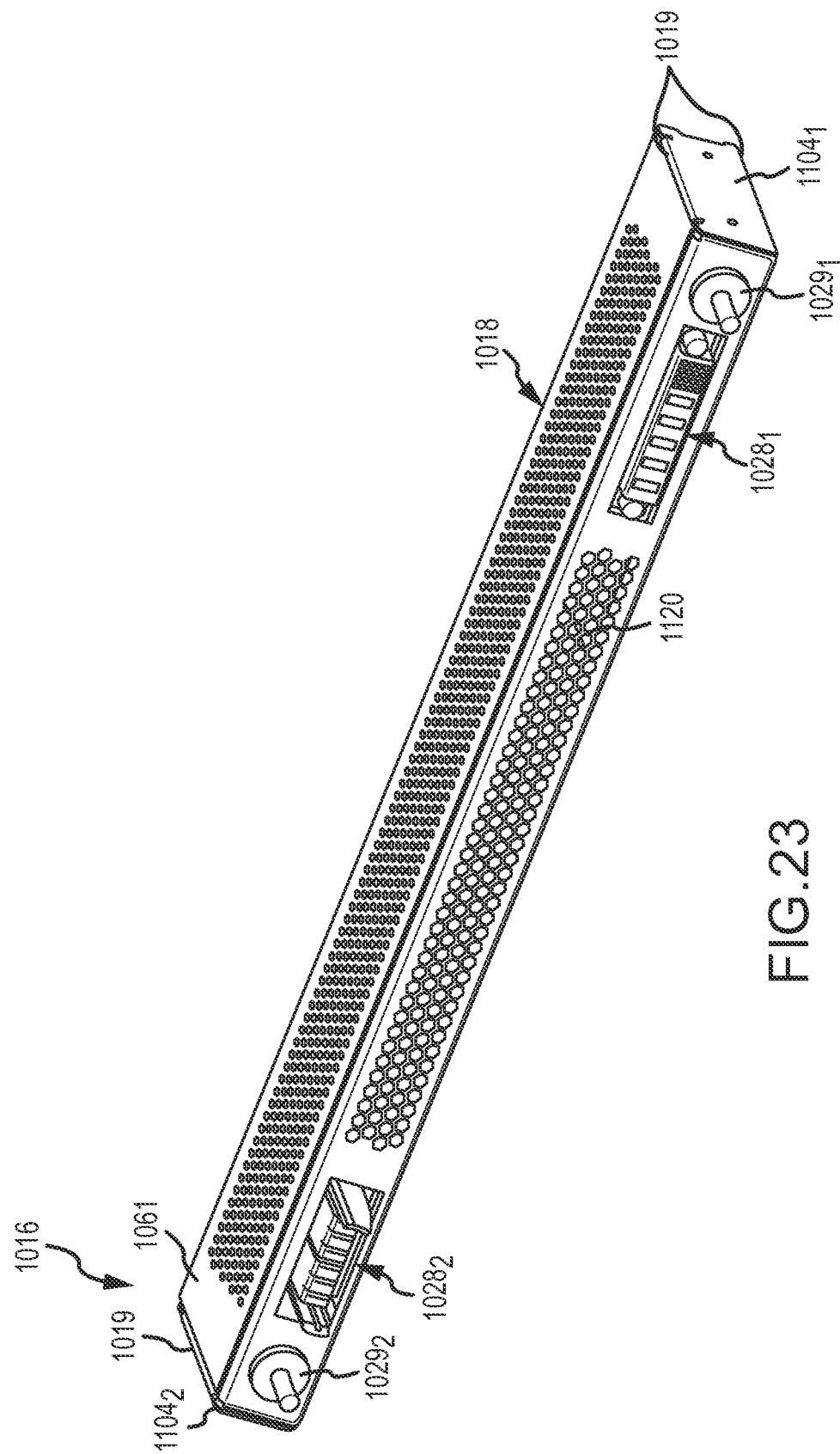
FIG. 23 is another perspective view of the frame arm of FIG. 21.

The frame arm 1016 may generally have a form factor in the width 405 and height dimensions 407 (labeled in FIG. 12) substantially matching that of the adapter 900. More particularly, the frame arm 1016 may include a housing 1018 (e.g., housing 118) non-movably securable in any appropriate manner relative to the pair of outer rail members $1050_1$, $1050_2$ of the rail assembly 1001 of the particular receiving bay within which an adapter 900 and FRU 1012 are translatably mounted. As just one example, the housing 1018 may include first and second mounting portions $1104_1$, $1104_2$ including respective pairs of grooves 1019 (see FIG. 23) that are configured to receive corresponding pairs of flanges (not shown) of the outer rail members $1050_1$, $1050_2$. In this regard, the housing 1018 can be slid along or relative to the outer rail members $1050_1$, $1050_2$ to a desired location (e.g., adjacent a rear portion of a receiving bay) and then non-movably secured to the outer rail members $1050_1$, $1050_2$ in any appropriate manner (e.g., via tightening a bolt (not shown) extending through opposing side portions of the housing 1018 against the outer rail members $1050_1$, $1050_2$). Other manners of securing the housing 1018 to the rack adjacent a rear portion of the receiving bay are also envisioned and encompassed within the scope of the present disclosure.

The housing 1018 may also include a base or tray 1090 rigidly secured in any appropriate manner between the first and second mounting portions $1104_1$, $1104_2$ to which a PCB 1022 (e.g., PCB 122, 422) may be secured, such as via passing fasteners 1017 through apertures (not shown) in the PCB 1022 and into apertures (not shown) in the tray 1090 of the housing 1018. The PCB 1022 may have a memory storing location data of the frame arm 1016 within the frame (e.g., frame 400), serial to $I^2C$ conversion logic, LEDs, and the like (not labeled), similar to the PCB 122 in FIG. 4 and PCB 422 in FIG. 13. As shown, the first connector $1028_1$ may be electrically connected and secured in any appropriate manner to the PCB 1022 and adapted to align and electrically interface with the first connector $1032_1$ of the adapter 900 to facilitate electrical connection between the respective FRU 1012, the frame center, and one or more PDUs via a fixed interconnect topology (e.g., fixed interconnect topology 424). More specifically, at least one $I^2C$ cable or line (e.g., $I^2C$ line 20 of FIG. 4) may be electrically connected between the frame center and the PCB 1022 (e.g. to an $I^2C$ data bus of the PCB 1022), at least one network cable or line (e.g., network line 24 of FIG. 4) may be electrically connected between the frame center and pins/contacts (not shown) adjacent a rear portion 1070 of the first connector $1028_1$ (and thus may "pass-through" the PCB 1022), and at least one power line or cable (e.g., power lines 28, 32 of FIG. 4) may be electrically connected between one or more PDUs (e.g., PDUs 508, 512) and pins/contacts adjacent the rear portion 1070 of the connector 1028.

The second connector $1028_2$ may also be secured in any appropriate manner to the frame arm 1016 (e.g., to the tray 1090) and adapted to align and electrically interface with the second connector $1032_2$ of the adapter 900 to facilitate electrical connection (e.g., actual data communications) between the respective FRU 1012 and one or more networks via the fixed interconnect topology (e.g., fixed interconnect topology 424) and/or other cables/wires. For instance, one or more network (e.g., Ethernet) cables (e.g., not shown) may be appropriately electrically interconnected to a rear portion of the second connector $1028_2$ so that an electrical (e.g., data) connection is established between the FRU 1012 and one or more networks (e.g., Internet, WAN, LAN) upon interfacing of the second connectors $1032_2$, $1028_2$.

In one arrangement, the housing 1018 may additionally include a corresponding attachment portion 1120 configured to substantially abut the attachment portion 908 of the adapter 900 upon full insertion of the FRU 1012 into the receiving bay, where the attachment portion 1120 includes respective first and second receiving apertures (not shown) for respective receipt and mounting (e.g., via clips or the like) of the first and second connectors $1028_1$, $1028_2$. In this regard, the adapter 900 and frame arm 1016 may be substantial mirror images of each other (e.g., where the adapter 900 and frame arm 1016 have respective trays 960, 1090, attachment portions 908, 1120, first and second mounting portions $904_1$, $904_2$ and $1104_1$, $1104_2$, etc.).

In one embodiment, the frame arm 1016 may include at least one mechanical connector or alignment component such as first and second alignment pins $1029_1$, $1029_2$ that are configured to be received in respective corresponding mechanical connectors or alignment components such as first and second alignment barrels (not shown, but similar to alignment barrel 740 of FIG. 16) of the adapter 900 of the FRU 1016. For instance, each of the first and second alignment pins $1029_1$, $1029_2$ may be respectively disposed adjacent (e.g., directly adjacent, spacedly adjacent, etc.) the first and second connectors $1028_1$, $1028_2$ while each of the first and second alignment barrels may be respectively disposed adjacent (e.g., directly adjacent, spacedly adjacent, etc.) the first and second connectors $1032_1$, $1032_2$. As discussed previously in relation to the alignment pin 429 and alignment barrel 740 of FIGS. 13-19, receipt of each of the first and second alignment pins $1029_1$, $1029_2$ in the respective first and second alignment barrels during insertion of the FRU 1012 into a receiving bay towards the frame arm 1016 facilitates precise alignment between the pins/contacts of the respective connectors $1028_1/1032_1$, $1028_2/1032_2$.

In the event that the connectors $1028_1/1032_1$, $1028_2/1032_2$ have respective alignment posts and openings (not labeled, but similar to alignment posts/openings 475, 476 in FIGS. 13 and 16), each alignment pin 1029/alignment barrel 940 combination may be considered a "primary" alignment mechanism (e.g., that serves to perform initial alignment of the pins/contacts of the corresponding connectors $10280032_1$, $1028_2/1032_2$) while each alignment post/alignment opening combination may be considered a "secondary" alignment mechanism (e.g., that serves to perform more fine-tuned alignment of the pins/contacts of the corresponding connectors $1028_1/1032_1$, $1028_2/1032_2$). In some embodiments, the housing 1018 of the frame arm 1016 may include a cover 1061 (shown in FIG. 23; removed from FIGS. 21-22 in the interest of clarity) attached to the first and second mounting portions $1104_1$, $1104_2$ and/or attachment portion 1120 for protecting the PCB 1022 and connectors $1028_1$, $1028_2$, increasing the rigidity of the frame arm 1016, and/or the like.

Figure 20:
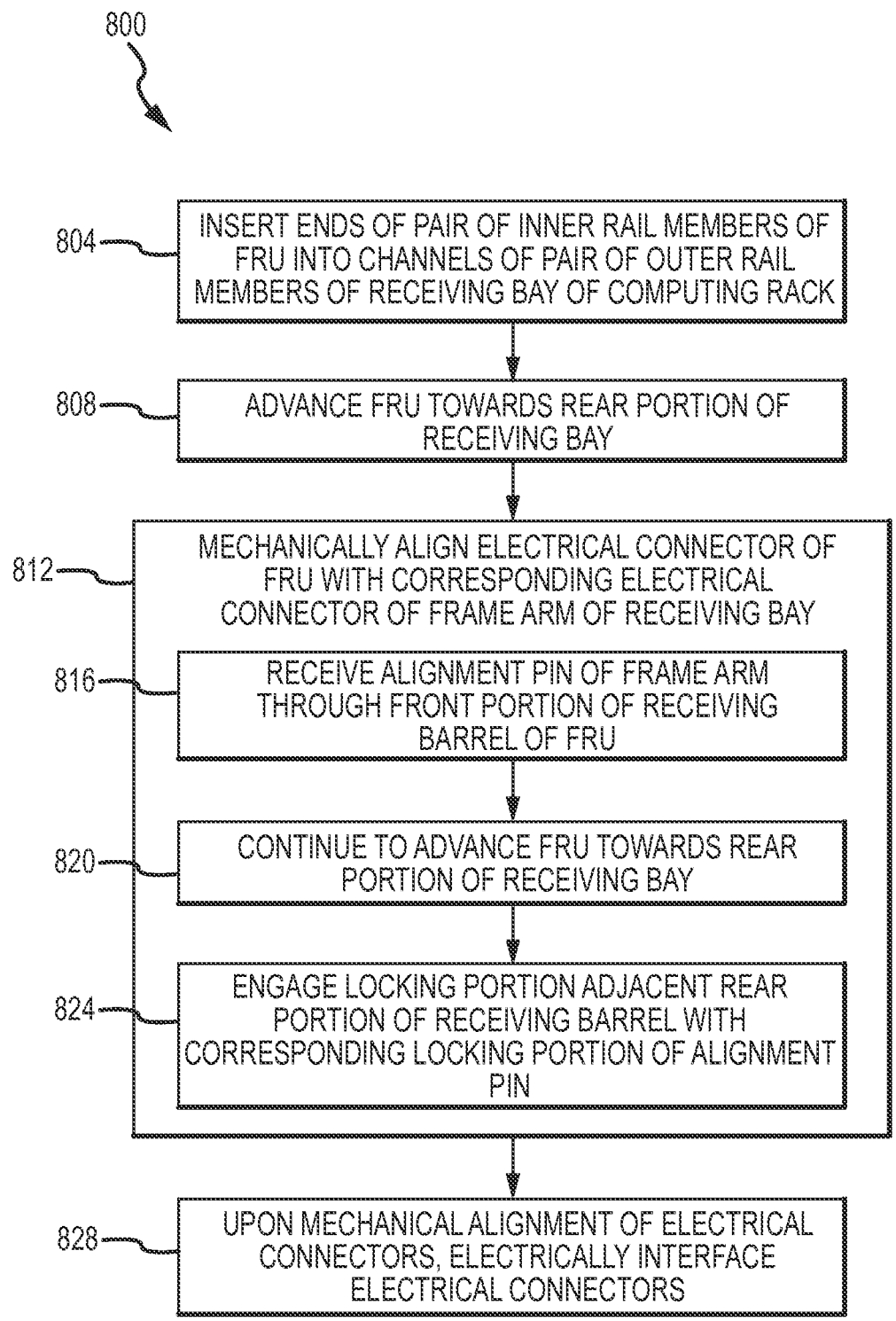
FIG. 20 is a flow diagram of a method of electrically interfacing a FRU with a computing rack during insertion of the FRU into a receiving bay of the computing rack.

The method 800 of FIG. 20 may be applicable to the adapter 900/frame arm 1016 combination in a manner similar to that discussed previously in relation to the adapter 700/frame arm 416 combination. For instance, the method 800 may include inserting 804 ends (not labeled) of the pair of inner rail members of FRU 1012 into channels (not labeled) of the pair of outer rail members $1050_1$, $1050_2$ of a receiving bay (e.g., receiving bay 410) of a computing rack (e.g., computing rack 404), advancing 808 (e.g., sliding, moving, etc.) the FRU 1012 towards the rear portion of the receiving bay, mechanically aligning 812 the electrical connector $1032_1$, $1032_2$ of the FRU 1012 with the corresponding electrical connector $1028_1$, $1028_2$ of the frame arm 1016 (e.g., via receiving the alignment pins and/or posts within the alignment barrels and/or openings), and electrically interfacing 828 the connectors $1028_1/1032_1$, $1028_2/1032_2$ after or upon mechanical alignment 812 of the connectors $1028_1/1032_1$, $1028_2/1032_2$. At this point, the FRU 1012 may be substantially automatically and/or seamlessly discovered by the frame center (e.g., frame center 120 of FIG. 1) and/or frame manager (e.g., frame manager 168 of FIG. 1) of the computing rack via the fixed interconnect topology 424, the frame center and/or frame manager may conduct OOB management of the FRU 1012, FRU hot-swap/removal requests may be generated by the frame arm 1016 (e.g., upon depression of a corresponding button on the frame arm 1016) and passed to the frame center for processing, and/or the like, all as discussed previously.

In one arrangement, the adapter 900 and frame arm 1016 may be utilized for "1 U" FRUs 1012 as the adapter 900 and frame arm 1016 may be configured to have reduced form factors in the height dimension 407 (labeled in FIG. 12) of the rack 404, such as due to the adapter 900 and frame arm 1016 being configured to orient the various connectors 1032, 1028 (e.g., the longest dimension of the connectors 1032, 1028) along the width dimension 405 of the rack 404 (i.e., as opposed to along the height dimension 407 as do the adapter 700 and frame arm 416 of FIGS. 12-19). For instance, the adapter 900 and frame arm 1016 may be utilized for 1 U FRUs 1012 while the adapter 700 and frame arm 416 may be utilized for 2 U FRUs 412 which may or may not be utilized in the same rack 404. However, it is envisioned that each adapter 900/frame arm 1016 and adapter 700/frame arm 416 combination may be utilized with FRUs of other form factors (e.g., 1 U, 2 U, 3 U, etc.).

In some situations, electromagnetic interference (EMI) may be generated as a result of the electrical connection of the high speed network ports 970 (e.g., Ethernet, RJ45) of the FRU 1012 and the second connector $1032_2$ of the adapter 900. In this regard, the housing created by the first mounting portion $904_1$, second mounting portion $904_2$, and attachment portion 908 may serve as a "cage" that serves to attenuate or otherwise control the generated EMI. Furthermore, one or more portions of the adapter 900 and/or frame arm 1016 (e.g., the trays 960, 1090; the attachment portions 908, 1120; and/or the like) may include a number of perforations or the like therethrough for facilitating air circulation, weight reductions, and/or the like. It will be readily appreciated that many additions and/or deviations may be made from the specific embodiments disclosed in the specification without departing from the spirit and scope of the invention. The illustrations and discussion herein has only been provided to assist the reader in understanding the various aspects of the present disclosure. For instance, while the frame center 120 has been disclosed as generally facilitating communications (e.g., as a switch) between the FRUs 112 in relation to out of band management, another switch (e.g., InfiniBand) may be provided to facilitate communications between the FRUs 112 and devices or networks outside of the frame 100. That is, while the FRUs 112 may be interconnected to the frame center 120 (e.g., via interfacing of connectors 128, 132) for OOB management of the FRUs 112, the FRUs 112 may also be appropriately interconnected to an InfiniBand or other type of switch for other types of communications and/or data transfers (e.g., video-conferencing traffic). In another embodiment, more than one frame manager may exist within the frame. For instance, while the frame center 120 may run a frame manager for OOB management of FRUs (e.g., in relation to powering up, hot-swapping, and the like), one of the FRUs 112 may run another frame manager that administers higher level managerial tasks within the frame 100.

In one arrangement, a FRU 112/412 may be appropriately locked in its particular receiving bay in the rack 104/404 and thus unable to be unlocked and removed until the service processor 160 and/or frame manager 168 has performed any necessary OOB management routines. In another arrangement, the service processor 160 and/or frame manager 168 may be configured to automatically begin OOB management routines (e.g., an offlining processes) upon detection of a pulling or tugging on a FRU 112/412 in an attempt to remove the FRU 112/412 (e.g., as an alternative to depressing a button 182 on a corresponding frame arm 116/416). In this regard, the FRU 112/412 may be locked in its receiving bay of the rack 104/404 until the OOB management routines have been completed.

Furthermore, one or more various combinations of the above discussed arrangements and embodiments are also envisioned. For instance, while FIG. 11 illustrates each of the first and second frames 400, 404 being in the form of frame 100, at least one of the first and second frames 400, 404 could be in the form of the frame 100' of FIG. 10 whereby a FRU 112' in the form of an enclosure of chassis includes a plurality of FRUs 112" in the form of blade servers. As another example, the attachment portion 708 of the adapter 700 could have one or more additional receiving apertures for receiving additional connectors 432 which may be configured to electrically interface with one or more additional corresponding connectors 428 of the frame arm 416. As a further example, the adapter 900 and frame arm 1016 could be utilized for FRUs of other sizes (e.g., 2 U, 3 U, etc.).

Embodiments disclosed herein can be implemented as one or more computer program products, i.e., one or more modules of computer program instructions encoded on a computer-readable medium for execution by, or to control the operation of, data processing apparatus. For example, the frame manager 168 may be provided in such computer-readable medium of the frame center 120, one of the FRUs 112, and/or the like, and executed by a processor or processing engine (not shown) of the FRU 112. As another example, the logic or software of the frame center 120 responsible for accessing the manager PROM image 148 and routing communications within the frame 100 may be provided in such computer-readable medium of the frame center 120 (e.g., memory 144) and executed by a processor or processing engine (not shown) of the frame center 120 (not shown). The computer-readable medium can be a machine-readable storage device, a machine-readable storage substrate, a non-volatile memory device, a composition of matter affecting a machine-readable propagated signal, or a combination of one or more of them. In this regard, the frame 100 may encompass one or more apparatuses, devices, and machines for processing data, including by way of example a programmable processor, a computer, or multiple processors or computers. In addition to hardware, the frame 100 may include code that creates an execution environment for the computer program in question, e.g., code that constitutes processor firmware, a protocol stack, a database management system, an operating system, or a combination of one or more of them.

A computer program (also known as a program, software, software application, script, or code) used to provide any of the functionalities described herein (e.g., managing FRUs 112, routing communications, and the like) can be written in any appropriate form of programming language including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit). Processors suitable for the execution of a computer program may include, by way of example, both general and special purpose microprocessors, and any one or more processors of any kind of digital computer. Generally, a processor will receive instructions and data from a read-only memory or a random access memory or both. Generally, the elements of a computer are one or more processors for performing instructions and one or more memory devices for storing instructions and data. The techniques described herein may be implemented by a computer system configured to provide the functionality described.

While this specification contains many specifics, these should not be construed as limitations on the scope of the disclosure or of what may be claimed, but rather as descriptions of features specific to particular embodiments of the disclosure. Furthermore, certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and/or parallel processing may be advantageous. Moreover, the separation of various system components in the embodiments described above should not be understood as requiring such separation in all embodiments, and it should be understood that the described program components and systems can generally be integrated together in a single software and/or hardware product or packaged into multiple software and/or hardware products.

The above described embodiments including the preferred embodiment and the best mode of the invention known to the inventor at the time of filing are given by illustrative examples only.

I claim:

1. A system, comprising:
   a computing rack comprising a framework that includes a plurality of vertical support posts and a plurality of pairs of rail assemblies interconnected between pairs of the vertical support posts to define a plurality of receiving bays for slidably receiving a respective plurality of field replaceable units (FRUs);
   a central management server fixed to the computing rack, wherein the central management server is configured to perform out of band (OOB) management of the plurality of FRUs;
   a plurality of housings respectively fixed to the computing rack adjacent a rear of the plurality of receiving bays, wherein each housing is configured to electrically interface with a respective one of the FRUs upon the FRU reaching at least a substantially fully mounted position within a respective one of the receiving bays; and
   a fixed interconnect topology in the computing rack, wherein the central management server uses the fixed interconnect topology to perform the OOB management of the plurality of FRUs, and wherein the fixed interconnect topology comprises:
      a plurality of a first type of communication cables, wherein each of the plurality of first type of communication cables extends from the central management server to a respective one of the plurality of housings, and wherein the plurality of first type of communication cables forms a first communication network of the fixed interconnect topology;
      a plurality of a second type of communication cables, wherein each of the plurality of second type of communication cables extends from the central management server to a respective one of the plurality of housings, and wherein the plurality of second type of communication cables forms a second communication network of the fixed interconnect topology; and
      a plurality of power cables, wherein each of the plurality of power cables extends from a power distribution unit to a respective one of the plurality of housings.

2. The system of claim 1, wherein each of a plurality of first ends of each of the plurality of first and second types of communication cables is interconnected to a respective one of a plurality of first and second types of interfaces of the central management server.

3. The system of claim 2, wherein the plurality of first type of interfaces comprises I²C data ports, and wherein the plurality of second type of interfaces comprises Ethernet ports.

4. The system of claim 2, wherein each of a plurality of opposing second ends of each of the plurality of first type of communication cables is interconnected to a respective one of a plurality of memories at the plurality of housings, wherein each of the plurality of memories stores data indicating the respective fixed location within the fixed interconnect topology, and wherein the central management server utilizes one of the first type of communication cables to read the fixed location data from the respective one of the plurality of memories of at least a first of a plurality of field replaceable units (FRUs) electrically interconnected thereto on which at least one type of management is to be performed.

5. The system of claim 4, wherein the at least one type of management comprises out of band management.

6. The system of claim 4, wherein each of a plurality of opposing second ends of each of the plurality of second type of communication cables is connected to a respective one of a plurality of first connectors at the plurality of housings, wherein each of the plurality of connectors is electrically interconnectable to a corresponding respective second connector of one of the plurality of FRUs, and wherein a rack manager of the fixed interconnect topology utilizes the second communication network to perform the at least one type of management of the first FRU via the respective first and second connectors.

7. The system of claim 6, wherein each of the plurality of memories is electrically connected to a respective one of the plurality of first connectors, and wherein each of the plurality of FRUs accesses a respective one of the plurality of memories to read information stored in the memory via the respective first and second connectors.

8. The system of claim 7, wherein the information comprises a role of the FRU among the plurality of FRUs.

9. The system of claim 8, wherein the role comprises the rack manager or a worker device subservient to the rack manager.

10. A method of pre-wiring a computing rack to allow for centralized management of a plurality of field replaceable units (FRUs) subsequently received within a plurality of receiving bays of the computing rack, comprising:
  electrically interconnecting a first end of each of a plurality of I²C cables to a central computing device;
  electrically interconnecting a second end of each of the plurality of I²C cables to a respective one of a plurality of circuit boards; and
  securing each of the plurality of circuit boards adjacent a respective one of the plurality of receiving bays of the computing rack, wherein the central computing device obtains data indicating a physical location of a respective one of the receiving bays within the computing rack via the one of the plurality of I²C cables and one of the plurality of circuit boards secured adjacent the receiving bay for use in performing one or more management routines in relation to a FRU secured within the respective one of the receiving bays.

11. The method of claim 10, further comprising:
  electrically interconnecting a first end of each of a plurality of network cables to the central computing device;
  electrically interconnecting a second end of each of the plurality of network cables to a respective one of a plurality of connectors; and
  electrically interconnecting each of the plurality of connectors to a respective one of the plurality of circuit boards.

12. The method of claim 11, further comprising:
  electrically interconnecting a first end of each of a plurality of power cables to a power distribution unit;
  electrically interconnecting a second end of each of the plurality of power cables to a respective one of the connectors.

13. The method of claim 12, wherein the plurality of connectors comprise blind mate connectors.

14. The method of claim 12, wherein each of the plurality of circuit boards is secured adjacent a rear portion of a respective one of the plurality of receiving bays of the computing rack, and wherein each of the plurality of receiving bays is configured to receive a respective FRU via an opposing front portion of the receiving bay.

15. A method, comprising:
  inserting a FRU into one of the plurality of receiving bays of claim 14;
  electrically interconnecting a connector of the FRU to the respective connector of the one of the plurality of receiving bays; and
  managing the FRU via the respective connectors.

16. The method of claim 15, wherein the managing comprises:
  informing the central computing device, from the circuit board of the one of the plurality of receiving bays via the respective one of the I²C cables, that the FRU has been electrically interconnected with the circuit board;
  reading, by the central computing device via the respective one of the plurality of I²C cables, a memory of the circuit board to determine a fixed location of the one of the receiving bays within the computing rack;
  alerting, via the plurality of network cables, a rack manager regarding the fixed location;
  managing, by the rack manager, the FRU via the plurality of network cables and the respective connectors.

17. A virtual backplane implemented within a computing rack, comprising;
  a plurality of I²C cables each comprising opposed first and second ends, wherein the first end of each of the plurality of I²C cables is electrically connected to a central computing device, and wherein the second end of each of the plurality of I²C cables is electrically connected to one of a plurality of circuit boards respectively secured adjacent one of a plurality of receiving bays of the computing rack; and
  a plurality of power cables each comprising opposed first and second ends, wherein the first end of each of the plurality of power cables is electrically connected to a power distribution unit, and wherein the second end of each of the power cables is electrically connected to one of a plurality of connectors respectively electrically connected to one of the plurality of circuit boards.

18. The virtual backplane of claim 17, further comprising:
  a plurality of network cables each comprising opposed first and second ends, wherein the first end of each of the plurality of network cables is electrically connected to a network switch, and wherein the second end of each of the network cables is electrically connected to one of the plurality of connectors respectively electrically connected to one of the plurality of circuit boards.

19. The virtual backplane of claim 18, wherein each of the plurality of network cables is electrically interconnected to a pass-through circuit of a respective one of the plurality of circuit boards.

* * * * *